(12) United States Patent
Huang et al.

(10) Patent No.: US 9,362,386 B2
(45) Date of Patent: Jun. 7, 2016

(54) FETS AND METHODS FOR FORMING THE SAME

(71) Applicant: Taiwan Semiconductor Manufacturing Company, Ltd., Hsin-Chu (TW)

(72) Inventors: Yu-Lien Huang, Jhubei (TW); Chun-Hsiang Fan, Longtan Township (TW); Tung Ying Lee, Hsin-Chu (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/485,405

(22) Filed: Sep. 12, 2014

(65) Prior Publication Data

US 2015/0001468 A1     Jan. 1, 2015

Related U.S. Application Data

(63) Continuation-in-part of application No. 13/779,356, filed on Feb. 27, 2013.

(51) Int. Cl.
| | |
|---|---|
| *H01L 29/66* | (2006.01) |
| *H01L 29/04* | (2006.01) |
| *H01L 29/78* | (2006.01) |

(52) U.S. Cl.
CPC ........ *H01L 29/66795* (2013.01); *H01L 29/045* (2013.01); *H01L 29/66545* (2013.01); *H01L 29/66977* (2013.01); *H01L 29/7853* (2013.01)

(58) Field of Classification Search
CPC ....... H01L 29/04; H01L 29/045; H01L 29/66; H01L 29/78; H01L 29/66795; H01L 29/66977; H01L 29/7851; H01L 29/7856
See application file for complete search history.

(56) References Cited

U.S. PATENT DOCUMENTS

| | | | |
|---|---|---|---|
| 8,049,286 B2 | 11/2011 | Tateshita | |
| 8,759,943 B2 | 6/2014 | Tseng et al. | |
| 2005/0156202 A1* | 7/2005 | Rhee et al. | 257/213 |
| 2006/0046388 A1* | 3/2006 | Park et al. | 438/257 |
| 2006/0086977 A1* | 4/2006 | Shah et al. | 257/347 |
| 2006/0160302 A1 | 7/2006 | Kim et al. | |

(Continued)

FOREIGN PATENT DOCUMENTS

| | | |
|---|---|---|
| KR | 1020080099798 | 11/2008 |
| KR | 100879653 | 1/2009 |

OTHER PUBLICATIONS

Korean Office Action and English Translation, Application No. 10-2013-0064862, 9 pages.

(Continued)

*Primary Examiner* — Davienne Monbleau
*Assistant Examiner* — Fazli Erdem
(74) *Attorney, Agent, or Firm* — Slater Matsil, LLP

(57) ABSTRACT

FETs and methods for forming FETs are disclosed. A structure comprises a substrate, a gate dielectric and a gate electrode. The substrate comprises a fin, and the fin comprises an epitaxial channel region. The epitaxial channel has a major surface portion of an exterior surface. The major surface portion comprising at least one lattice shift, and the at least one lattice shift comprises an inward or outward shift relative to a center of the fin. The gate dielectric is on the major surface portion of the exterior surface. The gate electrode is on the gate dielectric.

17 Claims, 43 Drawing Sheets

(56) References Cited

U.S. PATENT DOCUMENTS

| | | |
|---|---|---|
| 2007/0001173 A1 | 1/2007 | Brask et al. |
| 2007/0145487 A1 | 6/2007 | Kavalieros et al. |
| 2007/0231997 A1 | 10/2007 | Doyle et al. |
| 2008/0277740 A1* | 11/2008 | Tateshita ................ 257/396 |
| 2011/0147842 A1 | 6/2011 | Cappellani et al. |
| 2012/0086053 A1* | 4/2012 | Tseng et al. ............. 257/288 |
| 2012/0199888 A1* | 8/2012 | Dai et al. ................ 257/288 |
| 2013/0049068 A1* | 2/2013 | Lin et al. ................ 257/192 |
| 2013/0093026 A1* | 4/2013 | Wann et al. .............. 257/401 |
| 2013/0105860 A1 | 5/2013 | Lochtefeld et al. |
| 2013/0200470 A1* | 8/2013 | Liu et al. ................. 257/408 |
| 2013/0234147 A1 | 9/2013 | Wu et al. |
| 2014/0084351 A1 | 3/2014 | Huang et al. |
| 2014/0145242 A1* | 5/2014 | Huang et al. ............ 257/192 |
| 2014/0175561 A1 | 6/2014 | Colinge et al. |
| 2014/0217362 A1* | 8/2014 | Ma et al. ................. 257/14 |
| 2014/0225065 A1* | 8/2014 | Rachmady et al. ........ 257/24 |
| 2014/0299923 A1* | 10/2014 | Chang ..................... 257/288 |
| 2014/0361336 A1* | 12/2014 | Chen et al. .............. 257/190 |
| 2015/0102386 A1* | 4/2015 | Chen et al. .............. 257/192 |
| 2015/0132911 A1* | 5/2015 | Wann et al. .............. 438/283 |

OTHER PUBLICATIONS

Ohmi T. et al. "Science-based New Silicon Technologies Exhibiting Super High Performance due to Radical-reaction-based Semiconductor Manufacturing" Journal of the Korean Physical Society, vol. 59, No. 2 Aug. 2011, pp. 391-401.

\* cited by examiner

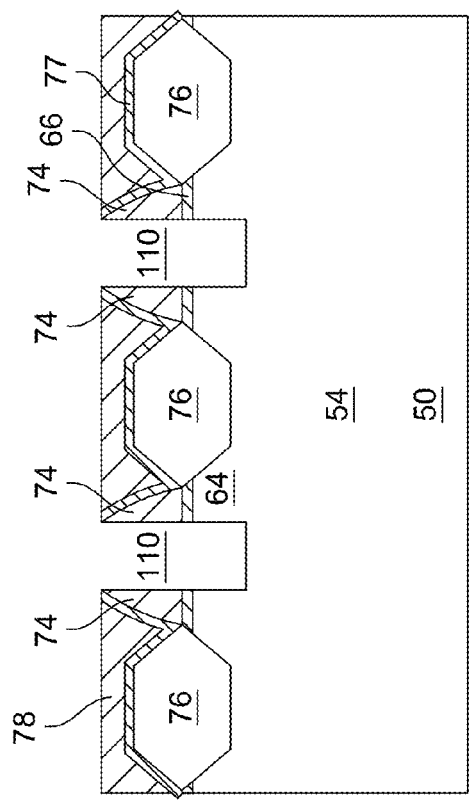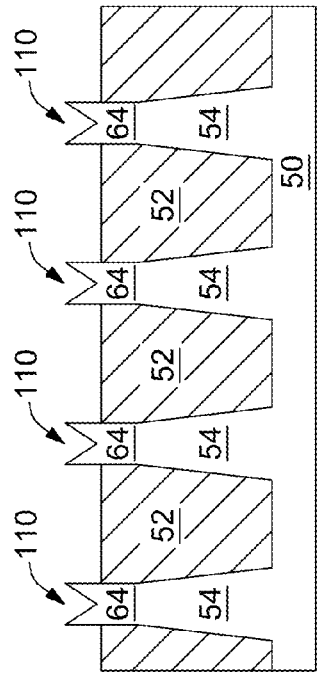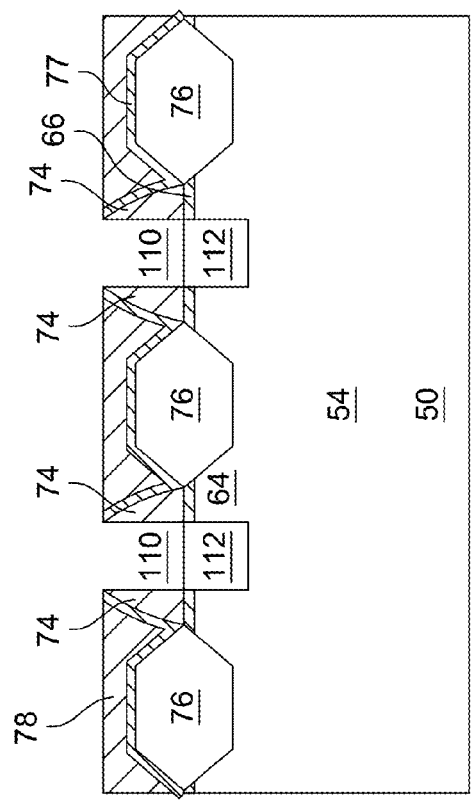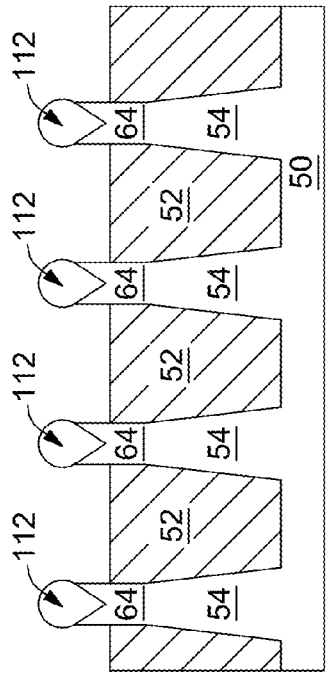

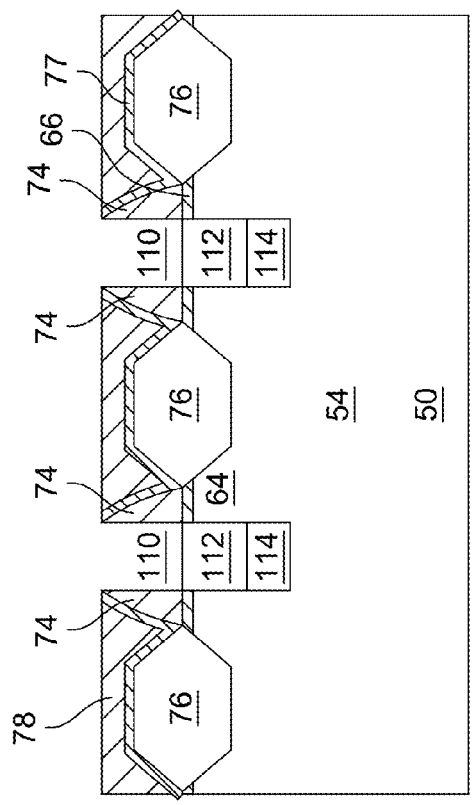
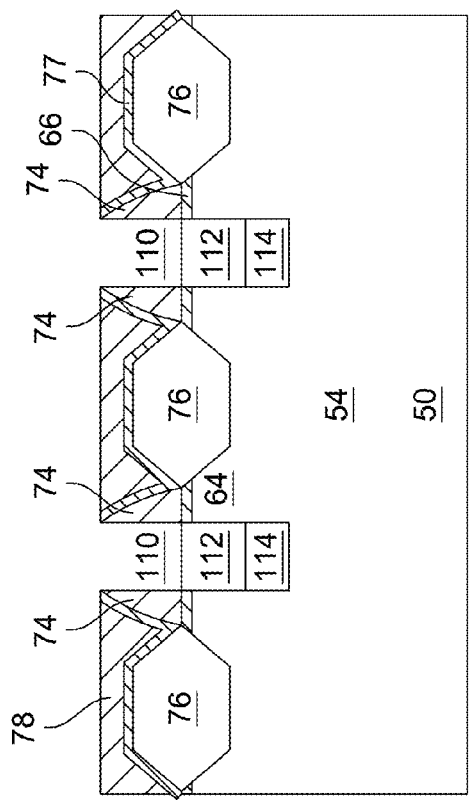
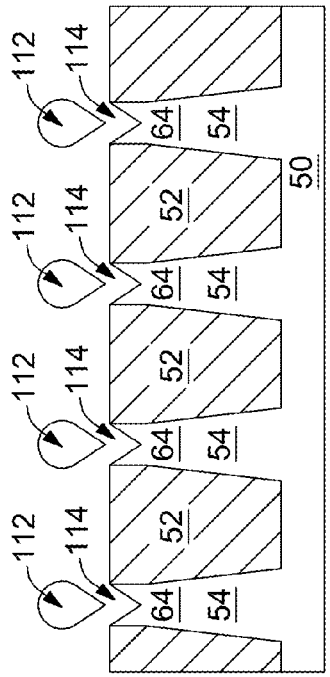
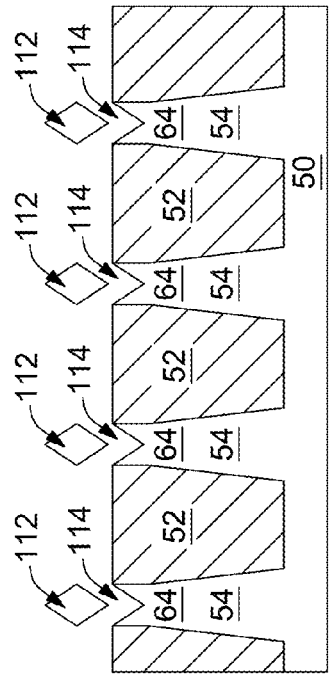
FIG. 28A
FIG. 28B
FIG. 29A
FIG. 29B

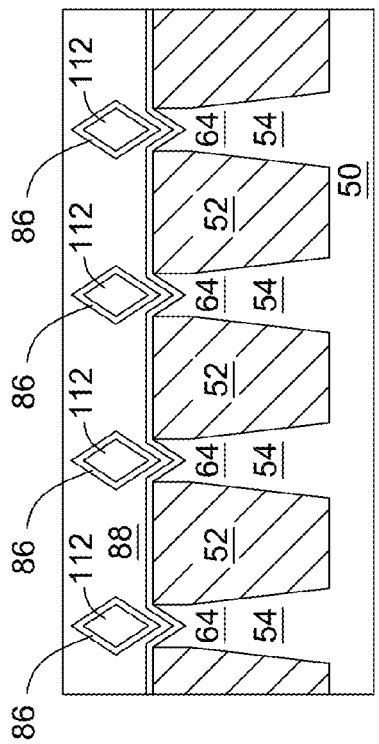
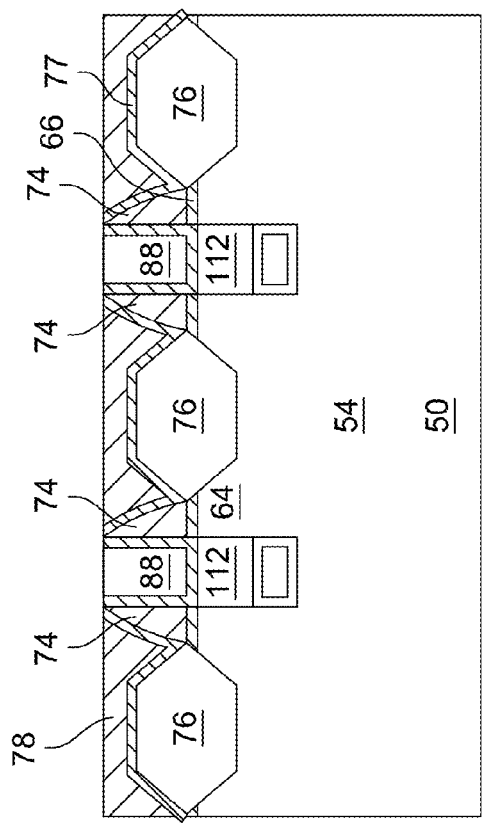
FIG. 30B
FIG. 30A

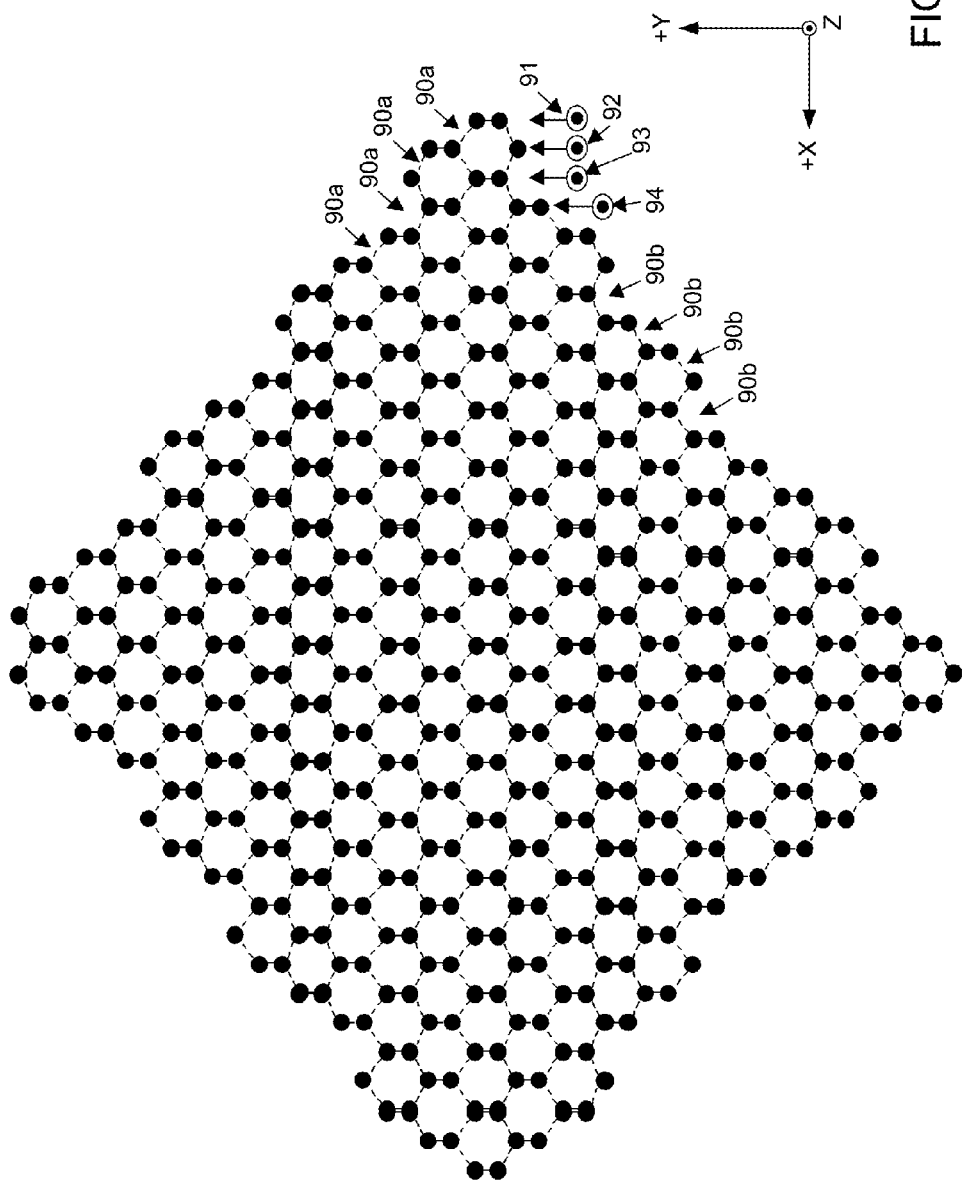

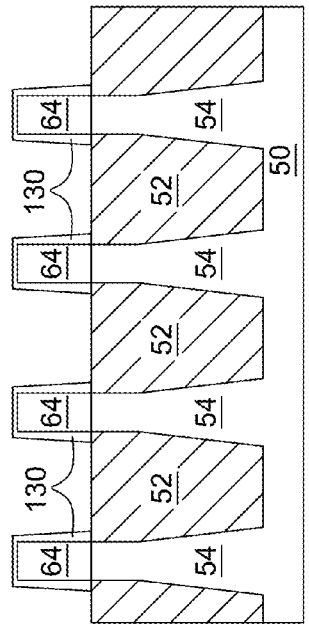
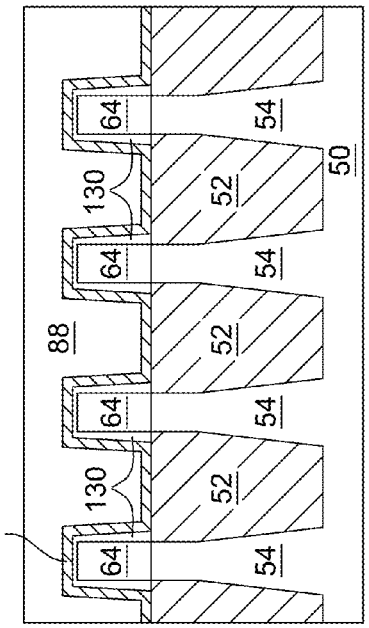
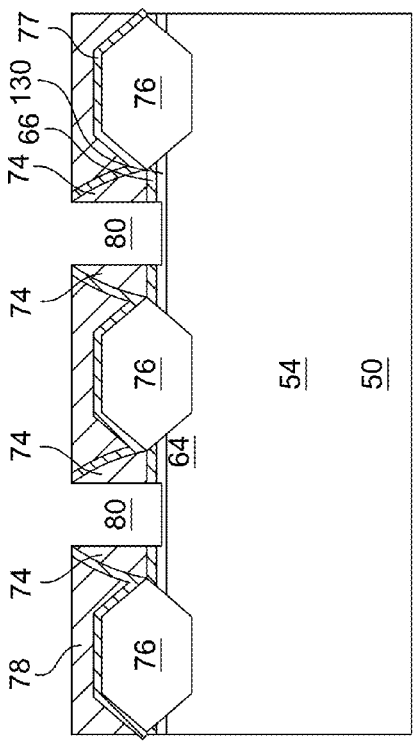
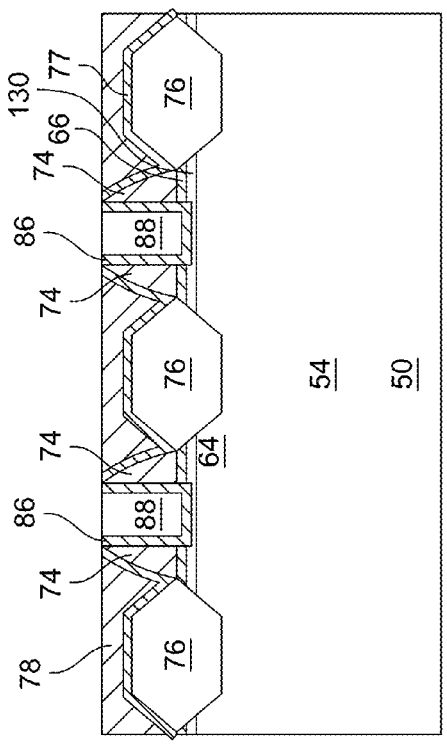

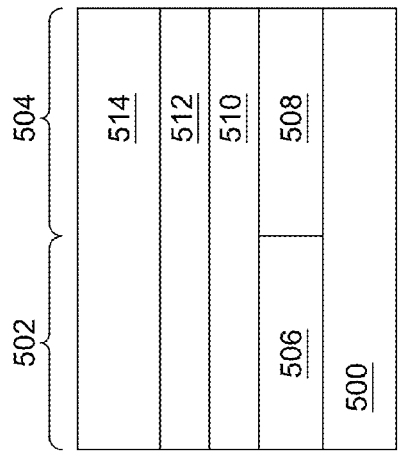
FIG. 38
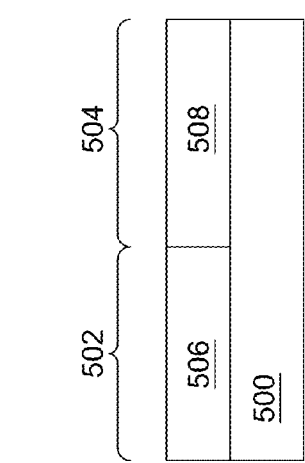
FIG. 39
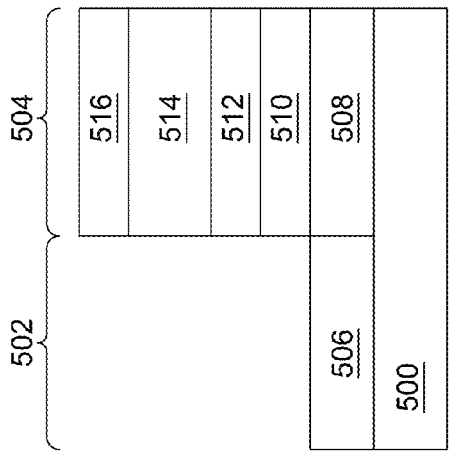
FIG. 40
FIG. 41

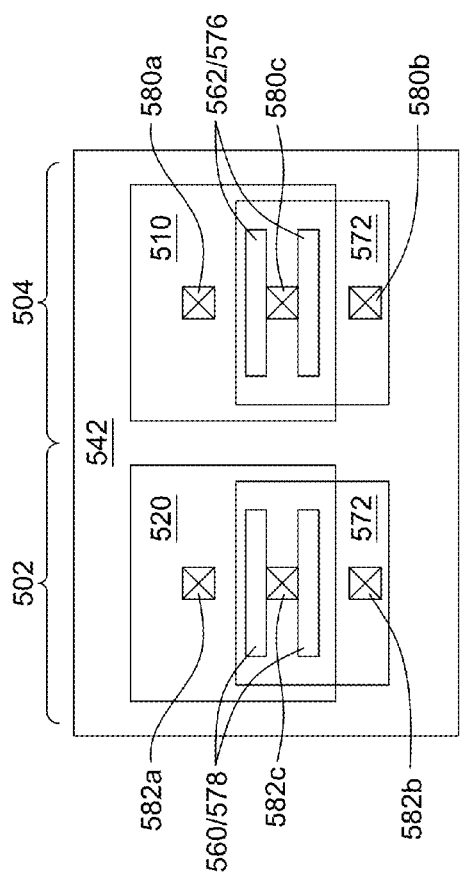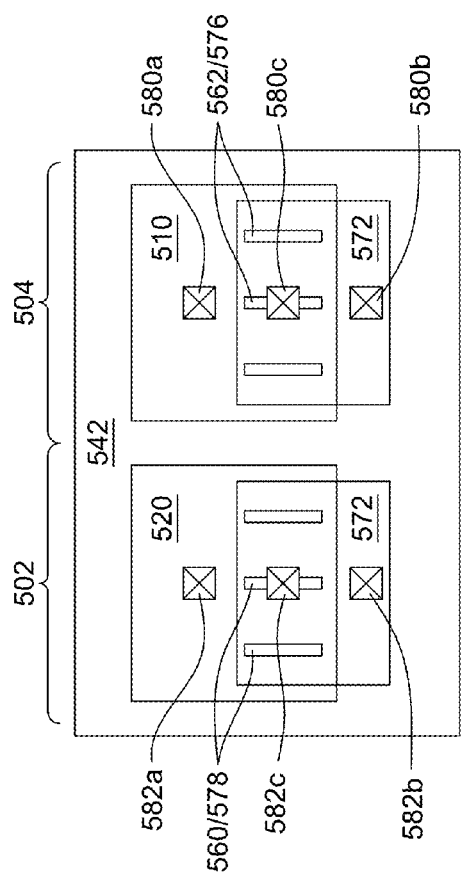

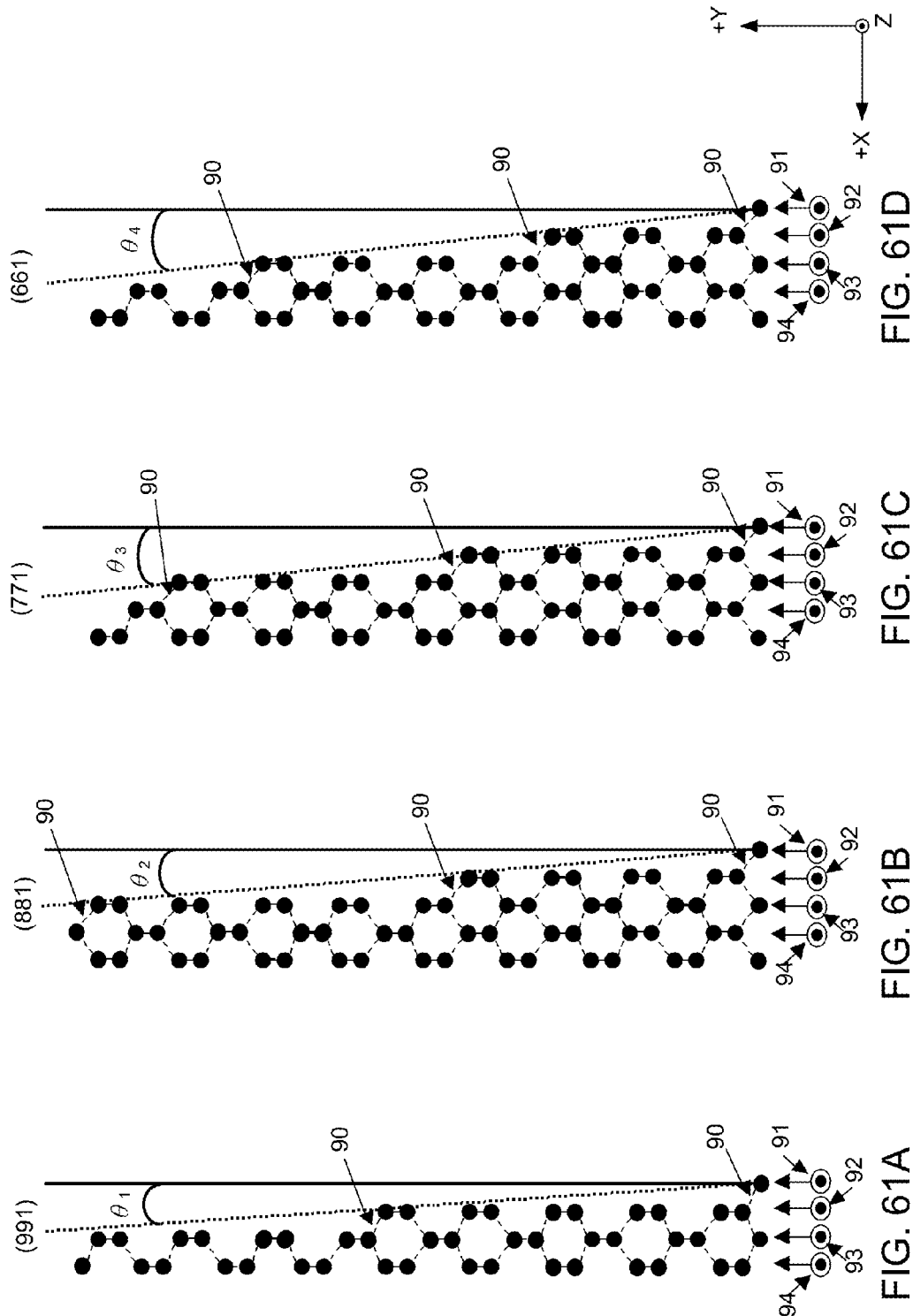

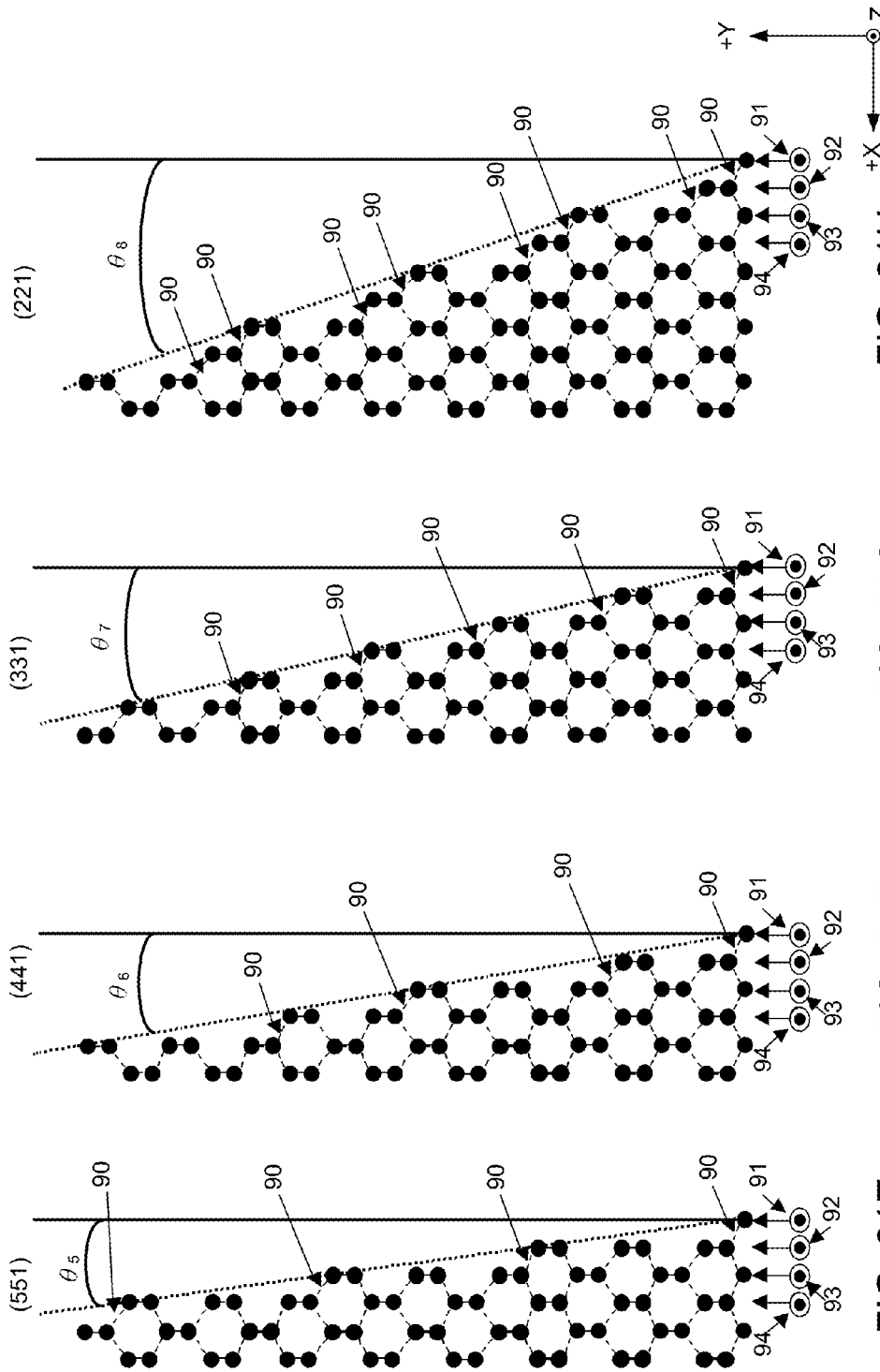

FETS AND METHODS FOR FORMING THE SAME

PRIORITY

This application is a continuation-in-part of U.S. patent application Ser. No. 13/779,356, filed on Feb. 27, 2013, entitled "FINFETs AND METHODS FOR FORMING THE SAME," which application is incorporated herein by reference in its entirety.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (finFETs) have been studied to overcome some of these problems.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 26A, 26B, 27A, 27B, 28A, 28B, 29A, 29B, 30A and 30B are cross-sectional views of intermediate stages in the manufacturing of a finFET in accordance with another exemplary embodiment.

FIG. 32 is a cross section view of an epitaxial channel regrowth region after re-shaping in accordance with an embodiment.

FIGS. 33, 34A, 34B, 35A, 35B, 36A, and 36B are cross-sectional views of intermediate stages in the manufacturing of a finFET in accordance with another exemplary embodiment.

FIGS. 38 through 56 are cross-sectional views of intermediate stages in the manufacturing of a FET, such as a VCFET, in accordance with another exemplary embodiment.

FIGS. 57A, 57B, 58, and 59 are views of aspects of a VCFET in accordance with some embodiments.

FIGS. 61A through 61H are a structure of a major surface portion of a sidewall of a fin, epitaxial region, and/or channel structure after re-shaping in accordance with some embodiments.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Field Effect Transistors (FETs), such as Fin FETs (finFETs) and vertical channel FETs (VCFETs), and methods of forming the same are provided in accordance with various embodiments. The intermediate stages of forming the FETs are illustrated. Some variations of the embodiments are discussed. Throughout the various views and illustrative embodiments, like reference numbers are used to designate like elements. Although method embodiments are discussed in a particular order, various other method embodiments may be performed in any logical order and may include fewer or more steps described herein.

Figure 1:
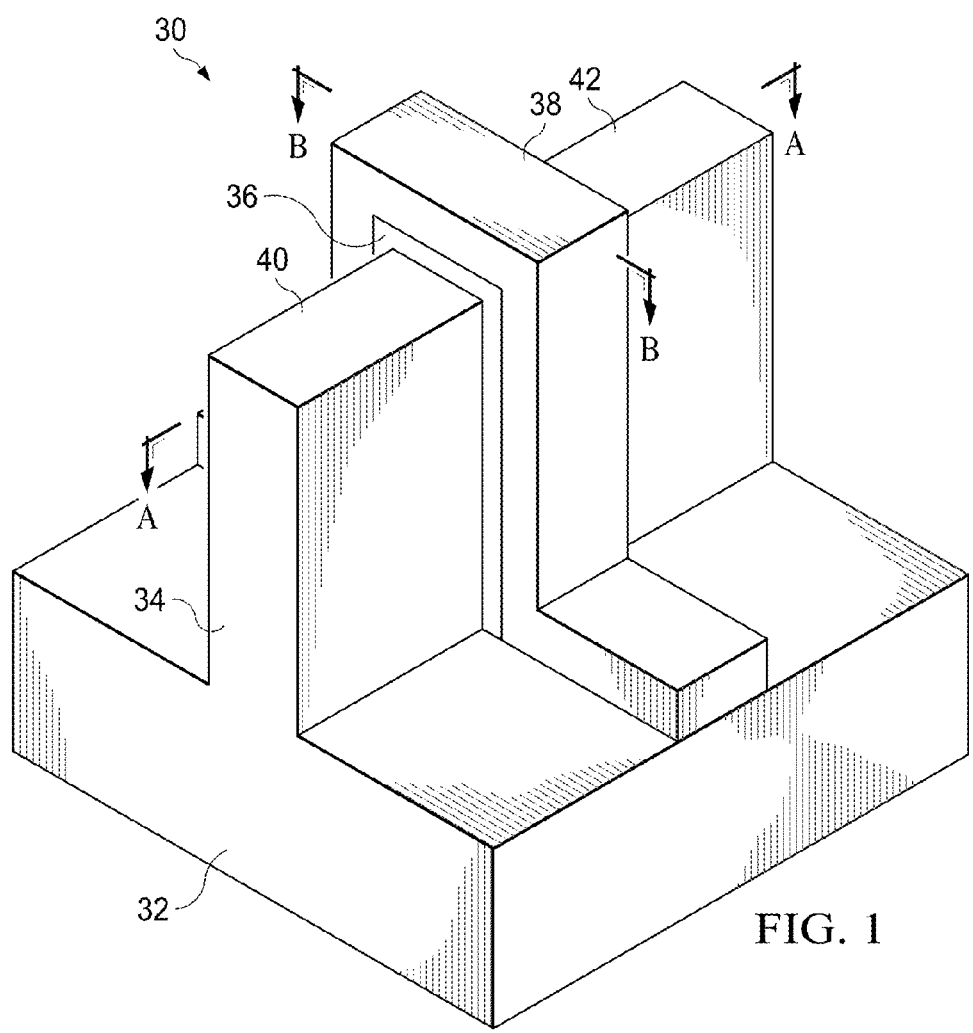
FIG. 1 is an example of a fin field-effect transistor (finFET) in a three-dimensional view.

FIG. 1 illustrates an example of a finFET 30 in a three-dimensional view. The finFET 30 comprises a fin 34 on a substrate 32. A gate dielectric 36 is along sidewalls and over a top surface of the fin 34, and a gate electrode 38 is over the gate dielectric 36. Source/drain regions 40 and 42 are disposed in opposite sides of the fin 34 with respect to the gate dielectric 36 and gate electrode 38. FIG. 1 further illustrates reference cross-sections that are used in later figures. Cross-section A-A is along a longitudinal axis of the fin 34 and in a direction of, for example, a current flow between the source/drain regions 40 and 42. Cross-section B-B is perpendicular to cross-section A-A and is across a channel, gate dielectric 36, and gate electrode 38 of the finFET 30.

Figure 13A:
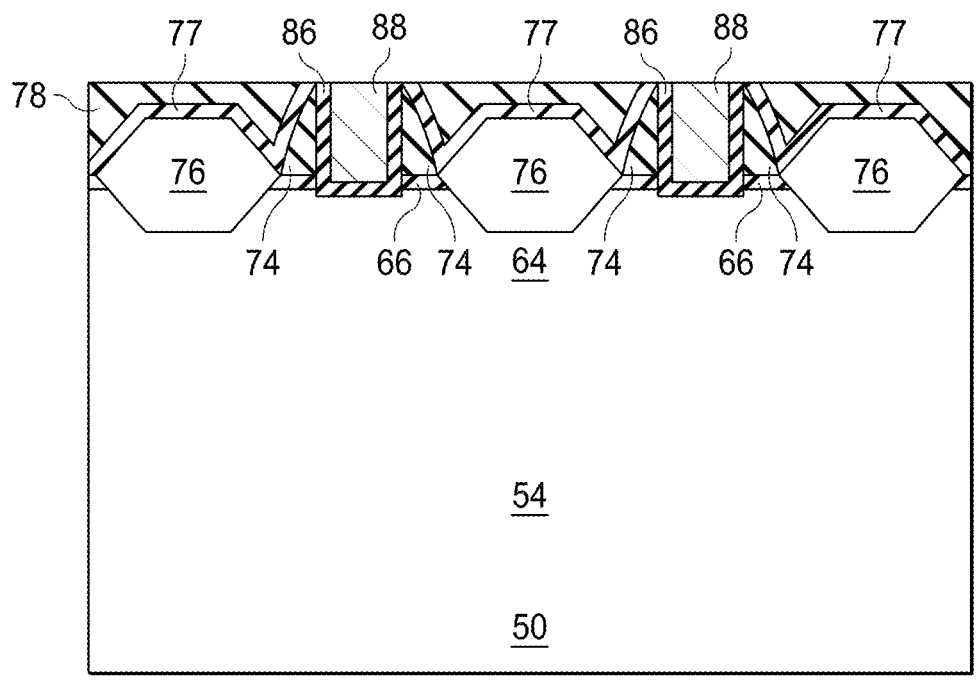
Figure 13B:
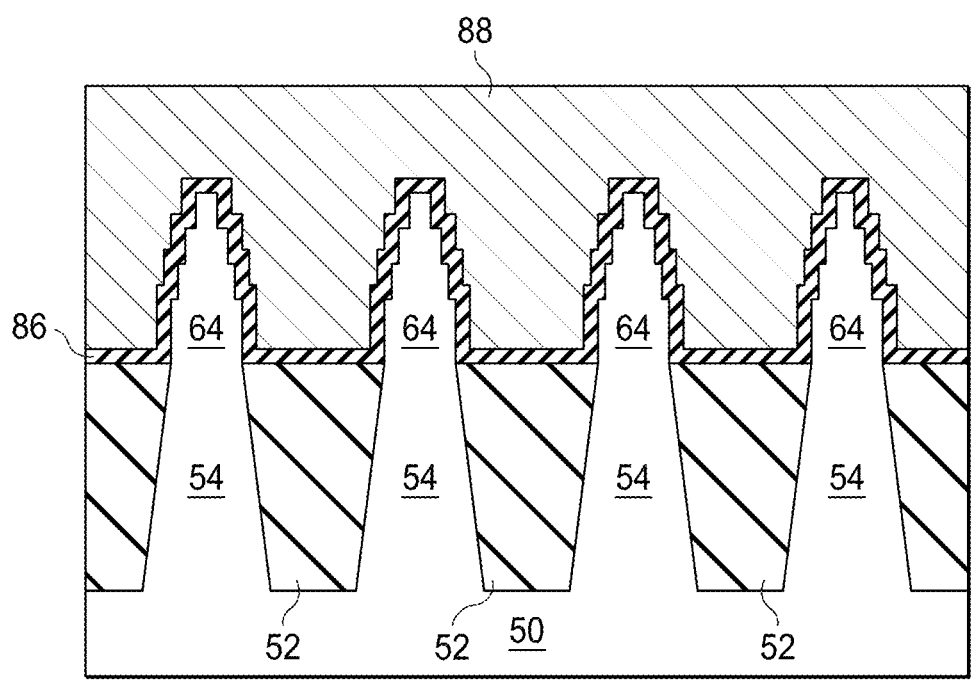
Figure 14:
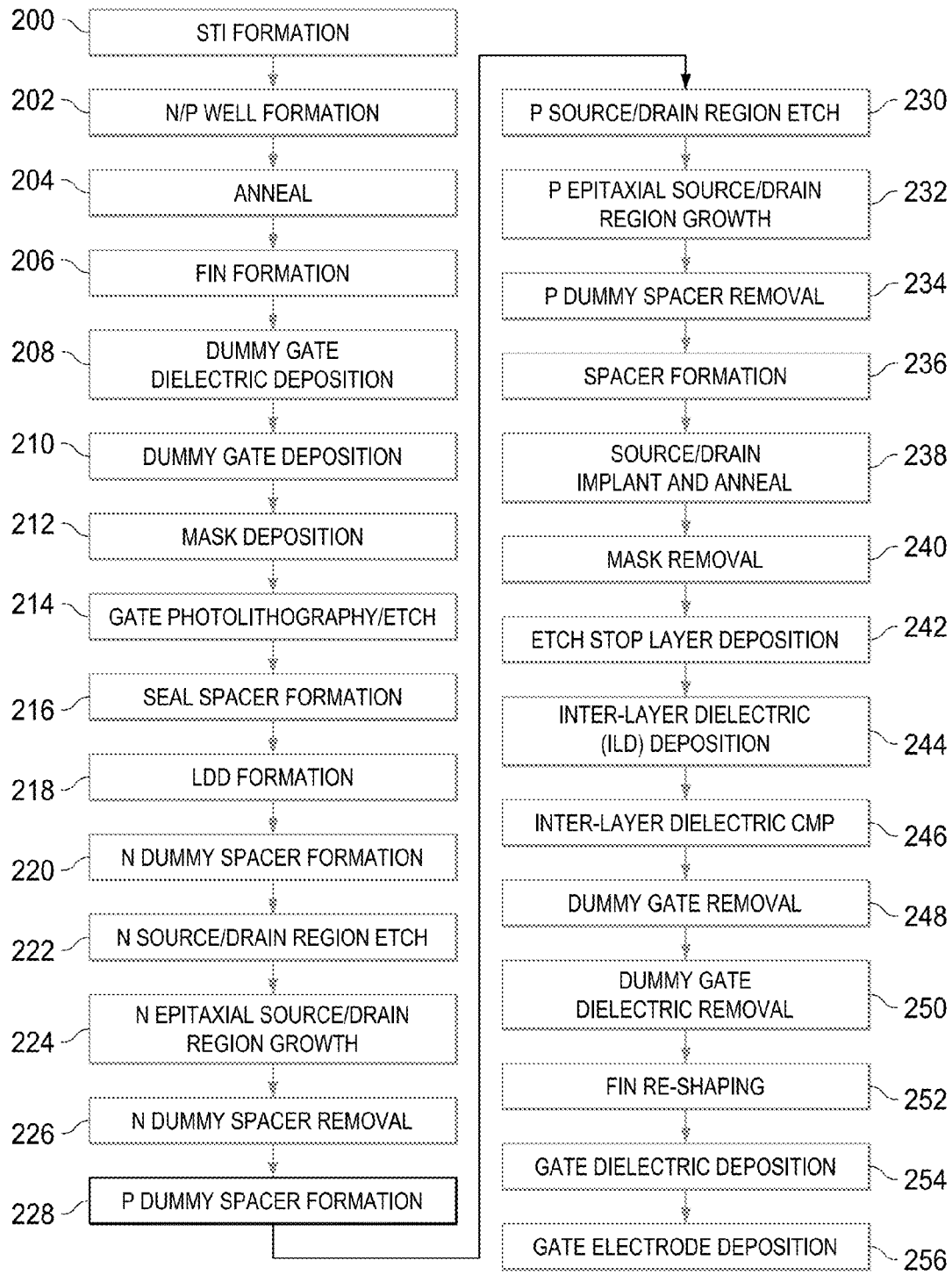
FIG. 14 is a process flow of the process shown in FIGS. 2 through 13B in accordance with an exemplary embodiment.

FIGS. 2 through 13B are cross-sectional views of intermediate stages in the manufacturing of a finFET in accordance with an exemplary embodiment, and FIG. 14 is a process flow of the process shown in FIGS. 2 through 13B. FIGS. 2 through 5 illustrate cross-section B-B illustrated in FIG. 1, except for multiple finFETs. In FIGS. 6A through 13B, figures ending with an "A" designation are illustrated along a similar cross-section A-A, and figures ending with a "B" designation are illustrated along a similar cross-section B-B.

Figure 2:
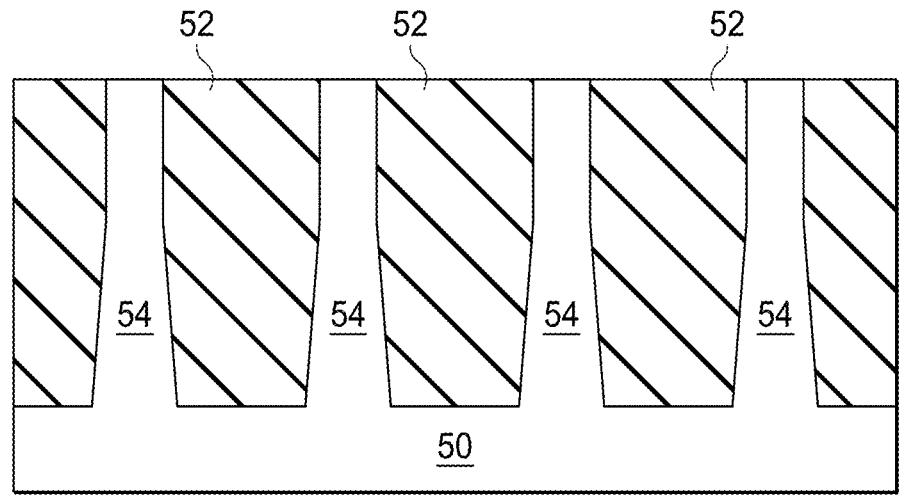
FIGS. 2, 3, 4, 5, 6A, 6B, 7A, 7B, 8A, 8B, 9A, 9B, 10A, 10B, 11A, 11B, 12A, 12B, 13A, and 13B are cross-sectional views of intermediate stages in the manufacturing of a finFET in accordance with an exemplary embodiment.

FIG. 2 illustrates a substrate 50, which may be a part of a wafer. Substrate 50 may be a semiconductor substrate, which may further be a silicon substrate, a silicon carbon substrate, a silicon germanium substrate, or a substrate formed of other semiconductor materials. The substrate 50 may be a bulk substrate, a semiconductor-on-insulator (SOI) substrate, or other acceptable substrates. The substrate 50 may be lightly doped with a p-type or an n-type impurity.

Isolation regions 52 are formed (step 200), which extend from a top surface of substrate 50 into substrate 50. Isolation regions 52 may be Shallow Trench Isolation (STI) regions. The formation of isolation regions 52 may include etching the substrate 50 to form trenches (not shown), and filling the trenches with a dielectric material to form isolation regions 52. Isolation regions 52 may be formed of silicon oxide deposited by a high density plasma, for example, although other dielectric materials formed according to various techniques may also be used. The portion of substrate 50 between neighboring isolation regions 52 is referred to as a semiconductor strip 54 throughout the description. The top surfaces of the semiconductor strips 54 and the top surfaces of isolation regions 52 may be substantially level with each other, such as by performing a chemical mechanical polish (CMP) after depositing the material of the isolation regions 52, although the surfaces may be at slightly different levels.

Figure 3:
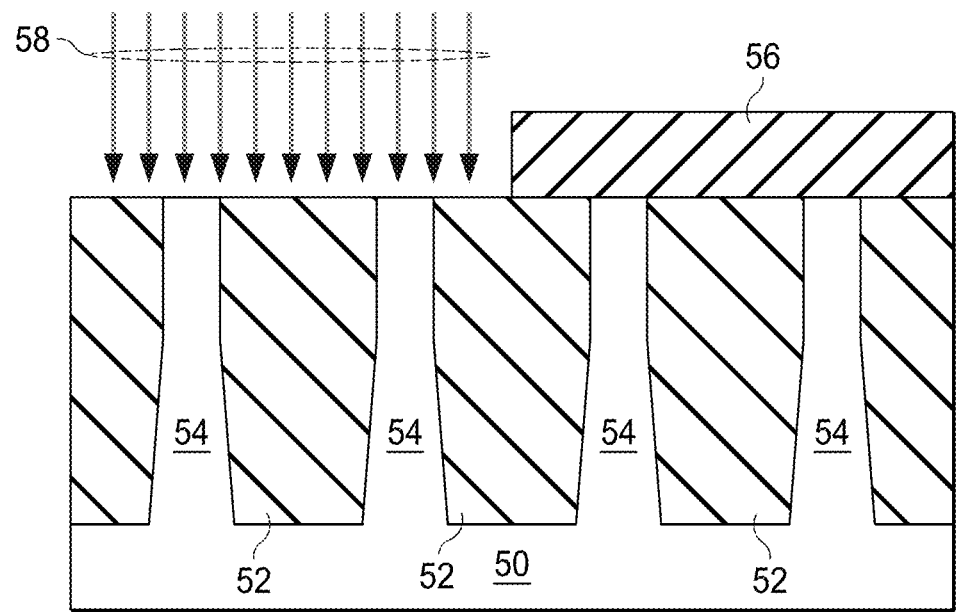
Figure 4:
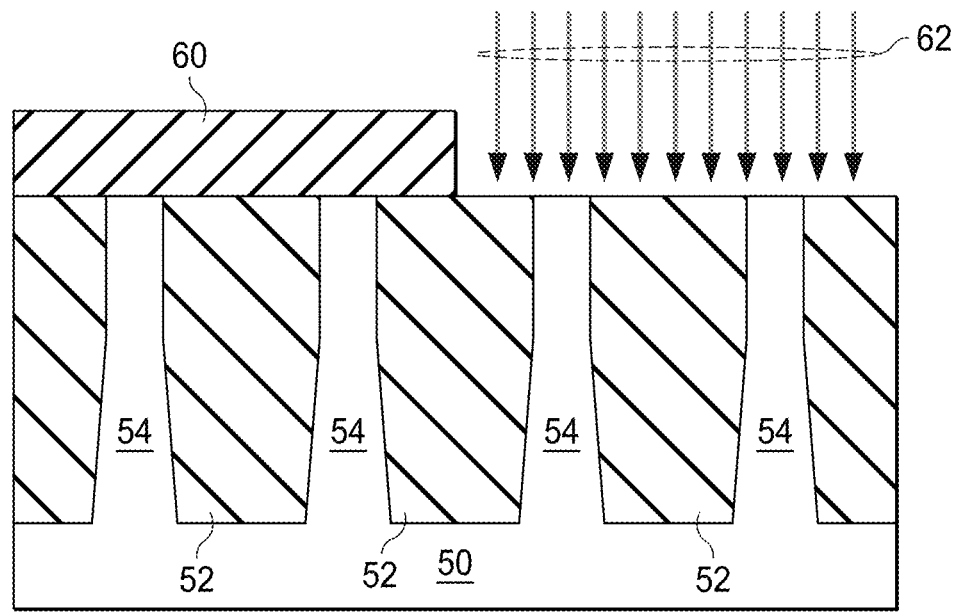

FIGS. 3 and 4 illustrate the formation of a P well in a first region and an N well in a second region (step 202). Referring to FIG. 3, a first photoresist 56 is formed over the semiconductor strips 54 and the isolation regions 52 in the substrate 50. The first photoresist 56 is patterned to expose a first region of the substrate 50, such as an NMOS region. The first photoresist 56 can be formed by using a spin-on technique and can be patterned using acceptable photolithography techniques. Once the first photoresist 56 is patterned, a p-type impurity implant 58 is performed in the first region, and the first photoresist 56 may act as a mask to substantially prevent p-type impurities from being implanted into a second region, such as a PMOS region. The p-type impurities may be boron, $BF_2$, or the like implanted in the first region to a concentration of equal to or less than $10^{18}$ cm$^{-3}$, such as between about $10^{17}$ cm$^{-3}$ and about $10^{18}$ cm$^{-3}$. After the implant 58, the first photoresist 56 may be removed, such as by an acceptable ashing process.

Referring to FIG. 4, a second photoresist 60 is formed over the semiconductor strips 54 and the isolation regions 52 in the substrate 50. The second photoresist 60 is patterned to expose a second region of the substrate 50, such as the PMOS region. The second photoresist 60 can be formed by using a spin-on technique and can be patterned using acceptable photolithography techniques. Once the second photoresist 60 is patterned, an n-type impurity implant 62 is performed in the second region, and the second photoresist 60 may act as a mask to substantially prevent n-type impurities from being implanted into the first region, such as the NMOS region. The n-type impurities may be phosphorus, arsenic, or the like implanted in the first region to a concentration of equal to or less than $10^{18}$ cm$^{-3}$, such as between about $10^{17}$ cm$^{-3}$ and about $10^{18}$ cm$^{-3}$. After the implant 62, the second photoresist 60 may be removed, such as by an acceptable ashing process.

After the implants in FIGS. 3 and 4, an anneal may be performed (step 204) to activate the p-type and n-type impurities that were implanted. The implantations may form a p-well in the NMOS region and an n-well in the PMOS region.

Figure 5:
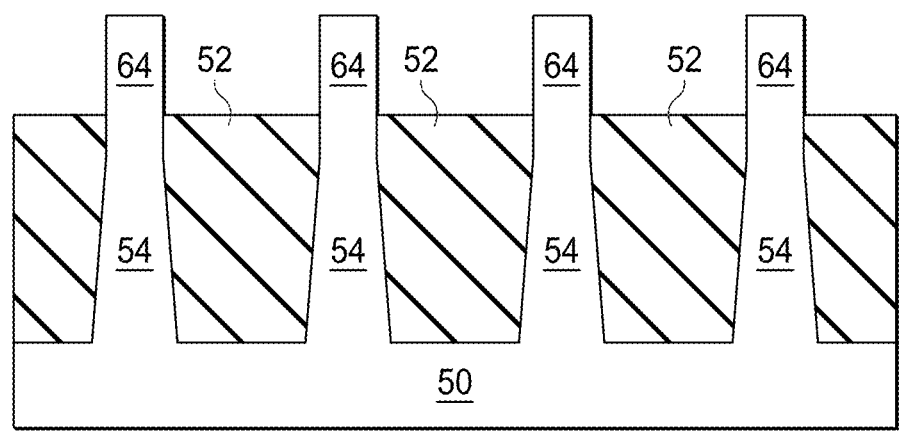

In FIG. 5, the isolation regions 52 are recessed such that respective fins 64 protrude from between neighboring isolation regions 52 to form the fins 64 (step 206). The isolation regions 52 may be recessed using an acceptable etching process, such as one that is selective to the material of the isolation regions 52. For example, a chemical oxide removal using a Tokyo Electron CERTAS or an Applied Materials SICONI tool or dilute hydrofluoric acid may be used.

A person having ordinary skill in the art will readily understand that the process described with respect to FIGS. 2 through 5 is just one example of how fins 64 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 54 in FIG. 2 can be recessed, and a material different from the semiconductor strips 54 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate the implantations discussed in FIGS. 3 and 4 although in situ and implantation doping may be used together. Still further, it may be advantageous to epitaxially grow a material in the NMOS region different from the material in the PMOS region. In various embodiments, the fins 64 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
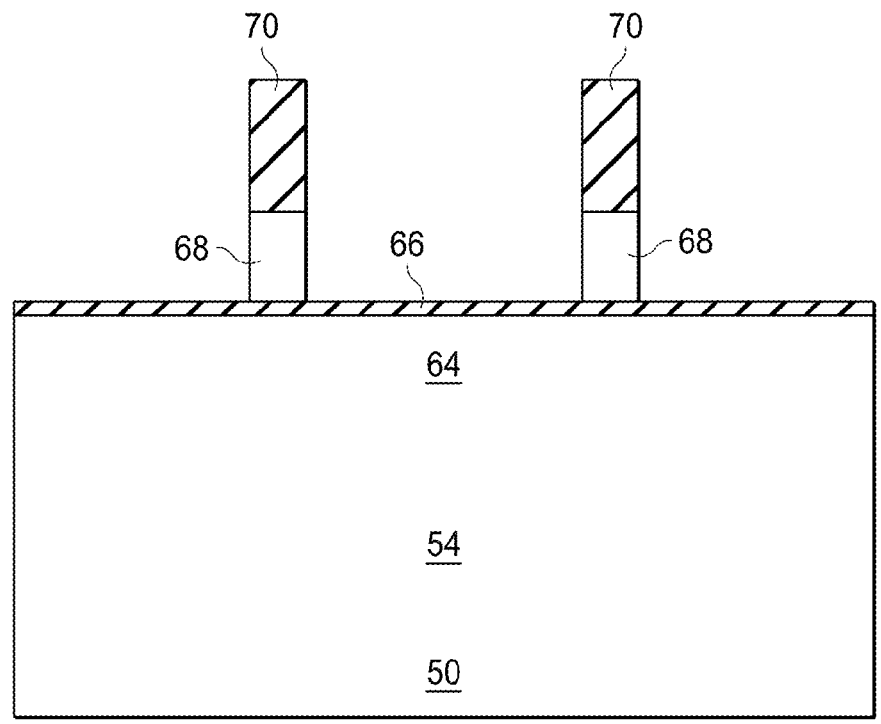
Figure 6B:
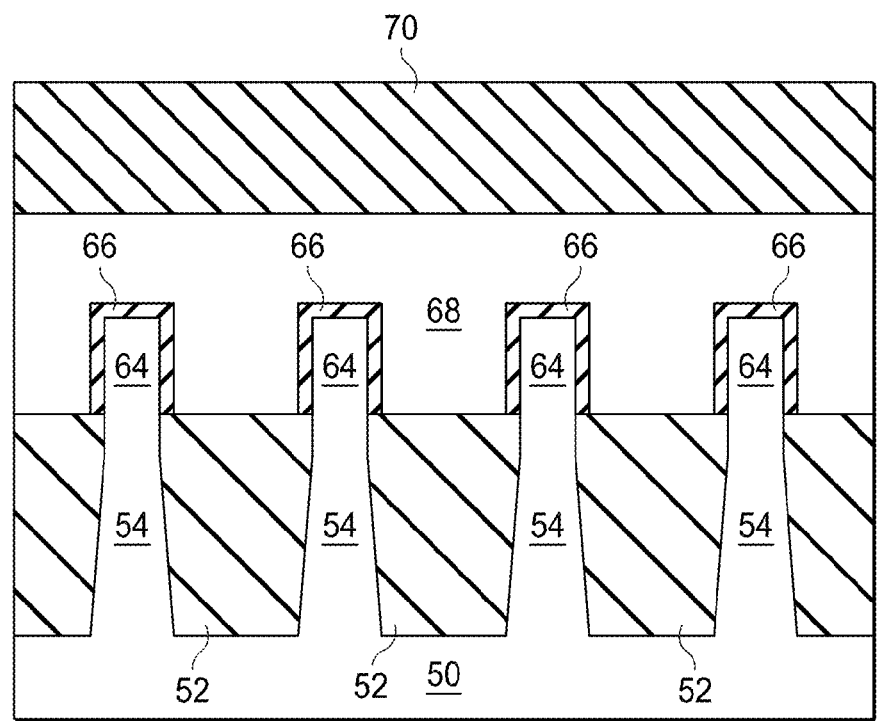

Referring to FIGS. 6A and 6B, a dummy gate dielectric layer 66 is formed (step 208) on the fins 64. The dummy gate dielectric layer 66 may be, for example, silicon oxide, silicon nitride, a combination thereof, or the like, and may be deposited or thermally grown according to acceptable techniques. Dummy gates 68 are formed over the dummy gate dielectric layer 66, and masks 70 are formed over the dummy gates 68. A material of the dummy gates 68 may be deposited (step 210) over the dummy gate dielectric layer 66 and then planarized, such as by a CMP. A material of the masks 70 may be deposited (step 212) over the layer of the dummy gates 68. The material of the masks 70 then may be patterned using acceptable photolithography and etching techniques. The pattern of the masks 70 then may be transferred to the material of the dummy gates 68 by an acceptable etching technique. These photolithography and etching techniques may form the dummy gates 68 and masks 70 (step 214). Dummy gates 68 may be formed of, for example, polysilicon, although other materials that have a high etching selectivity from the etching of isolation regions 52 may also be used. The masks 70 may be formed of, for example, silicon nitride or the like. The dummy gates 68 cover respective channel regions of the fin 64. The dummy gates 68 may also have a lengthwise direction substantially perpendicular to the lengthwise direction of respective fins 64.

Figure 7A:
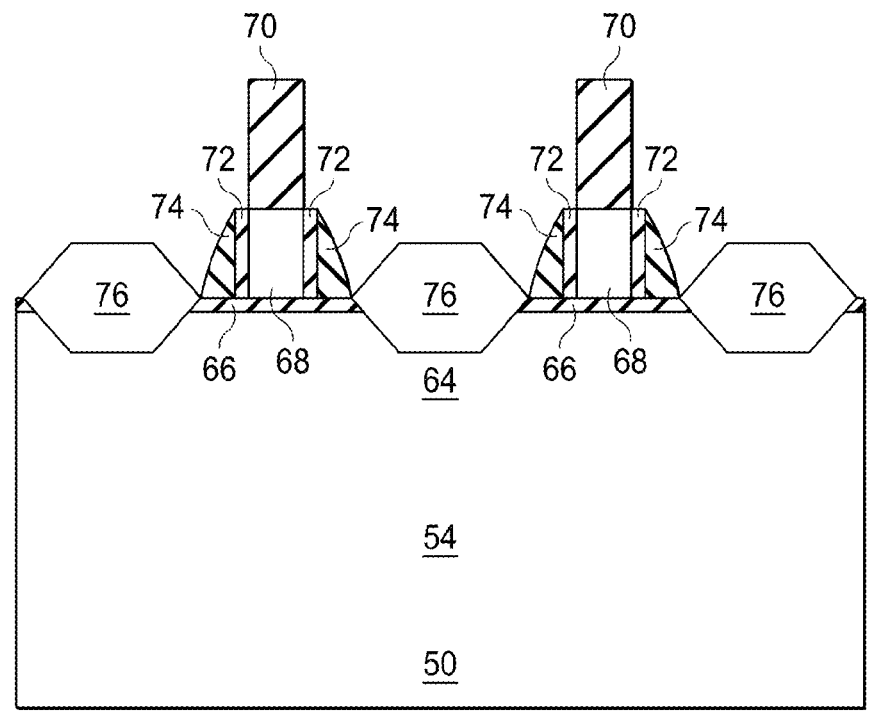
Figure 7B:
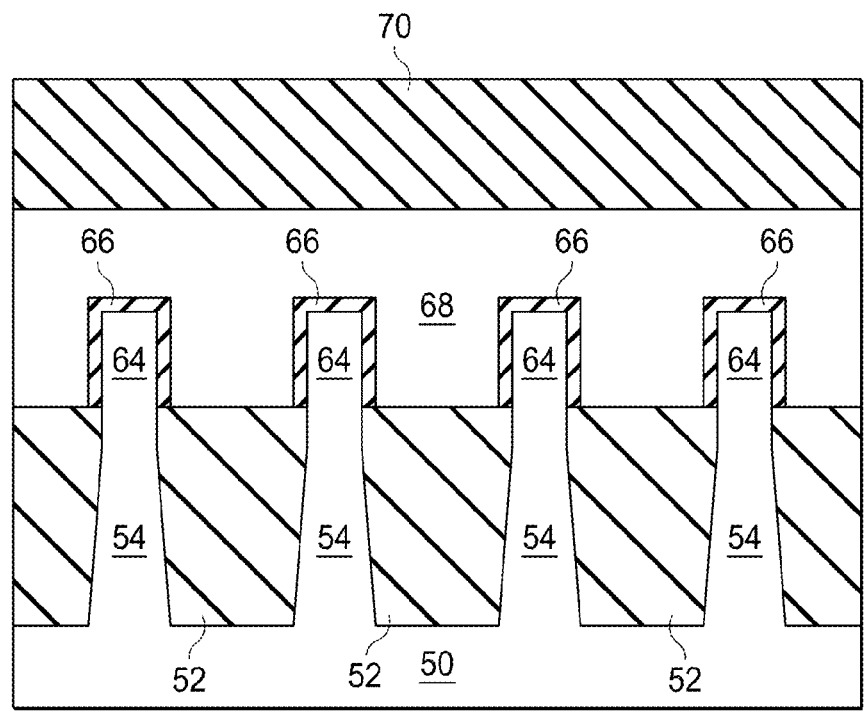

Referring to FIGS. 7A and 7B, gate seal spacers 72 can be formed (step 216) on exposed surfaces of respective dummy gates 68. A thermal oxidation or a deposition followed by an anisotropic etch may form the gate seal spacers 72. Implants for lightly doped source/drain (LDD) regions may be performed (step 218). Similar to FIGS. 3 and 4, a mask may be formed over the PMOS region while exposing the NMOS region, and n-type impurities may be implanted into the exposed fins 64. The mask may then be removed. Subsequently, a mask may be formed over the NMOS region while exposing the PMOS region, and p-type impurities may be implanted into the exposed fins 64. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{16}$ cm$^3$. An anneal may activate the implanted impurities.

Epitaxial source/drain regions 76 are formed in the fins 64, wherein each dummy gate 68 is disposed between respective neighboring pairs of the epitaxial source/drain regions 76. Epitaxial source/drain regions 76 in the NMOS region may be formed by masking the PMOS region and conformally depositing a dummy spacer layer in the NMOS region followed by an anisotropic etch to form dummy gate spacers (step 220) (not shown in FIGS. 7A and 7B) along sidewalls of the dummy gates 68 in the NMOS region. Then, source/drain regions of the fins 64 in the NMOS region are etched (step 222) to form recesses. The epitaxial source/drain regions 76 in the NMOS region are epitaxially grown (step 224) in the recesses. The epitaxial source/drain regions 76 may comprise any material appropriate for n-type finFETs. For example, if the fin is silicon, the epitaxial source/drain regions 76 may comprise silicon, SiC, SiCP, or the like. The epitaxial source/drain regions 76 may have surfaces raised from respective surfaces of the fins 64 and may have facets. Subsequently, the dummy gate spacers in the NMOS region are removed (step 226), for example, by an etch, as is the mask on the PMOS region.

Epitaxial source/drain regions 76 in the PMOS region may be formed by masking the NMOS region and conformally depositing a dummy spacer layer in the PMOS region followed by an anisotropic etch to form dummy gate spacers (step 228) (not shown in FIGS. 7A and 7B) along sidewalls of the dummy gates 68 in the PMOS region. Then, source/drain regions of the fins 64 in the PMOS region are etched (step 230) to form recesses. The epitaxial source/drain regions 76 in the PMOS region are epitaxially grown (step 232) in the recesses. The epitaxial source/drain regions 76 may comprise any material appropriate for p-type finFETs. For example, if the fin is silicon, the epitaxial source/drain regions 76 may comprise SiGe$_x$, SiGe$_x$B, or the like. The epitaxial source/drain regions 76 may have surfaces raised from respective surfaces of the fins 64 and may have facets. Subsequently, the dummy gate spacers in the PMOS region are removed (step 234), for example, by an etch, as is the mask on the NMOS region.

Gate spacers 74 are formed (step 236) on the gate seal spacers 72 along sidewalls of the dummy gates 68. The gate spacers 74 may be formed by conformally depositing a material and subsequently anisotropically etching the material. The material of the gate spacers 74 may be silicon nitride, SiCN, a combination thereof, or the like.

The epitaxial source/drain regions 76 and/or fins 64 may be implanted with dopants to form source/drain regions, similar to the process previously discussed for forming lightly doped source/drain regions, followed by an anneal (step 238). The source/drain regions may have an impurity concentration of between about $10^{19}$ cm$^{-3}$ and about $10^{21}$ cm$^{-3}$. The n-type impurities for source/drain regions in the NMOS region may be any of the n-type impurities previously discussed, and the p-type impurities for source/drain regions in the PMOS region may be any of the p-type impurities previously discussed. In other embodiments, the epitaxial source/drain regions 76 may be in situ doped during growth.

Figure 8A:
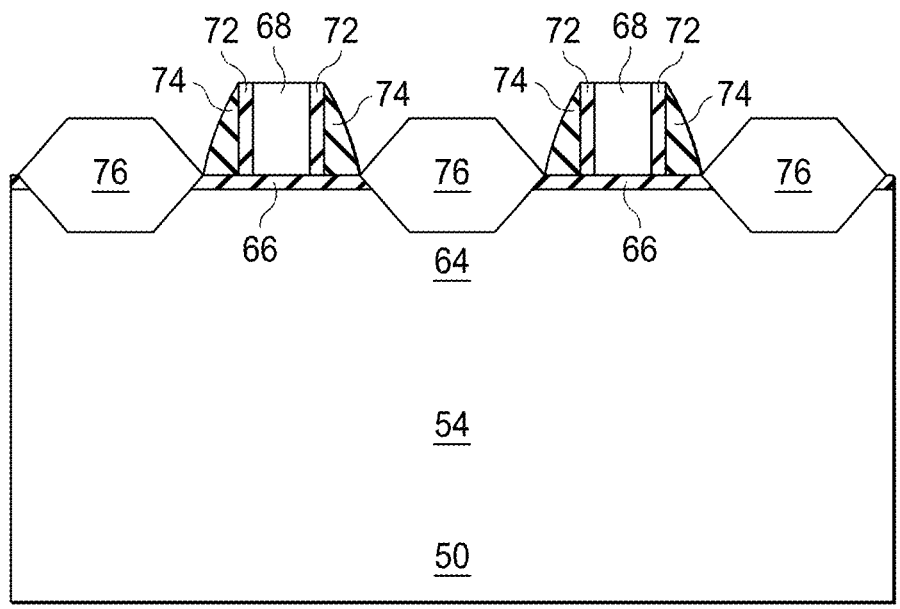
Figure 8B:
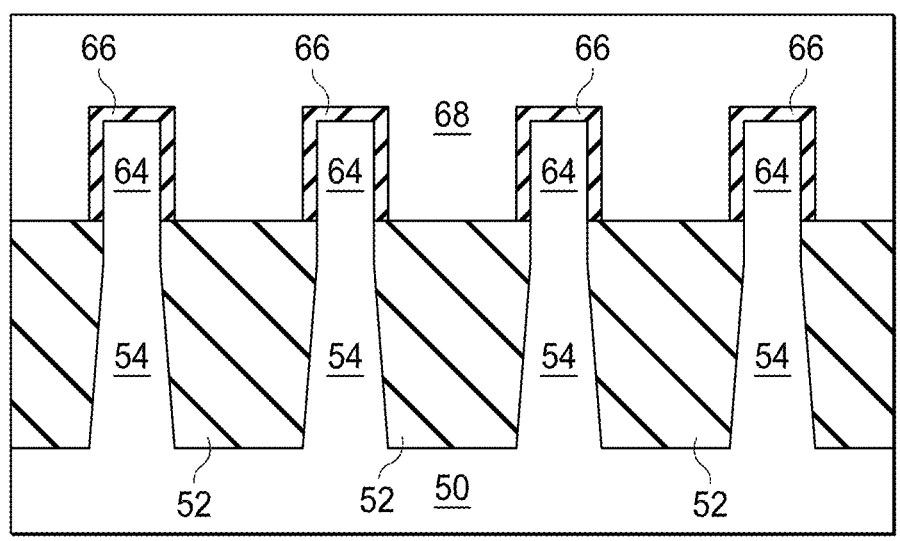

In FIGS. 8A and 8B, the masks 70 are removed (step 240), for example, by an etch selective to the material of the masks 70.

Figure 9A:
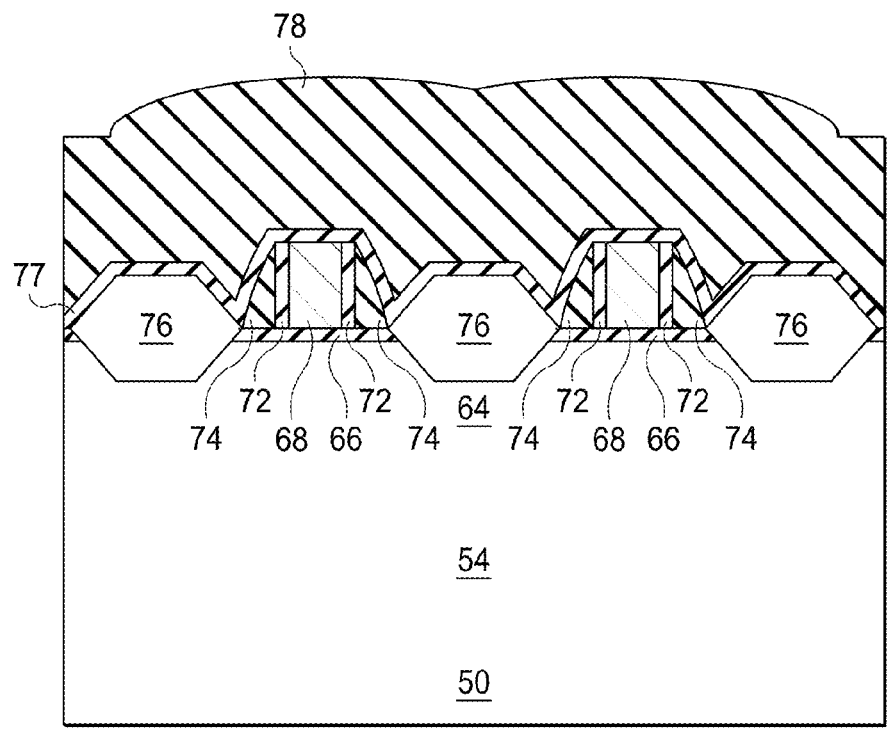
Figure 9B:
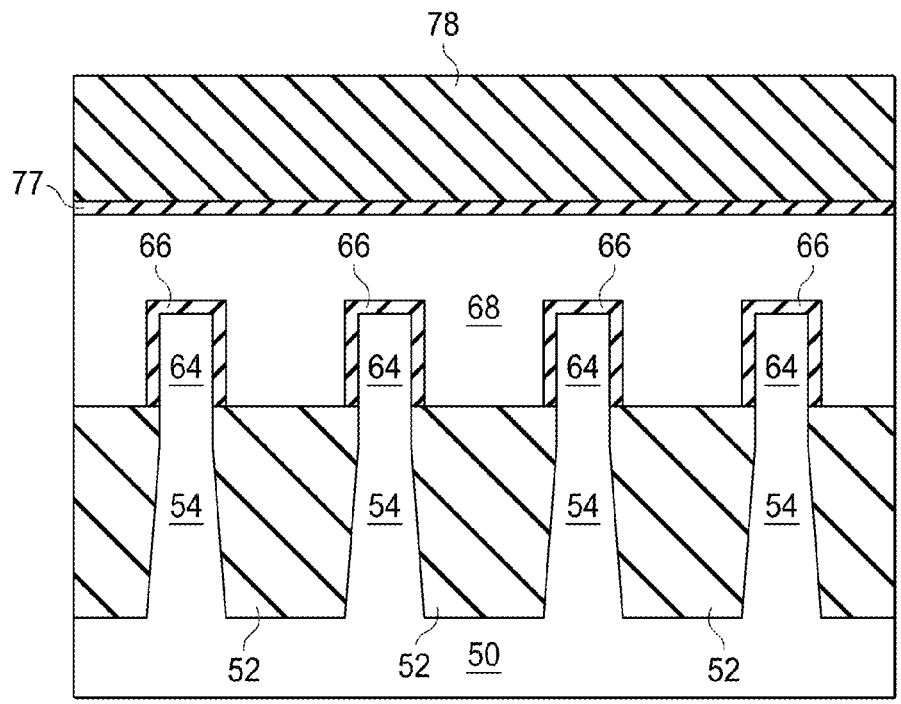

FIGS. 9A and 9B illustrate an etch stop layer 77 is conformally or non-conformally deposited (step 242) over the structure illustrated in FIGS. 8A and 8B, and an Inter-Layer Dielectric (ILD) 78 is deposited (step 244) over the etch stop layer 77. The etch stop layer 77 may be silicon nitride, SiOn, SiCN, a combination thereof, and the like. ILD 78 is formed of a dielectric material such as Phospho-Silicate Glass (PSG), Boro-Silicate Glass (BSG), Boron-Doped Phospho-Silicate Glass (BPSG), undoped Silicate Glass (USG), or the like.

Figure 10A:
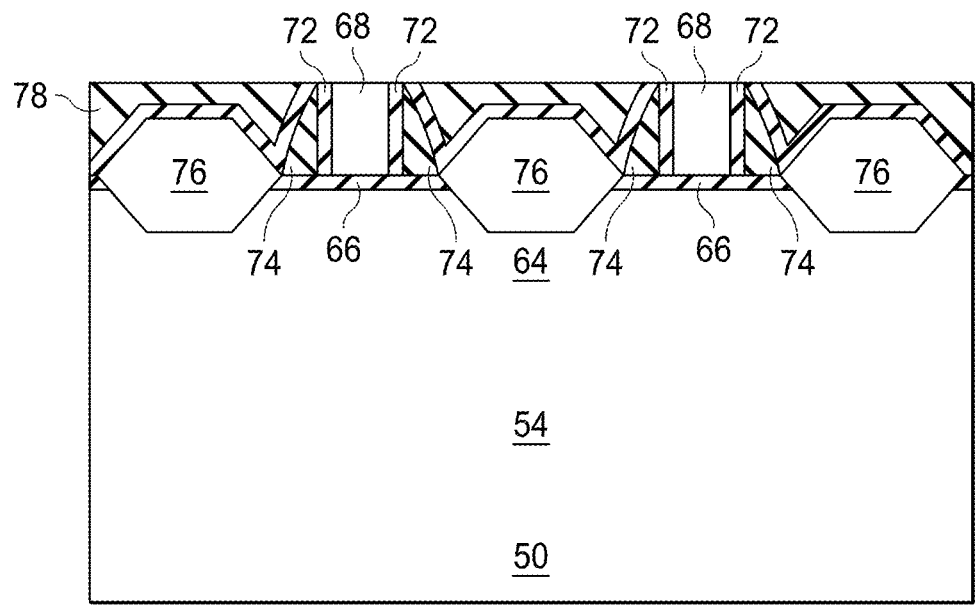
Figure 10B:
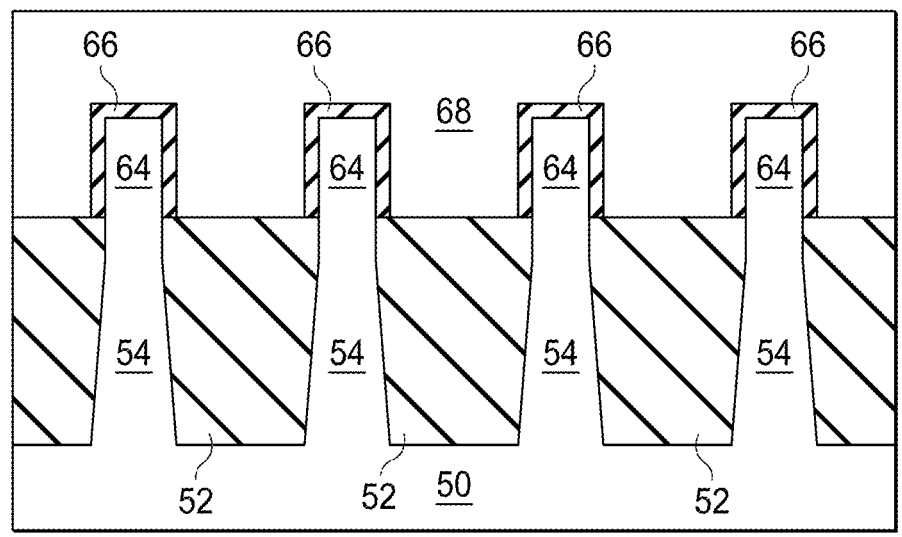

Referring to FIGS. 10A and 10B, a CMP may be performed (step 246) to level the top surface of ILD 78 with the top surfaces of the dummy gates 68. The CMP may also remove portions of the etch stop layer 77 that are directly above the dummy gates 68. Accordingly, top surfaces of the dummy gates 68 are exposed through the ILD 78 and the etch stop layer 77.

Figure 11A:
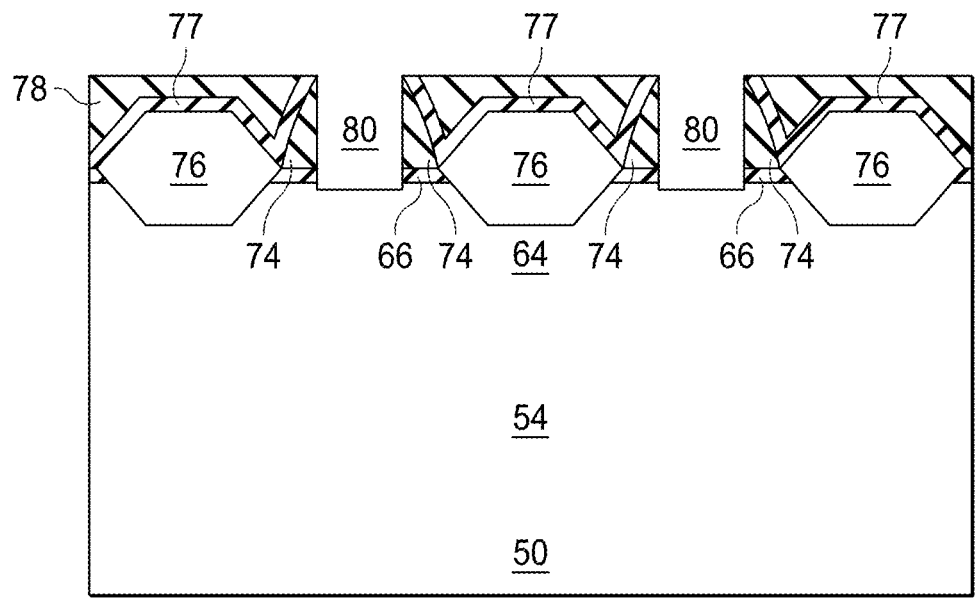
Figure 11B:
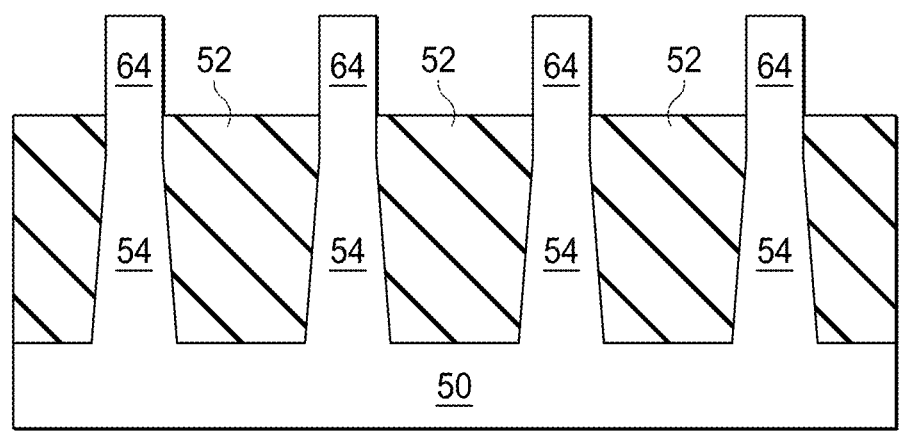

Next, referring to FIGS. 11A and 11B, the dummy gates 68, gate seal spacers 72, and portions of the dummy gate dielectric layer 66 directly underlying the dummy gates 68 are removed in an etching step(s), so that recesses 80 are formed. Each recess 80 exposes a channel region of a respective fin 64. Each channel region is disposed between neighboring pairs of epitaxial source/drain regions 76. During the removal, the dummy gate dielectric layer 66 may be used as an etch stop layer when the dummy gates 68 are etched (step 248). The dummy gate dielectric layer 66 and gate seal spacers 72 may then be removed (step 250) after the removal of the dummy gates 68.

Figure 12A:
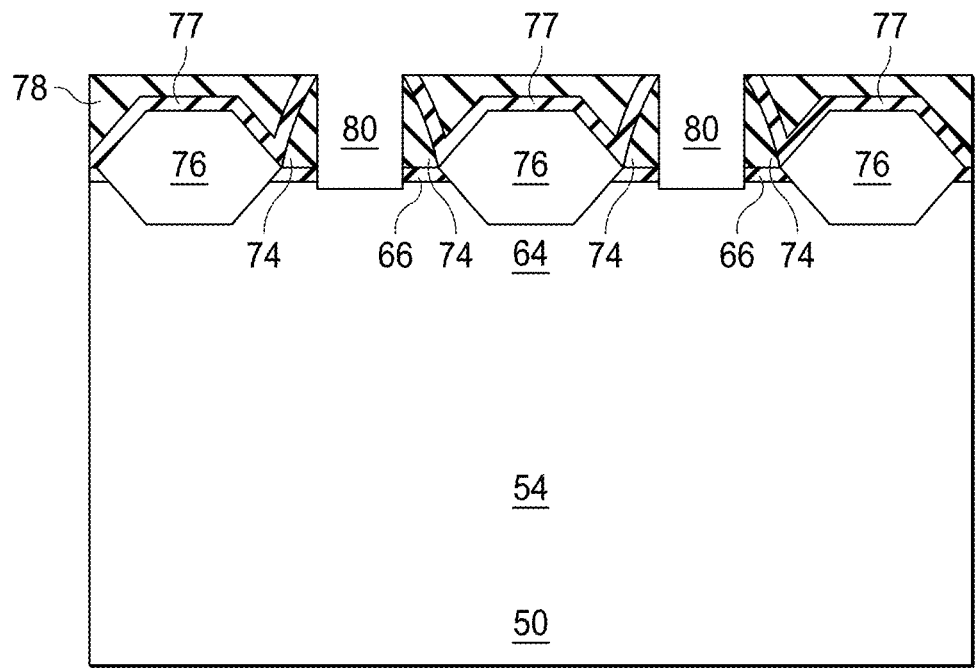
Figure 12B:
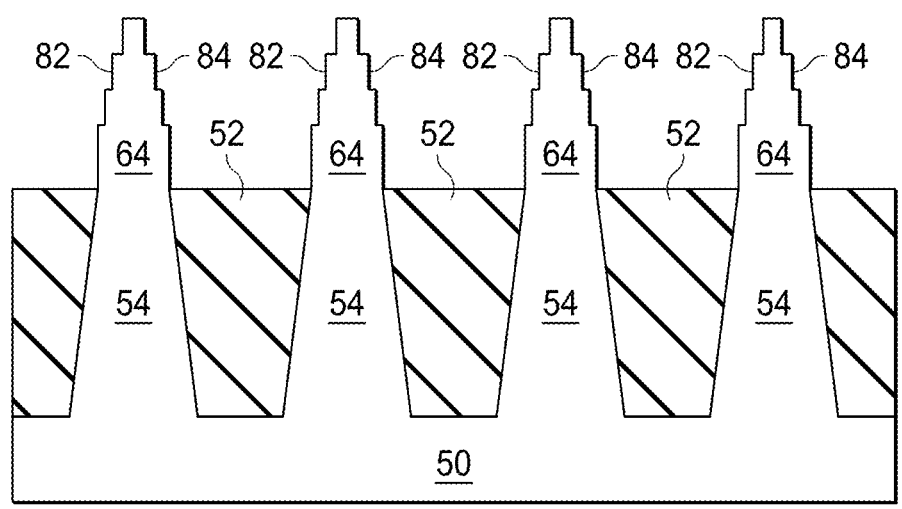

In FIGS. 12A and 12B, the channel regions of the fins 64 are re-shaped (step 252). Each channel region of the fins 64 is re-shaped to have a cross-section that intersects a longitudinal axis of the fin 64 (e.g., in a direction of current flow between the source/drain regions during operation of the finFET) that is substantially trapezoidal or triangular in shape. For example, the channel region of the fin 64 may comprise substantially a trapezoidal prism or a triangular prism. Sidewalls 82 and 84 may be respective rectangular faces of a prism, and a base of the prism may be a rectangular area disposed in the fin 64 connecting the sidewalls 82 and 84. FIG. 12B shows a stair-step illustration of the sidewalls 82 and 84. Some embodiments may have substantially smooth sidewalls 82 and 84, and other embodiments may have sidewalls 82 and 84 with more pronounced stair-step increments. Other aspects of the structure of a re-shaped fin will be discussed in more detail with respect to FIGS. 15 through 19 below.

The fin re-shaping may be performed using one or more of a wet etch, a dry etch, or an anneal. A wet etch may comprise an immersion in a solution comprising an etching species. The etching species can comprise ammonium hydroxide (NH$_4$OH), an ammonia peroxide mixture (APM), hydrochloric acid (HCl), dilute hydrofluoric acid (dHF), a combination thereof, or the like. The etching species can have a concentration between about 0.2 percent and about 20 percent in the solution. The wet etch can include immersion in the solution from about 20 seconds to about 600 seconds and can be at a temperature of about 20° C. to about 60° C. A dry etch may comprise a plasma process, such as inductively coupled plasma (ICP), transformer coupled plasma (TCP), electron cyclotron resonance (ECR), reactive ion etch (RIE), the like, or a combination thereof. The plasma process may use reaction gases including a fluorine-based gas (such as $SF_6$, $CH_2F_2$, $CH_3F$, $CHF_3$, or the like), chloride ($Cl_2$), hydrogen bromide (HBr), oxygen ($O_2$), the like, or a combination thereof. The plasma process may use a pressure between about 3 mTorr and about 100 mTorr, use a power of about 300 W to about 1500 W, and may use a frequency of about 2 kHz to about 13.6 MHz. An anneal may comprise heating at a temperature greater than or equal to 500° C. for about a few milliseconds, such as for a high temperature anneal at temperatures between about 800° C. and about 1200° C., to about 12 hours, such as for a lower temperature anneal at temperatures between about 500° C. and about 800° C.

FIGS. 13A and 13B illustrate the formation of gate dielectric layer 86 and gate electrodes 88. Gate dielectric layer 86 is deposited (step 254) conformally in recesses 80, such as on the top surfaces and the sidewalls of fins 64 and on sidewalls of the gate spacers 74, and on a top surface of the ILD 78. In accordance with some embodiments, gate dielectric layer 86 comprises silicon oxide, silicon nitride, or multilayers thereof. In other embodiments, gate dielectric layer 86 comprises a high-k dielectric material, and in these embodiments, gate dielectric layer 86 may have a k value greater than about 7.0, and may include a metal oxide or a silicate of Hf, Al, Zr, La, Mg, Ba, Ti, Pb, and combinations thereof. The formation methods of gate dielectric layer 86 may include Molecular-Beam Deposition (MBD), Atomic Layer Deposition (ALD), Plasma Enhanced Chemical Vapor Deposition (PECVD), and the like. Next, gate electrodes 88 are deposited (step 256) over gate dielectric layer 86, and fills the remaining portions of the recesses 80. Gate electrodes 88 may comprise a metal-containing material such as TiN, TaN, TaC, Co, Ru, Al, combinations thereof, or multi-layers thereof. After the filling of gate electrodes 88, a CMP may be performed to remove the excess portions of gate dielectric layer 86 and the material of gate electrodes 88, which excess portions are over the top surface of ILD 78. The resulting remaining portions of material of gate electrodes 88 and gate dielectric layer 86 thus form replacement gates of the resulting finFETs.

Although not explicitly shown, a person having ordinary skill in the art will readily understand that further processing steps may be performed on the structure in FIGS. 13A and 13B. For example, an etch stop layer may be formed over and adjoining the gates and ILD. Inter-Metal Dielectrics (IMD) and their corresponding metallizations may be formed over the etch stop layer.

Figure 15:
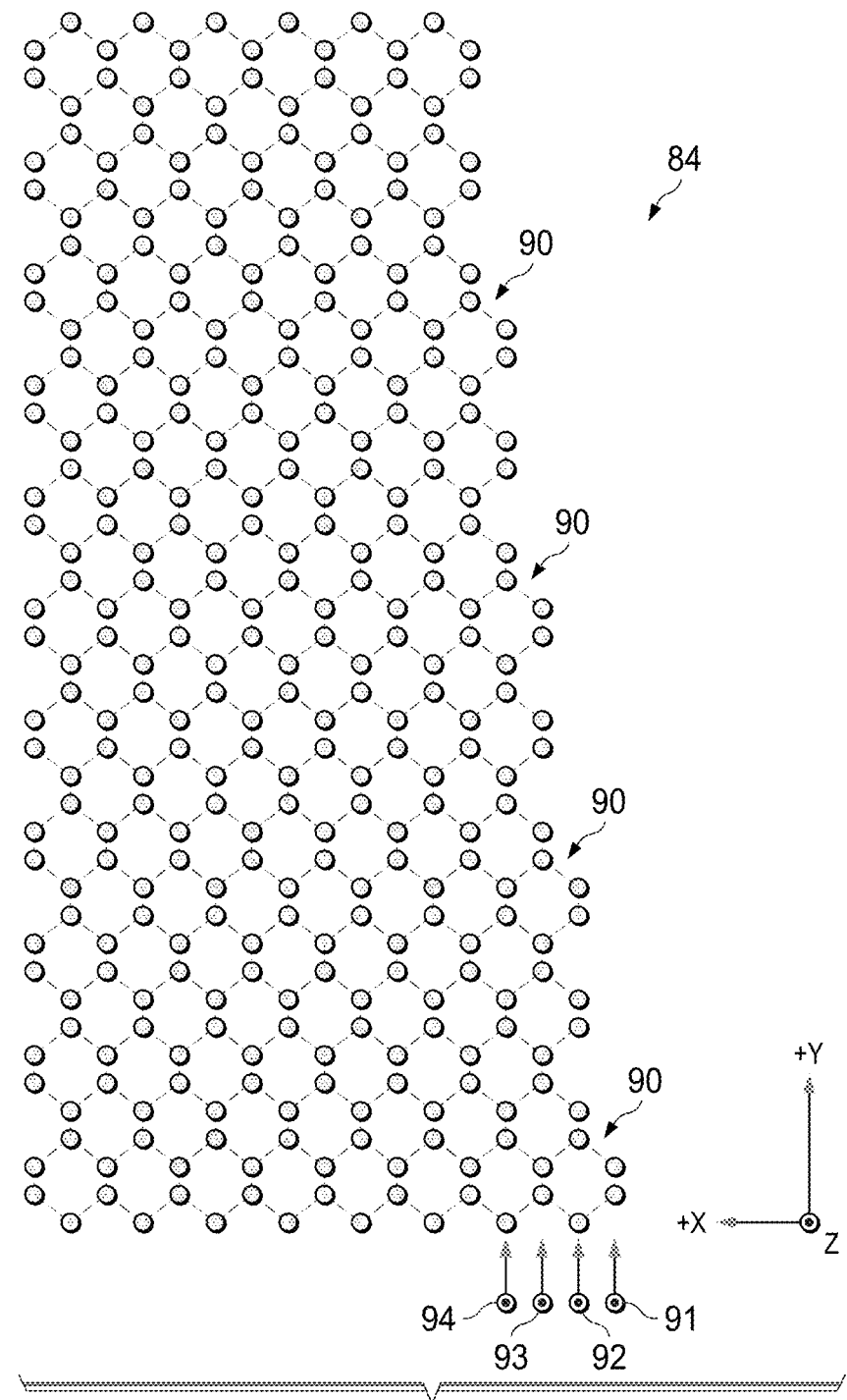
FIG. 15 is a structure of a portion of a sidewall of a fin after re-shaping according to an embodiment.

FIG. 15 illustrates a structure of a major surface portion of a sidewall 84 of a fin 64 after re-shaping. The structure shows the crystalline structure (e.g., dots being atoms and dashed lines being the lattice) of the fin 64, which may include, for example, silicon or germanium. In an embodiment, the major surface portion of the sidewall 84 of the fin 64 is a portion of the sidewall 84 between the substrate 50 and a corner, e.g. a rounded corner, at a top surface of the fin. For ease of reference, FIG. 15 includes axes X, Y, and Z. The substrate 50 is in the negative Y direction from this structure, and a top surface of the substrate 50, e.g., which may include top surfaces of isolation regions 52, is in an X-Z plane.

The structure includes shift locations 90 inward toward a center of the fin 64 (e.g., in the positive X direction) along the sidewall. These shift locations 90 are places along the sidewall 84 where the exterior sidewall surface shifts inward one lattice constant. For example, shift location 90 may shift the exterior sidewall surface from a first Y-Z plane 91 to a second Y-Z plane 92, from the second Y-Z plane 92 to a third Y-Z plane 93, from the third Y-Z plane 93 to a fourth Y-Z plane 94, etc. In other embodiments, the shift may be outward from the fin 64 instead of inward. Further, the sidewall 84 may comprise any combination of inward shifts and outward shifts. The amount of the shifts 90 in the +/−X direction may be at least one lattice constant to several lattice constants, for example, the distance between neighboring pairs of the Y-Z planes 91 through 94 may be at least one lattice constant to several lattice constants. The amount of the shifts 90 in the +/−X direction may be constant between the shifts 90 or may vary between shifts 90. The distance between neighboring shifts 90 in the +/−Y direction may be any distance, such as between 2 atoms and 20 atoms in the lattice. The distances between neighboring shifts 90 in the +/−Y direction may be constant throughout the sidewall 84, e.g., may have a repeating period, or may vary.

Figure 16:
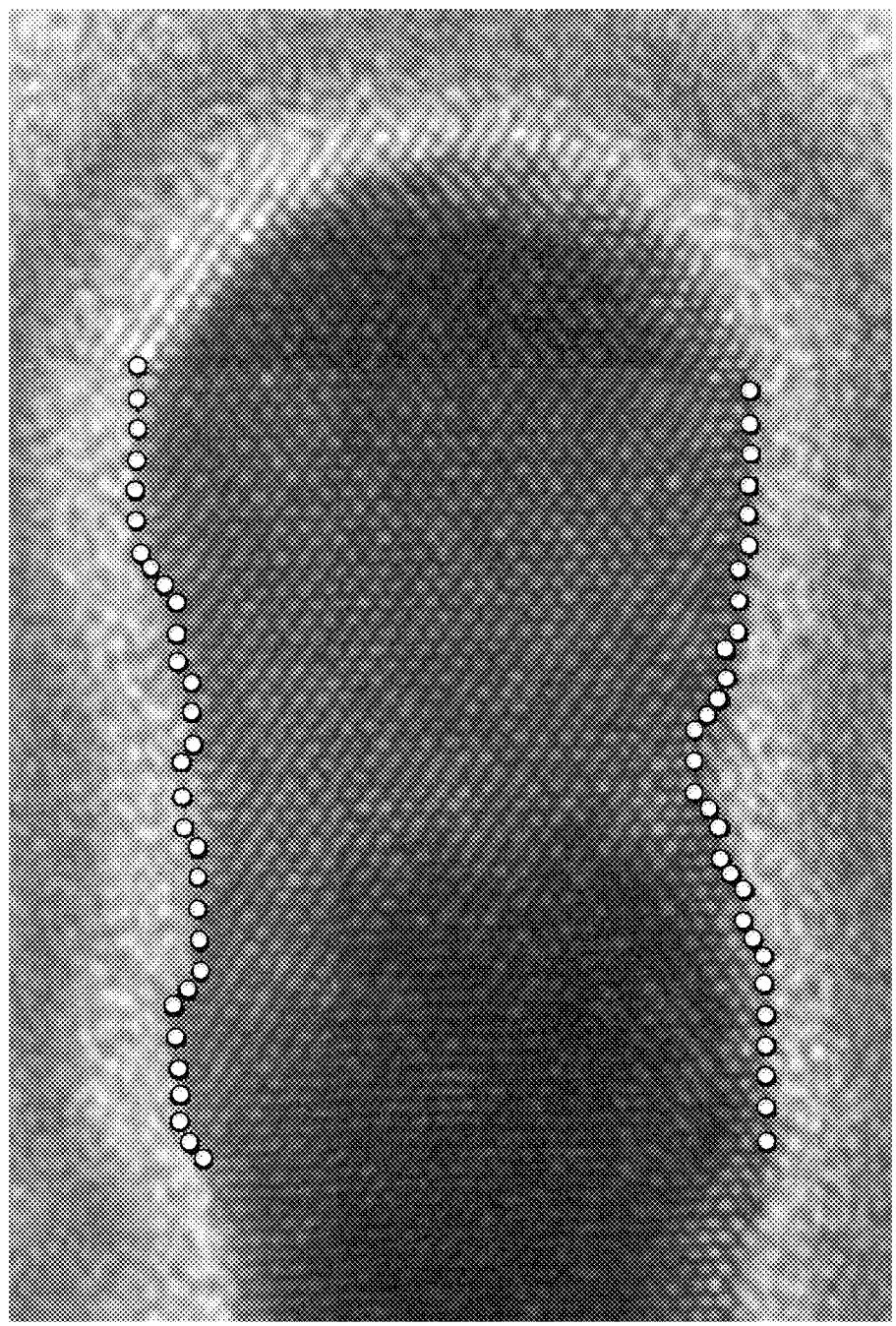
FIG. 16 is a first example of a TEM cross section of a fin that is re-shaped according to an embodiment.

FIG. 16 is a first example of a TEM cross section of a fin that is re-shaped according to an embodiment. Distinct, white markers have been added to the image to delineate atoms in the crystalline structure along the sidewalls of the fins. In this embodiment, each sidewall comprises inward shifts and outward shifts. Further, the distances between shifts vary.

Figure 17:
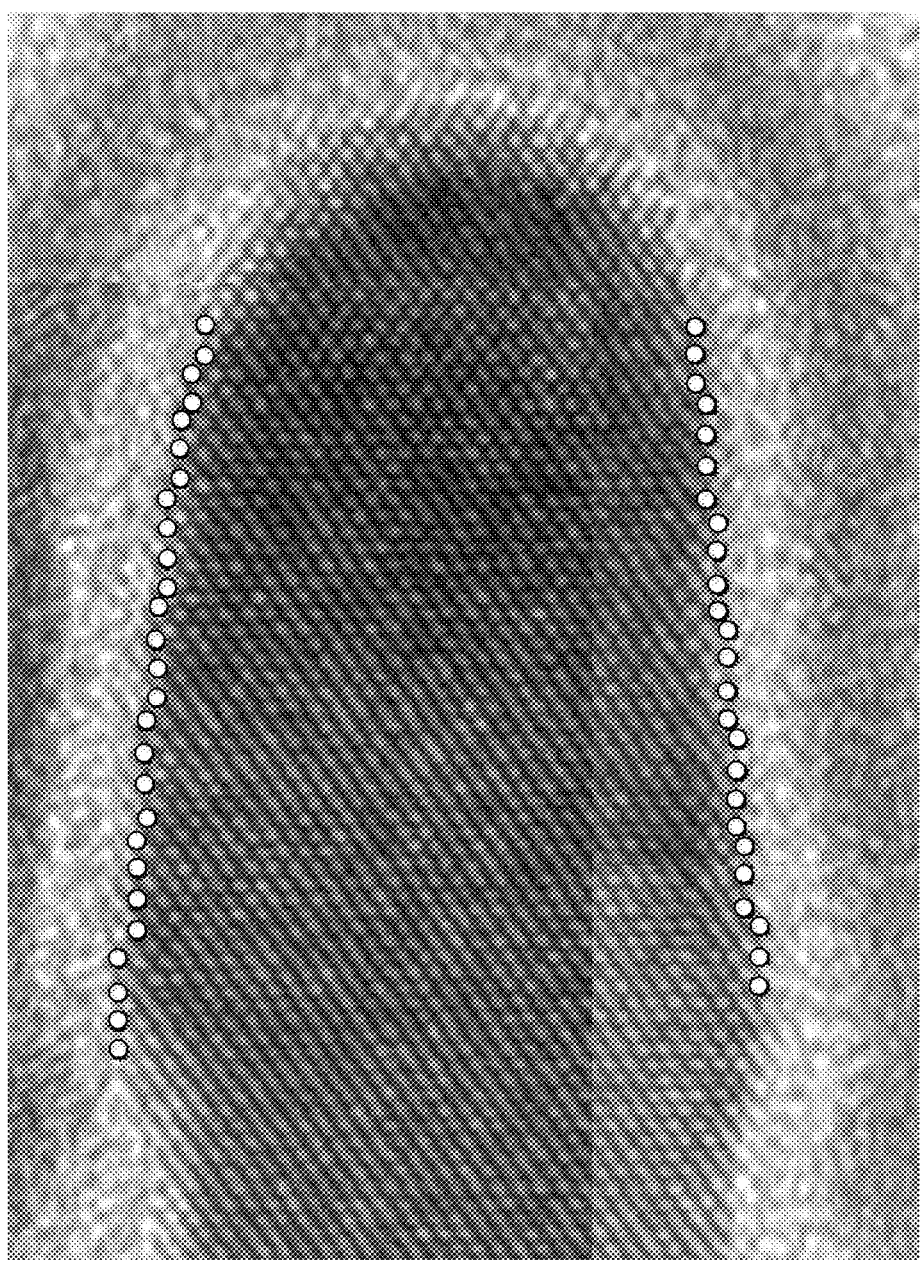
FIG. 17 is a second example of a TEM cross section of a fin that is re-shaped according to an embodiment.

FIG. 17 is a second example of a TEM cross section of a fin that is re-shaped according to an embodiment. As with FIG. 16, distinct, white markers have been added to the image to delineate atoms in the crystalline structure along the sidewalls of the fins. In this embodiment, each sidewall comprises only inward shifts. Further, the distances between shifts vary, although segments of the sidewalls have a repeating distance between shifts (e.g., 4 atoms).

Figure 18:
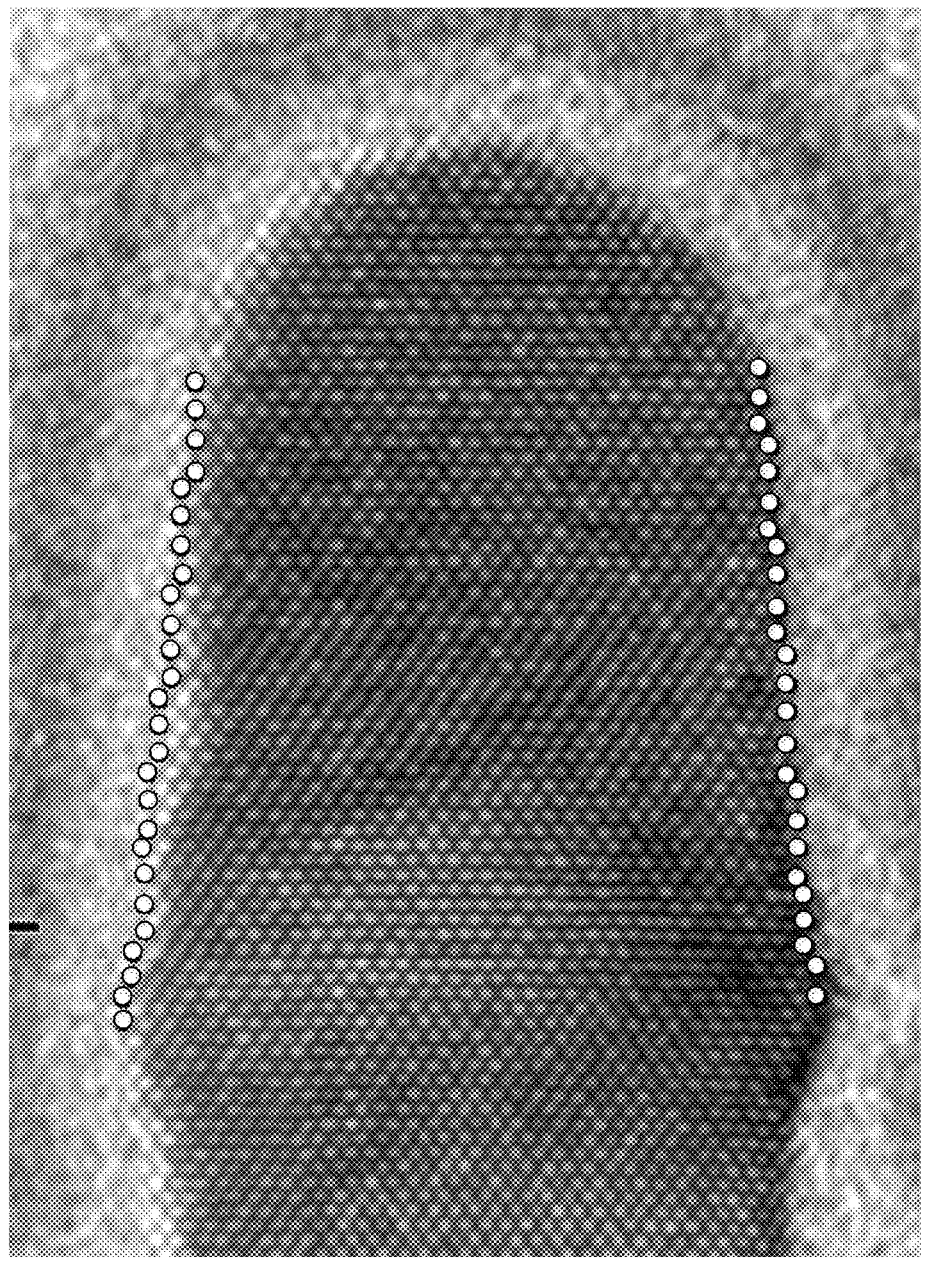
FIG. 18 is a third example of a TEM cross section of a fin that is re-shaped according to an embodiment.
Figure 19:
FIG. 19 is a fourth example of a TEM cross section of a fin that is re-shaped according to an embodiment.

FIGS. 18 and 19 are a third and fourth example, respectively, of TEM cross sections of fins that are re-shaped according to embodiments. As with above, distinct, white markers have been added to the images to delineate atoms in the crystalline structure along the sidewalls of the fins. These examples show other configurations of sidewalls that are contemplated within the scope of various embodiments.

Figure 23A:
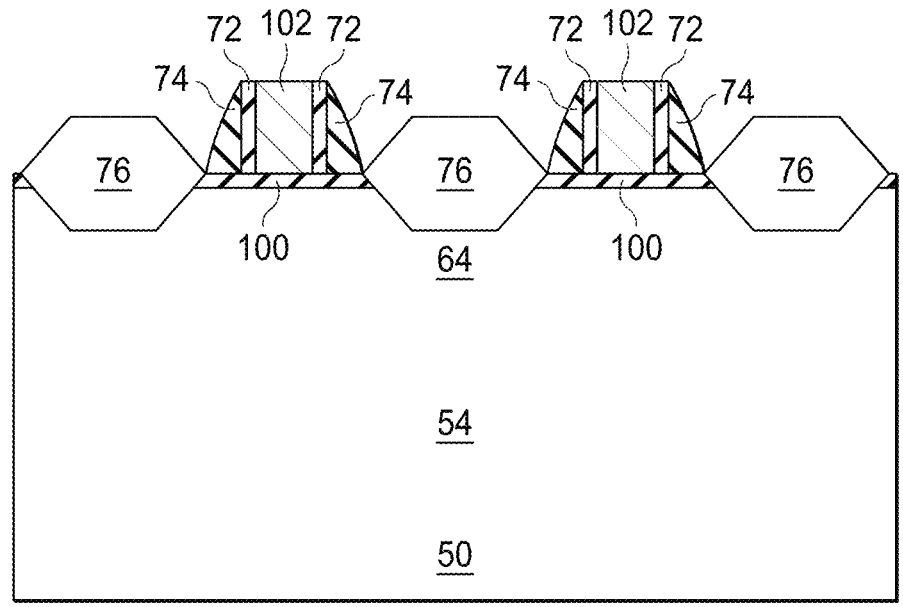
Figure 23B:
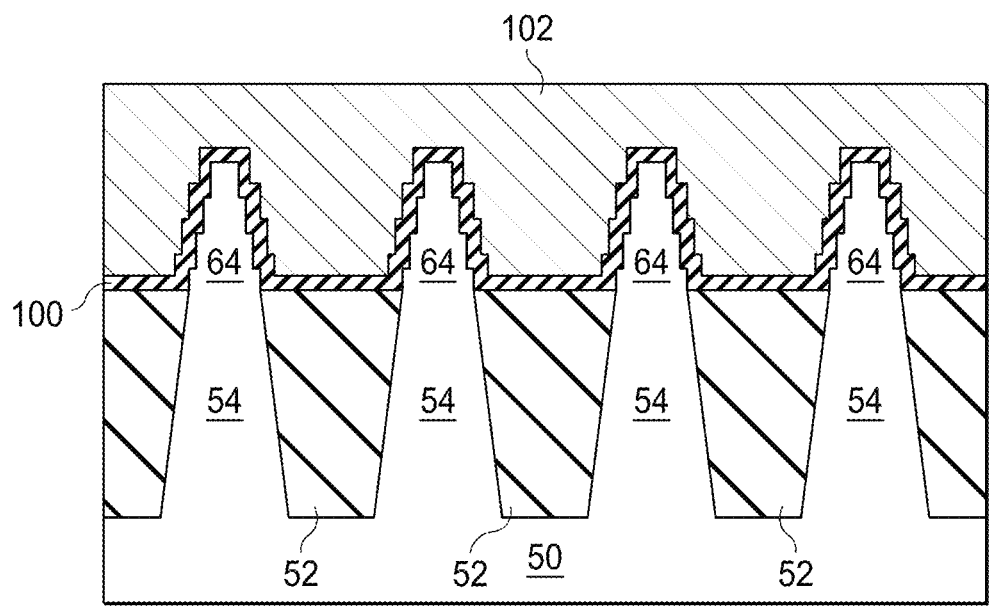
Figure 24A:
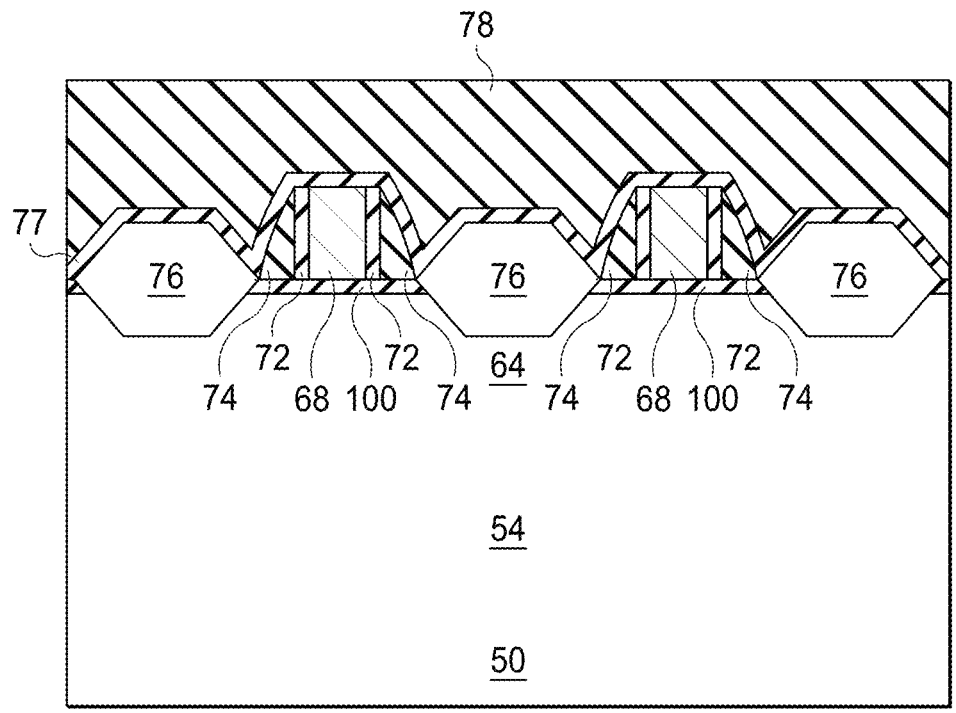
Figure 24B:
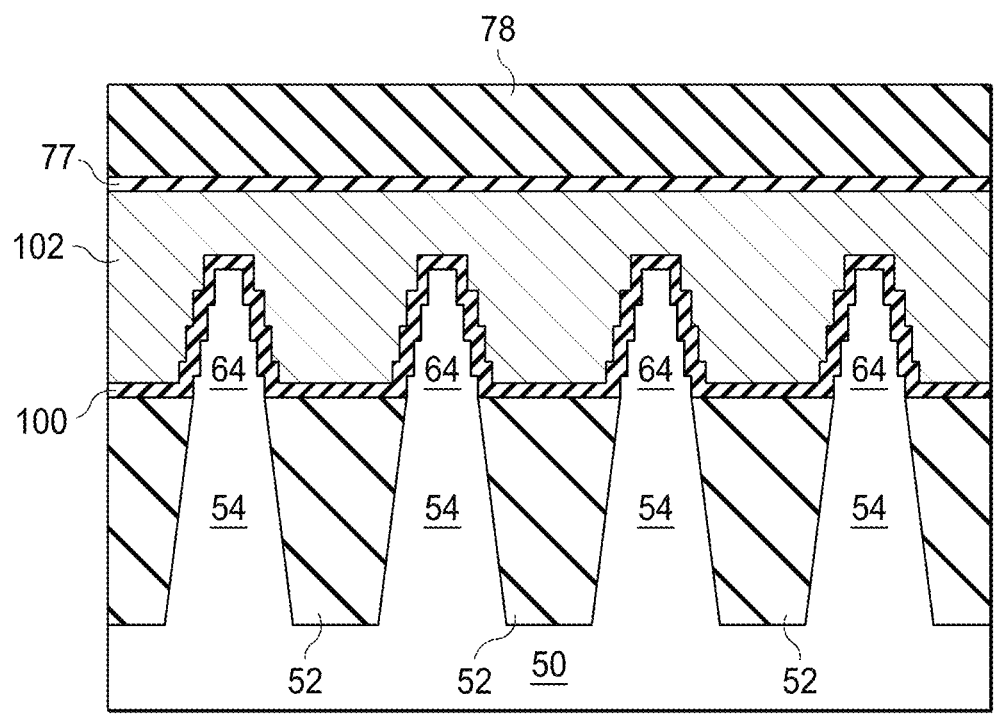
Figure 25:
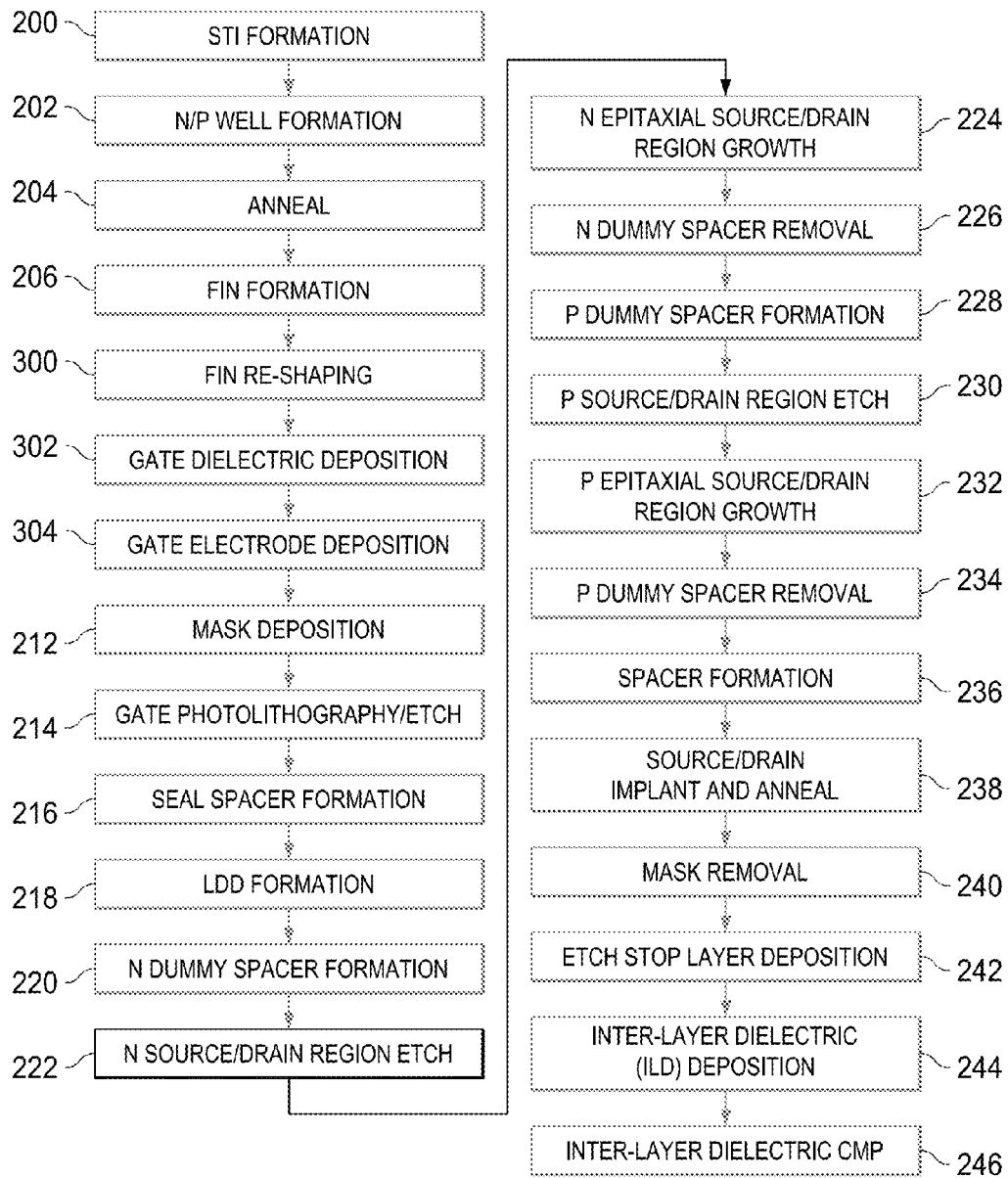
FIG. 25 is a process flow of the process shown in FIGS. 20A through 24B in accordance with another exemplary embodiment.

FIGS. 20A through 24B are cross-sectional views of intermediate stages in the manufacturing of a finFET in accordance with another exemplary embodiment, and FIG. 25 is a process flow of the process shown in FIGS. 20A through 24B. In FIGS. 20A through 24B, figures ending with an "A" designation are illustrated along a similar cross-section A-A as shown in FIG. 1, and figures ending with a "B" designation are illustrated along a similar cross-section B-B as shown in FIG. 1. The process proceeds through FIGS. 2 through 5 (steps 200 through 206) as previously discussed.

Figure 20A:
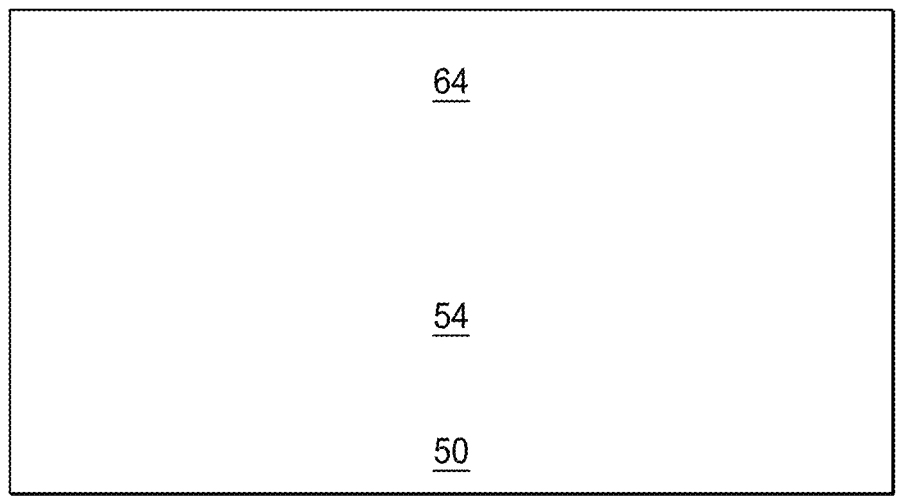
FIGS. 20A, 20B, 21A, 21B, 22A, 22B, 23A, 23B, 24A, and 24B are cross-sectional views of intermediate stages in the manufacturing of a finFET in accordance with another exemplary embodiment.
Figure 20B:
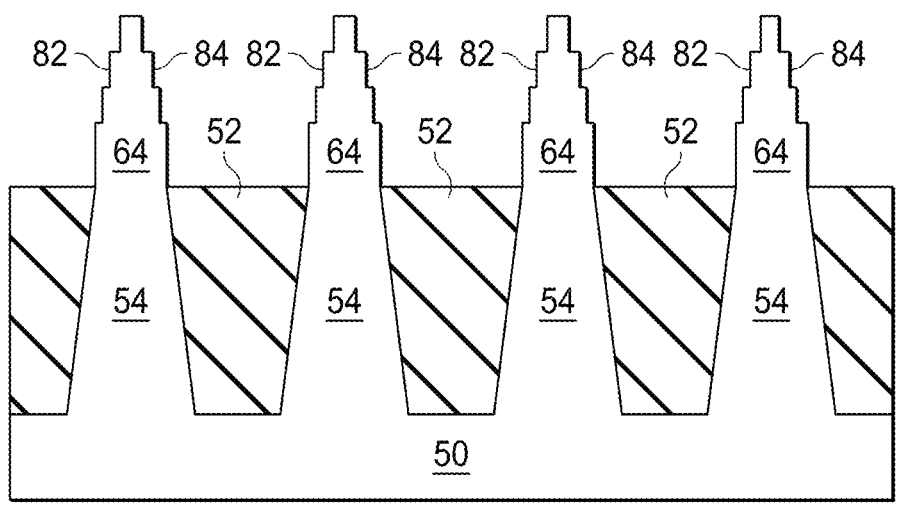

In FIGS. 20A and 20B, the fins 64 are re-shaped (step 300), as in FIGS. 12A and 12B. However, in this embodiment, because the whole of each fin 64 is exposed to the re-shaping process, the entire fin 64 may be re-shaped.

Figure 21A:
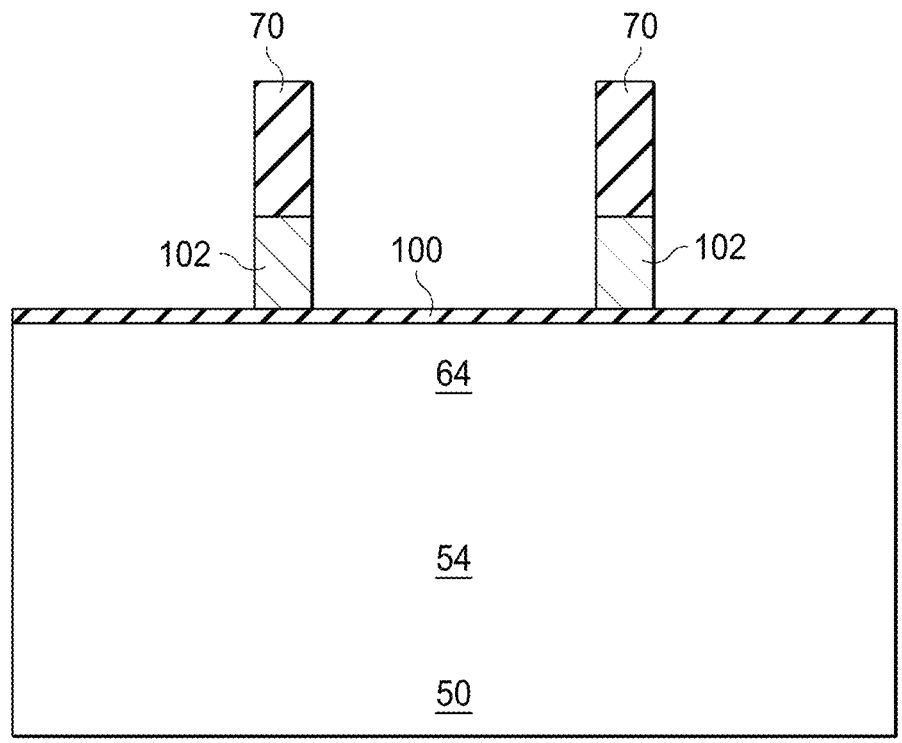
Figure 21B:
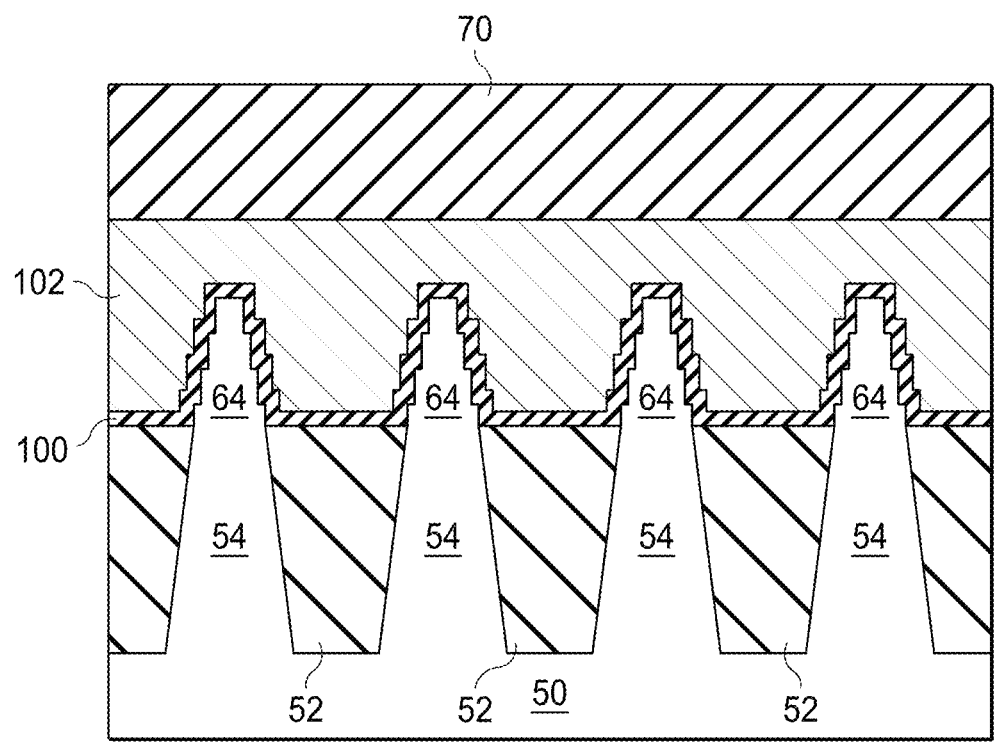

In FIGS. 21A and 21B, a gate dielectric layer 100 is deposited (step 302) on the fins 64. The gate dielectric layer 100 may be, for example, any of the materials and formed as previously discussed for gate dielectric layer 86 with respect to FIGS. 13A and 13B. A material of gate electrodes 102 is deposited (step 304) over the gate dielectric layer 100, and a material of masks 70 is deposited (step 212) over the material of gate electrodes 102. A material of the gate electrodes 102 may be deposited over the gate dielectric layer 100 and then planarized, such as by a CMP. A material of the masks 70 may be deposited over the layer of the gate electrodes 102. The material of the masks 70 then may be patterned using acceptable photolithography and etching techniques. The pattern of the masks 70 then may be transferred to the material of the gate electrodes 102 by an acceptable etching technique. These photolithography and etching techniques may form the gate electrodes 102 and masks 70 (step 214). Gate electrodes 102 may be formed of, for example, polysilicon, any material previously discussed with respect to gate electrodes 88 in FIGS. 13A and 13B, or the like. The gate electrodes 102 cover respective channel regions of the fin 64. The gate electrodes 102 may also have a lengthwise direction substantially perpendicular to the lengthwise direction of respective fins 64.

Figure 22A:
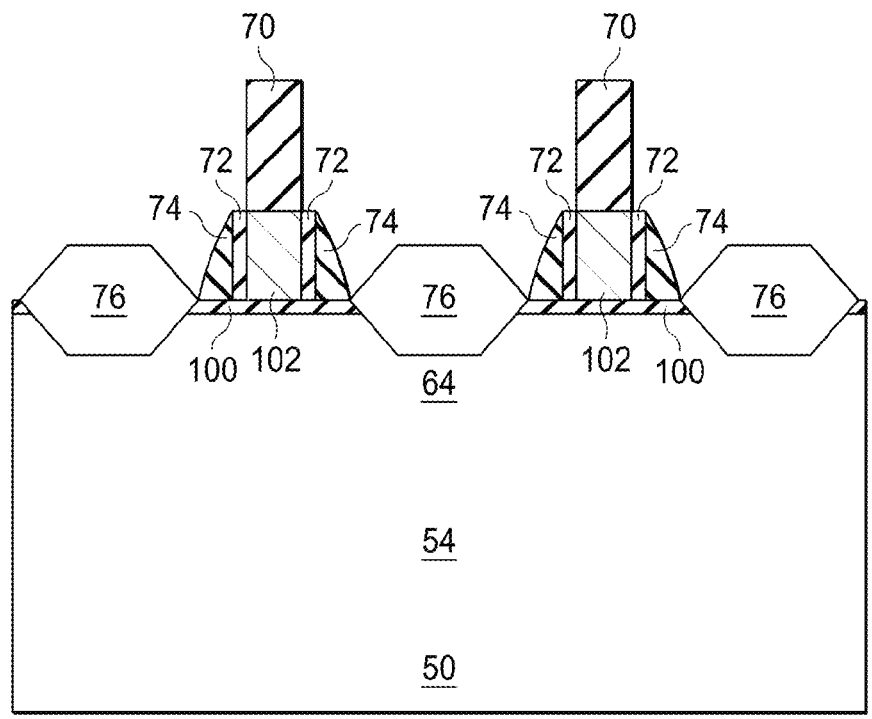
Figure 22B:
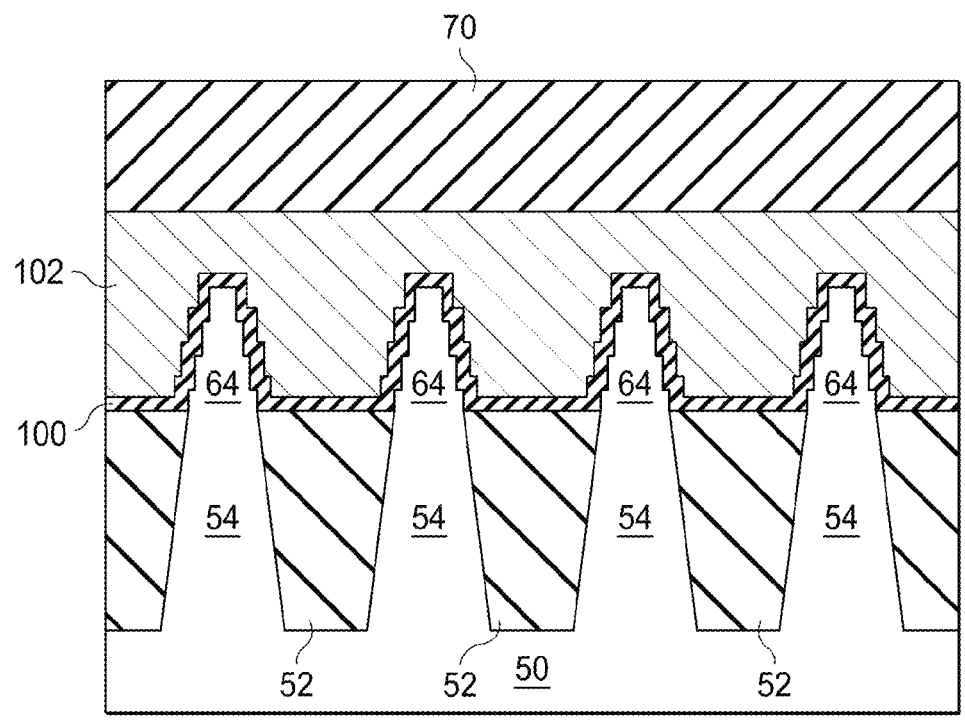

With reference to FIGS. 22A and 22B, the components therein identified are the same as or similar to similarly numbered components in FIGS. 7A and 7B, and the components in FIGS. 22A and 22B may be formed in the same or similar manner (steps 216 through 238) as discussed with respect to FIGS. 7A and 7B. Any necessary modification would be readily understood by a person having ordinary skill in the art, and thus, explicit discussion here is omitted for brevity.

In FIGS. 23A and 23B, the mask 70 is removed (step 240), similar to what was discussed in FIGS. 8A and 8B.

In FIGS. 24A and 24B, an etch stop layer 77 and ILD 78 are formed (steps 242 and 244) similar to what is discussed in FIGS. 9A and 9B. After the ILD 78 is deposited, the ILD 78 may undergo a CMP (step 246), and a portion of the ILD 78 may remain directly over the gate electrodes 102.

Figure 31A:
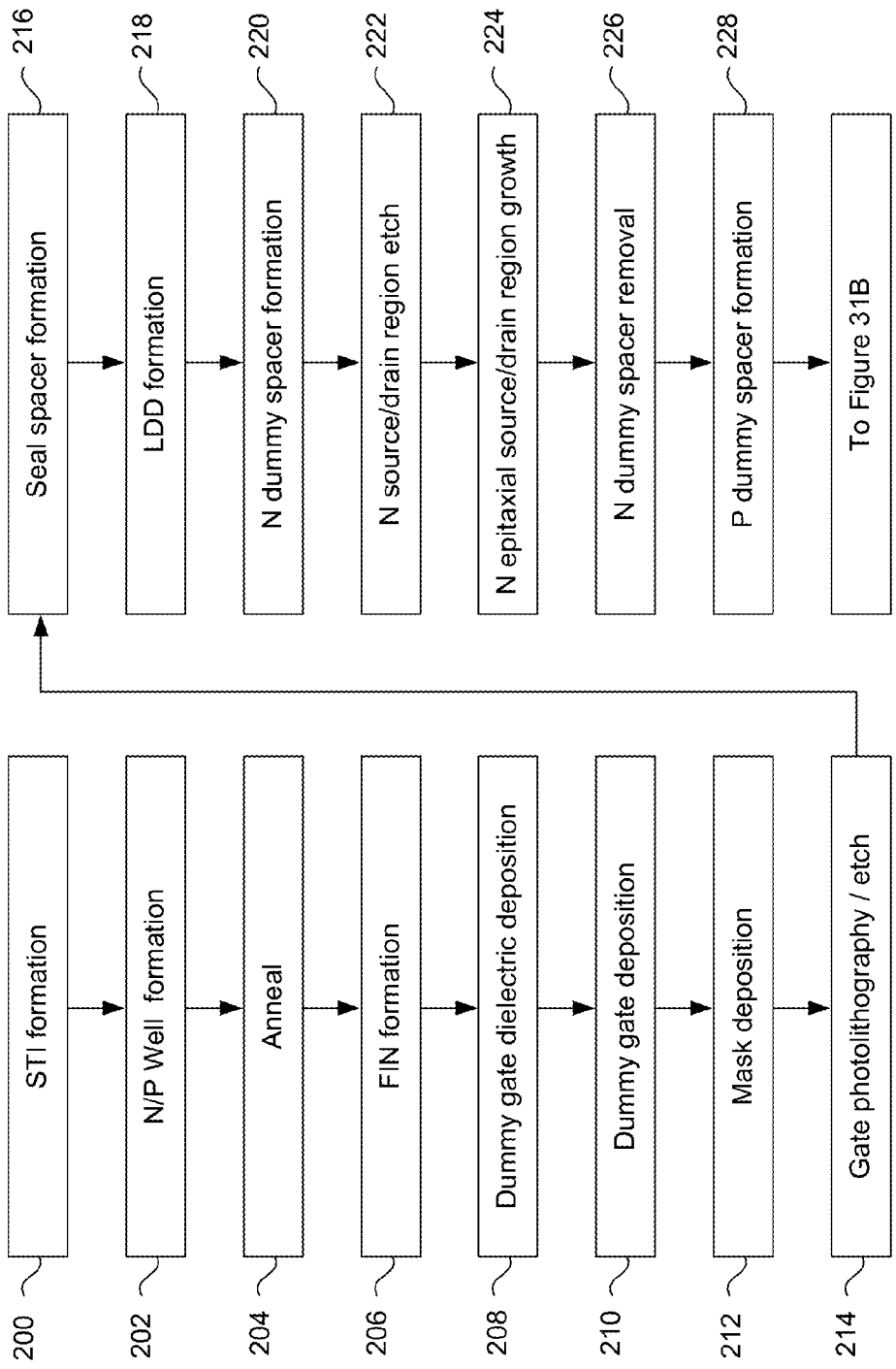
FIGS. 31A and 31B are a process flow of the process shown in FIGS. 26A through 30B in accordance with an exemplary embodiment.
Figure 31B:
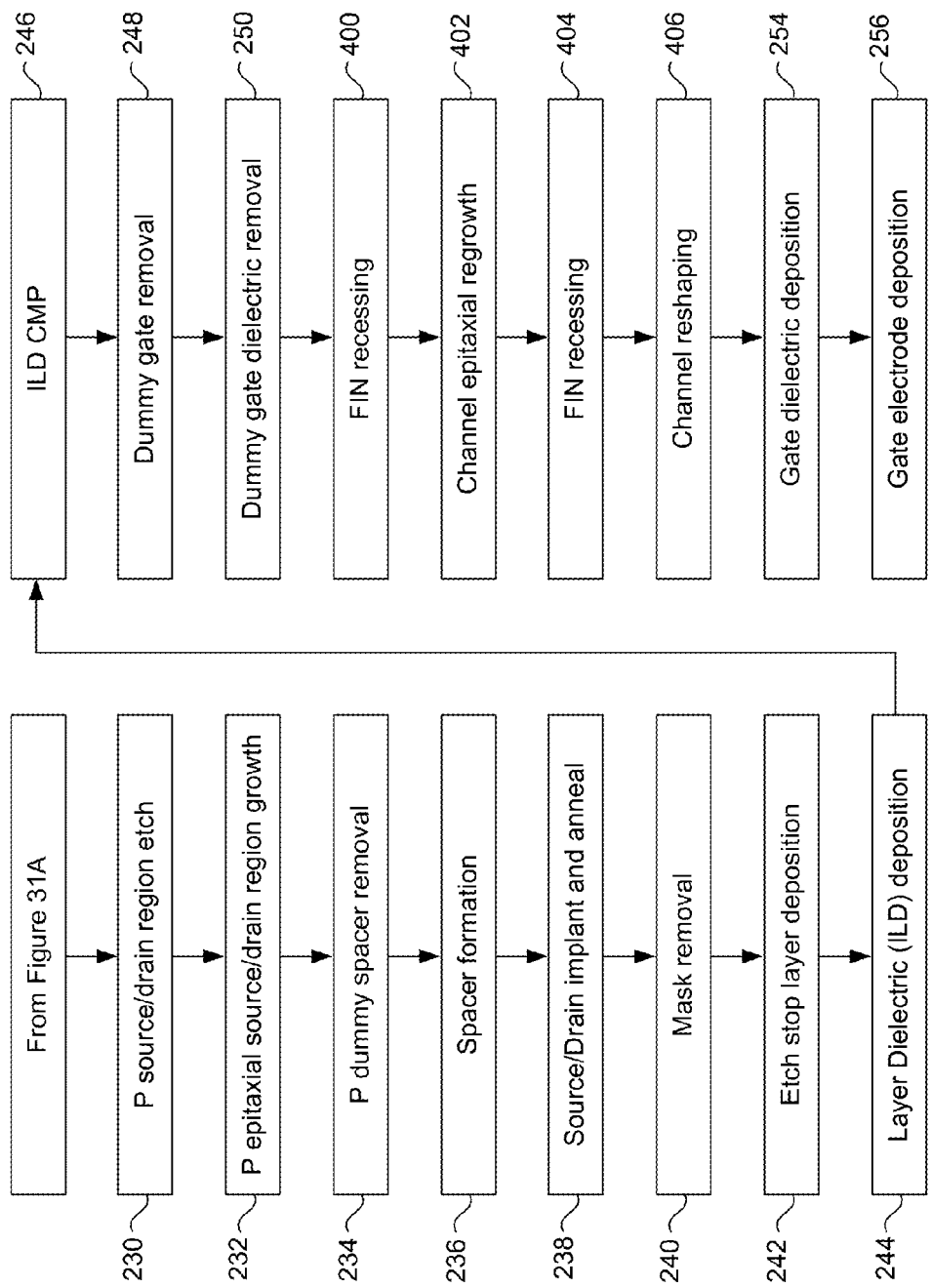

FIGS. 26A through 30B are cross-sectional views of intermediate stages in the manufacturing of a finFET in accordance with another exemplary embodiment, and FIGS. 31A and 31B are a process flow of the process shown in FIGS. 26A through 30B. In FIGS. 26A through 30B, figures ending with an "A" designation are illustrated along a similar cross-section A-A, and figures ending with a "B" designation are illustrated along a similar cross-section B-B. The process proceeds through FIGS. 2 through 10A and 10B (steps 200 through 246) as previously discussed.

Next, referring to FIGS. 26A and 26B, the dummy gates 68, gate seal spacers 72, portions of the dummy gate dielectric layer 66 directly underlying the dummy gates 68, and a portion of the fin 64 are removed in an etching step(s), so that recesses 110 are formed. At least a portion of each recess 110 is in a region where a channel region of a respective fin 64 will be formed. Each channel region is disposed between neighboring pairs of epitaxial source/drain regions 76. During the removal, the dummy gate dielectric layer 66 may be used as an etch stop layer when the dummy gates 68 are etched (step 248). The dummy gate dielectric layer 66 and gate seal spacers 72 may then be removed (step 250) after the removal of the dummy gates 68. Then, a wet and/or dry etch may be used to recess the fin (step 400). The etch can form a top surface of the fin 64 in the recess 110 to have any configuration. For example, a wet ammonium hydroxide ($NH_4OH$) etch can form the V-shaped surface illustrated in FIG. 26B. In other embodiments, a dry plasma etch can be used to form a flat surface.

Referring to FIGS. 27A and 27B, epitaxial channel regrowth regions 112 are formed in the recesses 110 (step 402). The epitaxial channel regrowth regions 112 can comprise silicon, silicon germanium ($Si_xGe_{1-x}$, where x can be between approximately 0 and 100), silicon carbide, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. The epitaxial channel regrowth regions 112 can be formed using metal-organic CVD (MOCVD), molecular beam epitaxy (MBE), liquid phase epitaxy (LPE), vapor phase epitaxy (VPE), selective epitaxial growth (SEG), the like, or a combination thereof.

Referring to FIGS. 28A and 28B, the fins 64 exposed by the recesses 110 are recessed further (step 404). The recessing forms a void 114 between an epitaxial channel regrowth region 112 and its respective fin 64 that is exposed by the recess 110. The recessing may be performed by using an acceptable etch, for example, an etch that is isotropic and selective to a material of the fin 64. For example, in an embodiment where the fin 64 is silicon and the epitaxial channel regrowth region 112 is SiGe or a III-V compound, a wet hot ammonium hydroxide etch may be used to selectively etch the silicon of the fin 64.

Referring to FIGS. 29A and 29B, the epitaxial channel regrowth regions 112 are reshaped (step 406). In some embodiments, the epitaxial channel regrowth regions 112 are reshaped by performing an etch. In some embodiments, the reshaping uses a wet etch. A wet etch may comprise an immersion in a solution comprising an etching species. The etching species can comprise HCl and ammonium hydroxide for etching silicon epitaxial channel regrowth regions 112, for example, or APM or TMAH for etching SiGe epitaxial channel regrowth regions 112. The etching species can have a concentration between about 1 percent and about 10 percent in the solution. The wet etch can include immersion in the solution from about 10 seconds to about 500 seconds and can be at a temperature of about 20° C. to about 70° C. In some embodiments, by varying the relative concentration of HCl to ammonium hydroxide and/or by controlling the time of the etch, a desired surface orientation of the epitaxial channel regrowth region 112 may be achieved. For example, a ratio of HCl to ammonium hydroxide may be from about 2:1 to about 6:1. In other embodiments, the etching species can comprise an APM, dHF, a combination thereof, or the like. In other embodiments, another appropriate etch may be used, such as a dry etch or a combination of a dry and wet etch. A dry etch may comprise a plasma process, such as ICP, TCP, ECR, RIE, the like, or a combination thereof. The plasma process may use reaction gases including a fluorine-based gas (such as $SF_6$, $CH_2F_2$, $CH_3F$, $CHF_3$, or the like), chloride ($Cl_2$), hydrogen bromide (HBr), oxygen ($O_2$), the like, or a combination thereof. The plasma process may use a pressure between about 3 mTorr and about 100 mTorr, use a power of about 300 W to about 1000 W, and may use a frequency of about 2 kHz to about 13.6 MHz. In even further embodiments, an anneal may be used. An anneal may comprise heating at a temperature greater than or equal to 500° C. for about a few milliseconds, such as for a high temperature anneal at temperatures between about 800° C. and about 1200° C., to about 12 hours, such as for a lower temperature anneal at temperatures between about 500° C. and about 800° C. The exterior surfaces of the epitaxial channel regrowth regions 112 may have any desired surface orientation, some of which are discussed in detail below.

Referring to FIGS. 30A and 30B, gate dielectric layers 86 and gate electrodes 88 are formed as discussed with respect to FIGS. 13A and 13B (steps 254 and 256). As illustrated, the gate dielectric layers 86 and gate electrodes 88 are formed in the voids 114 formed by recessing the fin 64. This allows the gate dielectric layers 86 and gate electrodes 88 to substantially wrap around the epitaxial channel regrowth regions 112, such that the formed finFETs can be referred to as gate all-around channel devices.

Although not explicitly shown, a person having ordinary skill in the art will readily understand that further processing steps may be performed on the structure in FIGS. 30A and 30B. For example, an etch stop layer may be formed over and adjoining the gates and ILD. IMDs and their corresponding metallizations may be formed over the etch stop layer.

FIG. 32 illustrates a cross section view of an epitaxial channel regrowth region after re-shaping. This cross section corresponds to the cross section illustrated in FIG. 29B. The structure shows the crystalline structure (e.g., dots being atoms and dashed lines being the lattice) of the epitaxial channel regrowth region, which may include, for example, silicon, germanium, a group III element, a group V element, or the like. The material may consist essentially of silicon (doped or undoped), or it may consist essentially of germanium (doped or undoped). In some embodiments, the material is SiGe, where silicon and germanium are distributed randomly throughout the material. In some embodiments, the material is a III-V compound such that a group III element and a group V element are each distributed regularly throughout the material. For ease of reference, FIG. 32 includes axes X, Y, and Z. The substrate 50 is in the negative Y direction from this structure, and a top surface of the substrate 50, e.g., which may include top surfaces of isolation regions 52, is in an X-Z plane.

The structure includes shift locations 90a inward toward a center of the epitaxial channel regrowth region (e.g., in the positive X direction) along a sidewall as the sidewall is traversed upwardly (e.g., in a positive Y direction). The structure also includes shift locations 90b outward from a center of the epitaxial channel regrowth region (e.g., in the negative X direction) along a sidewall as the sidewall is traversed upwardly (e.g., in a positive Y direction). These shift locations 90a and 90b are places along a sidewall where the exterior sidewall surface shifts inward or outward one or more lattice constant. For example, shift location 90a and 90b may shift the exterior sidewall surface from a first Y-Z plane 91 to a second Y-Z plane 92, from the second Y-Z plane 92 to a third Y-Z plane 93, from the third Y-Z plane 93 to a fourth Y-Z plane 94, etc. or vice versa. Sidewalls may comprise any combination of inward shifts and outward shifts. The amount of the shifts 90a and 90b in the +/−X direction may be at least one lattice constant to several lattice constants, for example, the distance between neighboring pairs of the Y-Z planes 91 through 94 may be at least one lattice constant to several lattice constants. The amount of the shifts 90a and 90b in the +/−X direction may be constant between the shifts 90a and 90b or may vary between shifts 90a and 90b. The distance between neighboring shifts 90a and 90b in the +/−Y direction may be any distance, such as between 2 atoms and 20 atoms in the lattice. The distances between neighboring shifts 90a and 90b in the +/−Y direction may be constant throughout the sidewall, e.g., may have a repeating period, or may vary. Other aspects are described with respect to later figures.

Figure 37A:
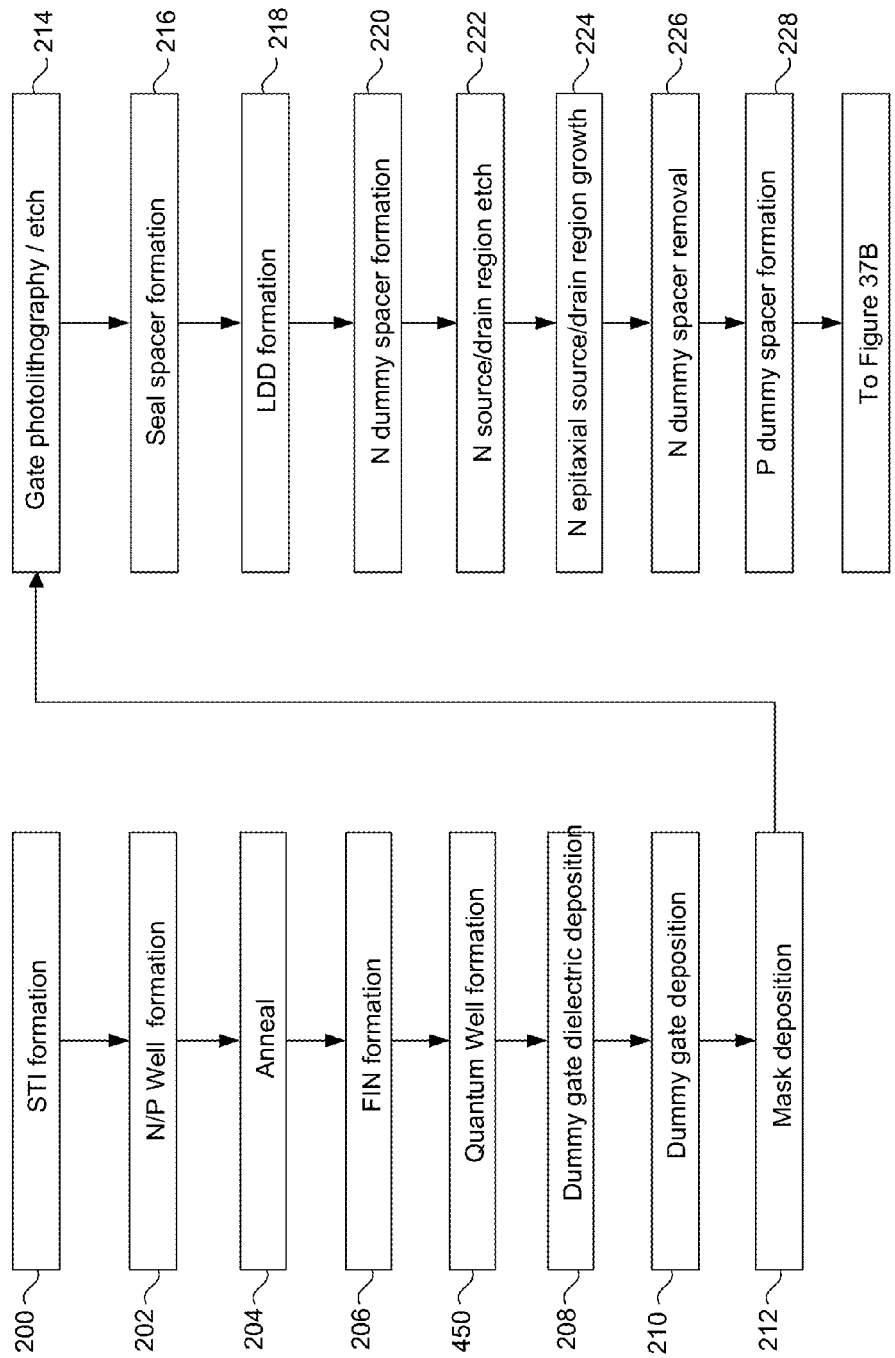
FIGS. 37A and 37B are a process flow of the process shown in FIGS. 33 through 36B in accordance with an embodiment.
Figure 37B:
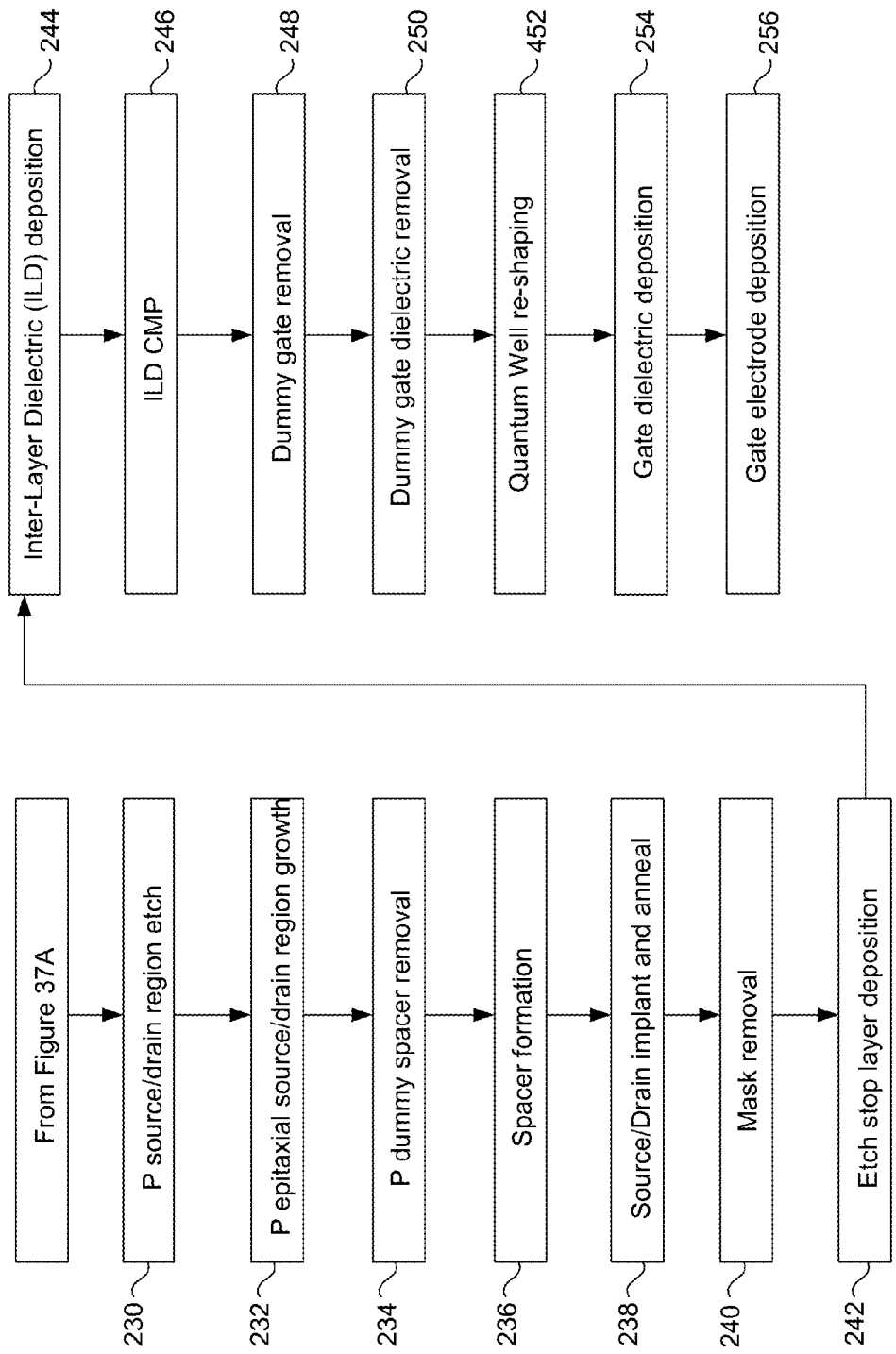

FIGS. 33 through 36B are cross-sectional views of intermediate stages in the manufacturing of a finFET in accordance with another exemplary embodiment, and FIGS. 37A and 37B are a process flow of the process shown in FIGS. 33 through 36B. In FIGS. 34A through 36B, figures ending with an "A" designation are illustrated along a similar cross-section A-A, and figures ending with a "B" designation are illustrated along a similar cross-section B-B. The process proceeds through FIGS. 2 through 5 (steps 200 through 206) as previously discussed.

Figure 33:
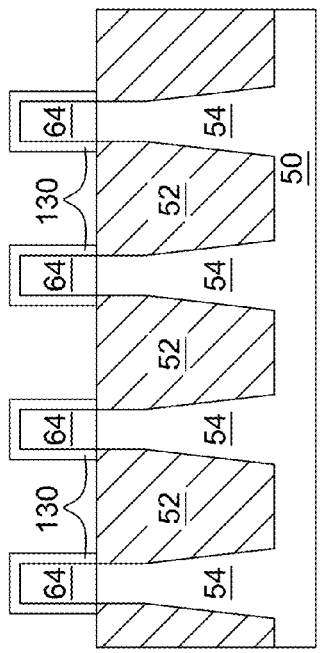

Then, referring to FIG. 33, quantum wells 130 are formed on the fins 64 (step 450). The quantum wells 130 can comprise silicon, silicon germanium (SixGe1-x, where x can be between approximately 0 and 100), silicon carbide, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. The quantum wells 130 can be formed using MOCVD, MBE, LPE, VPE, SEG, the like, or a combination thereof. For example, each of the quantum wells 130 can comprise a first SiGe layer epitaxially grown on a silicon fin 64, a silicon layer epitaxially grown on the first SiGe layer, and a second SiGe layer epitaxially grown on the silicon layer. Materials may be selected as appropriate for a p-type device and an n-type device, for example. The quantum wells 130 may be doped appropriately by in situ doping during growth and/or implantation.

Figure 34A:
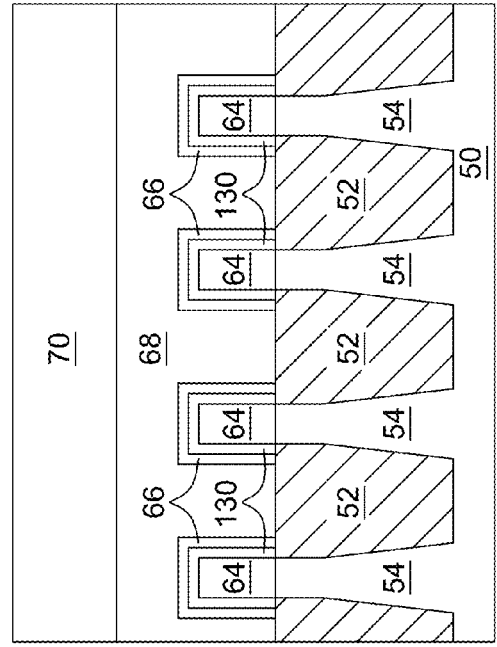
Figure 34B:
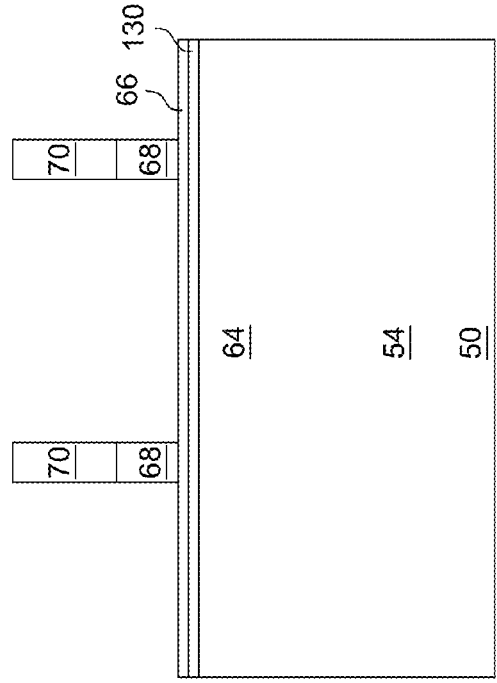

Referring to FIGS. 34A and 34B, a dummy gate dielectric layer 66 is formed (step 208) on the quantum wells 130, similar to discussed above with respect to FIGS. 6A and 6B. Processing continues as discussed above with respect to FIGS. 7A through 10B (steps 210 through 250).

Referring to FIGS. 35A and 35B, the quantum wells 130 are reshaped (step 452). In some embodiments, the quantum wells 130 are reshaped by performing an etch. In some embodiments, the reshaping uses a wet etch. A wet etch may comprise an immersion in a solution comprising an etching species. The etching species can comprise HCl and ammonium hydroxide for etching silicon in the quantum wells 130, for example, or APM or TMAH for SiGe in the quantum wells 130, for example. The etching species can have a concentration between about 1 percent and about 10 percent in the solution. The wet etch can include immersion in the solution from about 10 seconds to about 500 seconds and can be at a temperature of about 20° C. to about 70° C. In some embodiments, by varying the relative concentration of HCl to ammonium hydroxide and/or by controlling the time of the etch, a desired surface orientation of the quantum wells 130 may be achieved. For example, a ratio of HCl to ammonium hydroxide may be from about 2:1 to about 6:1. In other embodiments, the etching species can comprise an APM, dHF, a combination thereof, or the like. In other embodiments, another appropriate etch may be used, such as a dry etch or a combination of a dry and wet etch. A dry etch may comprise a plasma process, such as ICP, TCP, ECR, RIE, the like, or a combination thereof. The plasma process may use reaction gases including a fluorine-based gas (such as $SF_6$, $CH_2F_2$, $CH_3F$, $CHF_3$, or the like), chloride ($Cl_2$), hydrogen bromide (HBr), oxygen ($O_2$), the like, or a combination thereof. The plasma process may use a pressure between about 3 mTorr and about 100 mTorr, use a power of about 300 W to about 1000 W, and may use a frequency of about 2 kHz to about 13.6 MHz. In even further embodiments, an anneal may be used. An anneal may comprise heating at a temperature greater than or equal to 500° C. for about a few milliseconds, such as for a high temperature anneal at temperatures between about 800° C. and about 1200° C., to about 12 hours, such as for a lower temperature anneal at temperatures between about 500° C. and about 800° C. The exterior surfaces of the quantum wells 130 may have any desired surface orientation, some of which are discussed with regard to FIG. 15 and in further detail below. Further, the reshaping in some embodiments only etches the outermost layer of the quantum well, such as the second SiGe layer provided in the example above.

Referring to FIGS. 36A and 36B, gate dielectric layers 86 and gate electrodes 88 are formed as discussed with respect to FIGS. 13A and 13B (steps 254 and 256).

Although not explicitly shown, a person having ordinary skill in the art will readily understand that further processing steps may be performed on the structure in FIGS. 36A and 36B. For example, an etch stop layer may be formed over and adjoining the gates and ILD. IMDs and their corresponding metallizations may be formed over the etch stop layer.

Figure 60:
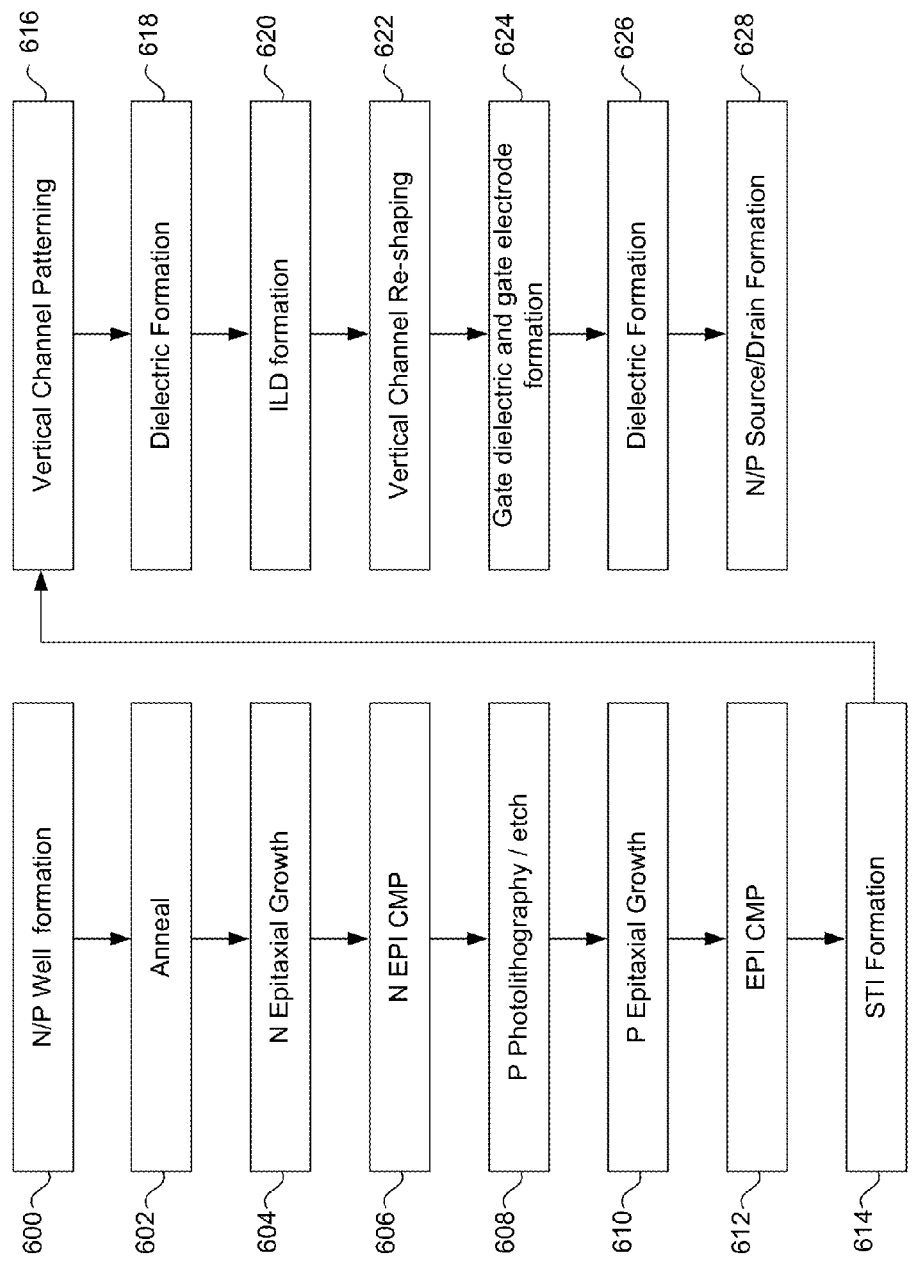
FIG. 60 is a process flow of the process shown in FIGS. 38 through 56 in accordance with an embodiment.

FIGS. 38 through 56 are cross-sectional views of intermediate stages in the manufacturing of a FET, such as a VCFET, in accordance with another exemplary embodiment. FIGS. 57A, 57B, 58, and 59 are views for aspects of a VCFET in accordance with the manufacturing method. FIG. 60 is a process flow of the process shown in FIGS. 38 through 56.

Referring to FIG. 38, a substrate 500 is provided with a first region 502, e.g., a PMOS region, and a second region 504, e.g., an NMOS region. The substrate 500 may be a part of a wafer. The substrate 500 may be a semiconductor substrate, which may further be a silicon substrate, a silicon carbon substrate, a silicon germanium substrate, or a substrate formed of other semiconductor materials. The substrate 500 may be a bulk substrate, a semiconductor-on-insulator (SOI) substrate, or other acceptable substrates. The substrate 500 may be lightly doped with a p-type or an n-type impurity. The substrate 500 may undergo various processing, as one of ordinary skill in the art will readily understand. For example, an alignment mark may be etched into the substrate 500, a hardmask may be deposited and patterned over the alignment mark, and the substrate 500 may be recessed in the first region 502 and the second region 504.

An N well 506 is formed in the first region 502, and a P well 508 is formed in the second region 504 (step 600). In an example, a first photoresist is formed over the substrate 500. The first photoresist is patterned to expose the first region 502, e.g., the PMOS region, of the substrate 500. The first photoresist can be formed by using a spin-on technique and can be patterned using acceptable photolithography techniques. Once the first photoresist is patterned, an n-type impurity implant is performed in the first region 502, and the first photoresist may act as a mask to substantially prevent n-type impurities from being implanted into the second region 504, e.g., the NMOS region. The n-type impurities implanted to form the N well 506 may be phosphorus, arsenic, or the like implanted in the first region to a concentration of equal to or less than $10^{18}$ cm$^{-3}$, such as between about $10^{17}$ cm$^{-3}$ and about $10^{18}$ cm$^3$. After the implant, the first photoresist may be removed, such as by an acceptable ashing process. Then, a second photoresist is formed over the substrate 500. The second photoresist is patterned to expose the second region 504 of the substrate 500. The second photoresist can be formed by using a spin-on technique and can be patterned using acceptable photolithography techniques. Once the second photoresist is patterned, a p-type impurity implant is performed in the second region 504, and the second photoresist may act as a mask to substantially prevent p-type impurities from being implanted into the first region 502. The p-type impurities implanted to form the P well 508 may be boron, BF$_2$, or the like implanted in the first region 502 to a concentration of equal to or less than $10^{18}$ cm$^{-3}$, such as between about $10^{17}$ cm$^{-3}$ and about $10^{18}$ cm$^3$. After the implant 62, the second photoresist 60 may be removed, such as by an acceptable ashing process.

After the implants, an anneal may be performed (step 602) to activate the p-type and n-type impurities that were implanted. The implantations may form the N well 506 in the first region 502 and the P well 508 in the second region 504.

Referring to FIG. 39, materials for vertical channel transistors in the second region 504, e.g., the NMOS region, of the substrate 500 are epitaxially grown on the substrate 500 (step 604). An epitaxial source/drain layer 510 is epitaxially grown on the substrate 500. An epitaxial channel layer 512 is epitaxially grown on the epitaxial source/drain layer 510. An epitaxial source/drain layer 514 is epitaxially grown on the epitaxial channel layer 512. The layers 510, 512, and 514 may be epitaxially grown using MOCVD, MBE, LPE, VPE, SEG, the like, or a combination thereof. The layer 510, 512, and 514 may comprise silicon, silicon germanium, silicon carbide, pure germanium, a III-V compound semiconductor, a II-VI compound semiconductor, or the like. In an example, the epitaxial source/drain layers 510 and 514 are SiGe, and the epitaxial channel layer 512 is silicon. Each of the layers 510, 512, and 514 may be appropriately doped, such as by in situ doping during epitaxial growth. For example, the epitaxial source/drain layers 510 and 514 may be in situ doped with phosphorus, arsenic, or the like to a concentration between about $10^{19}$ cm$^{-3}$ and about $10^{21}$ cm$^{-3}$, and the epitaxial channel layer 512 may be in situ doped with boron, BF$_2$, or the like to a concentration of equal to or less than $10^{18}$ cm$^{-3}$, such as between about $10^{17}$ cm$^{-3}$ and about $10^{18}$ cm$^{-3}$. After the epitaxial growth of the layers 510, 512, and 514, a planarization process, such as a CMP, may be performed (step 606) to planarize the epitaxial source/drain layer 514.

Referring to FIG. 40, a mask layer 516, such as a hardmask, is deposited on the epitaxial source/drain layer 514, and a photoresist 518 is patterned on the mask layer 516 (step 608). The mask layer 516 may be formed of, for example, silicon nitride, silicon oxide, or the like, and may be formed using CVD, PECVD, ALD, or the like. The photoresist 518 is then formed on the mask layer 516, and can be formed by using a spin-on technique. The photoresist 518 is patterned to expose the first region 502, such as by using acceptable photolithography techniques.

Referring to FIG. 41, once the photoresist 518 is patterned, an etch process(es) is performed to transfer the pattern of the photoresist 518 to the mask layer 516 and to remove the layers 510, 512, and 514 from the first region 502 of the substrate 500 (step 608). The etch process(es) can include one or more distinct etch process, and can include any acceptable etch process, such as an anisotropic etch. If any photoresist 518 remains after the etching, the photoresist 518 may be removed, such as by an acceptable ashing process.

Referring to FIG. 42, materials for vertical channel transistors in the first region 502, e.g., the PMOS region, of the substrate 500 are epitaxially grown on the substrate 500 (step 610). An epitaxial source/drain layer 520 is epitaxially grown on the substrate 500. An epitaxial channel layer 522 is epitaxially grown on the epitaxial source/drain layer 520. An epitaxial source/drain layer 524 is epitaxially grown on the epitaxial channel layer 522. The layers 520, 522, and 524 may be epitaxially grown using MOCVD, MBE, LPE, VPE, SEG, the like, or a combination thereof. The layers 520, 522, and 524 may comprise silicon, silicon germanium, silicon carbide, pure germanium, a III-V compound semiconductor, a II-VI compound semiconductor, or the like. In an example, the epitaxial source/drain layers 520 and 524 are silicon or SiP, and the epitaxial channel layer 522 is silicon. Each of the layers 520, 522, and 524 may be appropriately doped, such as by in situ doping during epitaxial growth. For example, the epitaxial source/drain layers 520 and 524 may be in situ doped with boron, BF$_2$, or the like to a concentration between about $10^{19}$ cm$^{-3}$ and about $10^{21}$ cm$^{-3}$, and the epitaxial channel layer 522 may be in situ doped with phosphorus, arsenic, or the like to a concentration of equal to or less than $10^{18}$ cm$^{-3}$, such as between about $10^{17}$ cm$^{-3}$ and about $10^{18}$ cm$^{-3}$.

Referring to FIG. 43, after the epitaxial growth of the layers 520, 522, and 524, a planarization process, such as a CMP, may be performed (step 612) to planarize the epitaxial source/drain layer 524 and remove the mask layer 516. The planarization process may further thin the respective epitaxial source/drain layers 514 and 524.

Referring to FIG. 44, a photoresist 530 is patterned on the epitaxial source/drain layers 514 and 524. The photoresist 530 is formed on the epitaxial source/drain layers 514 and 524, and can be formed by using a spin-on technique. The photoresist 530 is patterned with a pattern 532 corresponding to an isolation region that will be formed. The patterning may use acceptable photolithography techniques.

Referring to FIG. 45, once the photoresist 530 is patterned, an etch process(es) is performed to form a recess 534 corresponding to the pattern 532 of the photoresist 530 between the first region 502 and the second region 504. The recess 534 can be formed by etching portions of the layers 510, 512, 514, 520, 522, and 524 at the boundary between the first region 502 and the second region 504. The etch process(es) can include one or more distinct etch process, and can include any acceptable etch process, such as an anisotropic etch. If any photoresist 530 remains after the etching, the photoresist 530 may be removed, such as by an acceptable ashing process.

Figure 46:
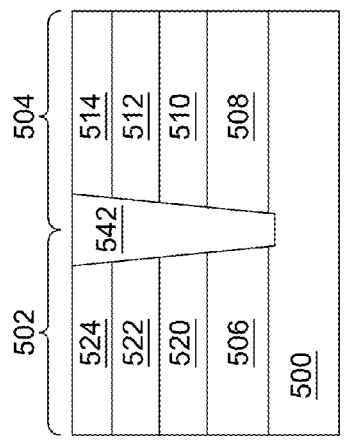

Referring to FIG. 46, the recess 534 is filled with a dielectric material 540. The dielectric material 540 may be formed of silicon oxide deposited by a high density plasma, for example, although other dielectric materials formed according to various techniques may also be used. An anneal, such as a rapid thermal anneal, may be performed after the dielectric material 540 is deposited.

Figure 47:
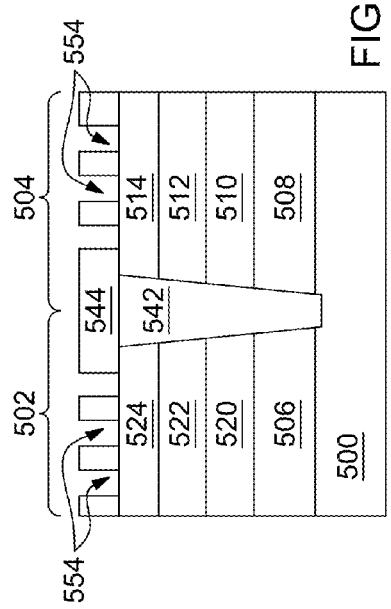

Referring to FIG. 47, a planarization process, such as a CMP, is performed to remove excess dielectric material 540 and to form planar top surfaces of the epitaxial source/drain layers 514 and 524 and isolation region 542. The isolation region 542 comprises the remaining dielectric material 540 in the recess 534, and hence, in the illustrated embodiment, FIGS. 44 through 47 illustrate the formation of isolation regions (step 614), such as STI regions.

Figure 48:
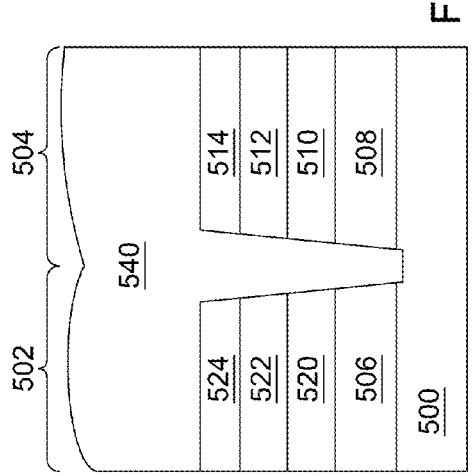

FIGS. 48 through 52 illustrate the patterning of vertical channel structures (step 616). Referring to FIG. 48, a mask layer 544, such as a hardmask, is deposited over the epitaxial source/drain layers 514 and 524 and the isolation region 542. The mask layer 544 may be formed of, for example, silicon nitride, silicon oxide, or the like, and may be formed using CVD, PECVD, ALD, or the like. A first dielectric layer 546 is then deposited over the mask layer 544. The first dielectric layer 546 may be a bottom anti-reflection coating (BARC), and may be silicon oxycarbide (SiOC) or the like, deposited using CVD, PECVD, spin-on, or the like. A second dielectric layer 548 is then deposited over the first dielectric layer 546. The second dielectric layer 548 may be an anti-reflection coating (ARC), and may be SiON or the like, deposited using CVD, PECVD, spin-on, or the like. A photoresist 550 is then formed on the second dielectric layer 548, such as by using a spin-on technique. The photoresist 550 is patterned with openings 552 corresponding to a shape of the vertical channel structures of devices, such as by using acceptable photolithography techniques.

Figure 49:
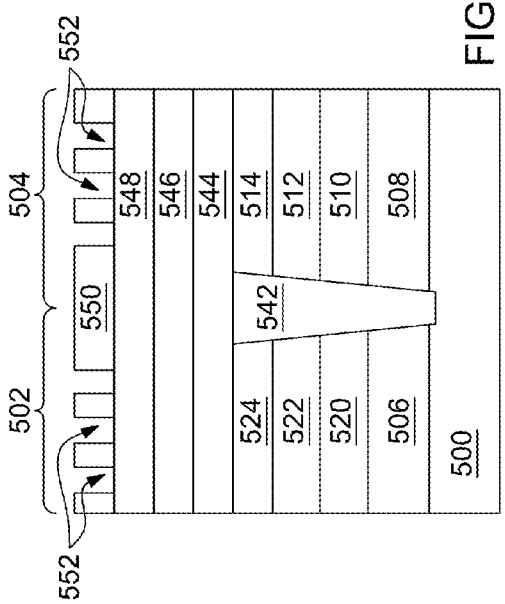

Referring to FIG. 49, once the photoresist 550 is patterned, an etch process(es) is performed to transfer the openings 552 of the photoresist 550 to the mask layer 544 to create openings 554 in the mask layer 544. The etch process(es) can include one or more distinct etch process, and can include any acceptable etch process, such as an anisotropic etch. If any photoresist 550 remains after the etching, the photoresist 550 may be removed, such as by an acceptable ashing process. Further, the first dielectric layer 546 and the second dielectric layer 548 are removed, such as by using an acceptable etch process, such as an isotropic etch, which may be a wet etch, that is selective to the materials of the first dielectric layer 546 and the second dielectric layer 548.

Figure 50:
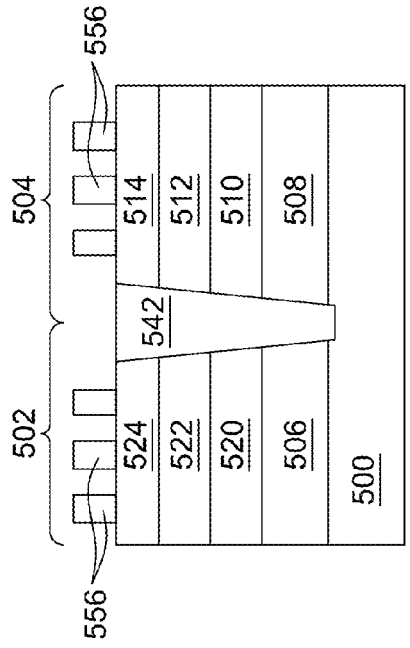

Referring to FIG. 50, a mask pattern 556 is formed in the openings 554 of the mask layer 544. In some embodiments, the material of the mask pattern 556 is different from the material of the mask layer 544 to allow for etch selectivity between the mask pattern 556 and the mask layer 544. In some embodiments, the mask pattern 556 comprises silicon carbon nitride (SiCN) or the like deposited by CVD, PECVD, ALD, or the like. A planarization process, such as a CMP, may be used to form top surfaces of the mask layer 544 and the mask pattern 556 to be co-planar and to expose the mask layer 544. By forming the mask pattern 556 in the openings 554 that correspond to the shape of the vertical channel structures of devices, the mask pattern 556 also corresponds to the shape of vertical channel structures of devices, as will become evident in subsequent discussion.

Figure 51:
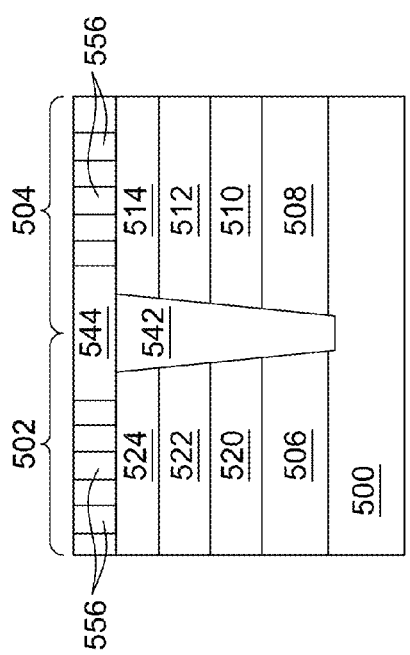

Referring to FIG. 51, the mask layer 544 is removed, such as by using an acceptable etch process, such as an etch selective to the mask layer 544. The etch process may be isotropic and may be a wet etch. The mask pattern 556 remains after the mask layer 544 is removed.

Figure 52:
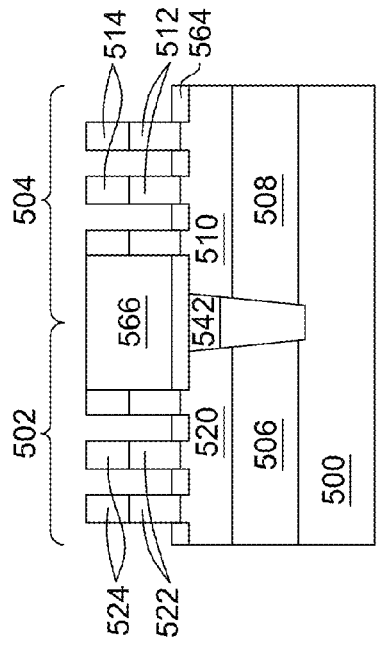

Referring to FIG. 52, an etch process(es) is performed to transfer the mask pattern 556 to the layers 510, 512, 514, 520, 522, and 524 to form vertical channel structures 560 in the first region 502 and vertical channel structures 562 in the second region 504. The etch process(es) can include one or more distinct etch process, and can include any acceptable etch process, such as an anisotropic etch. The mask pattern 556 is then removed, such as by using an acceptable etch process, such as an isotropic etch, which may be a wet etch, that is selective to the materials of the mask pattern 556. The vertical channel structures 560 in the first region 502 each comprise a portion of the epitaxial channel layer 522 and a portion of the epitaxial source/drain layer 524. The vertical channel structures 562 in the second region 504 each comprise a portion of the epitaxial channel layer 512 and a portion of the epitaxial source/drain layer 514.

Figure 53:
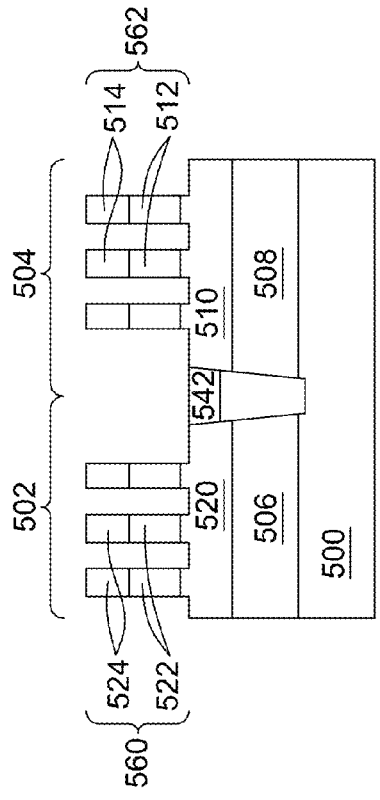

Referring to FIG. 53, a first dielectric layer 564 and an ILD 566 are formed (step 618). The first dielectric layer 564 can comprise silicon nitride, SiCN, or the like deposited by CVD, PECVD, ALD, or the like. In some embodiments, the first dielectric layer 564 is deposited with a thickness greater than heights of the vertical channel structures 560 and 562. A planarization process, such as a CMP, is then performed to form top surfaces of the vertical channel structures 560 and 562 to be co-planar with a top surface of the first dielectric layer 564. Subsequently, a controlled etch back, such as an anisotropic etch, etches the first dielectric layer 564 to an appropriate thickness. The first dielectric layer 564 may serve various purposes, such as an etch stop layer for forming contacts to the epitaxial source/drain layers 510 and 520 and/or as a gate spacer.

The ILD 566 may comprise silicon oxide, tetraethyl orthosilicate (TEOS), phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. The ILD 566 may separate various distinct devices. For example, as illustrated, the ILD 566 separates a p-type device in the first region 502 from an n-type device in the second region 504. Material of the ILD 566 may be removed from within each device area, such as where a gate will be formed. For example, the ILD 566 can be deposited, and a planarization process, such as a CMP, is then performed to form top surfaces of the vertical channel structures 560 and 562 to be co-planar with a top surface of the ILD 566. A mask, such as a photoresist, can be formed and patterned to remain over areas where the ILD 566 is to remain, and an acceptable etch process can remove the ILD 566 from other areas. If the photoresist remains after the etch, the photoresist can be removed, such as by an acceptable ashing process. The various planarization steps, e.g., CMP steps, may further thin the epitaxial source/drain layers 514 and 524 in the vertical channel structures 562 and 560.

Figure 54:
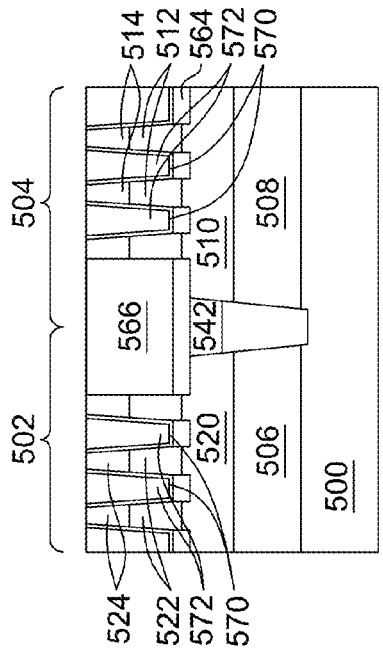

Referring to FIG. 54, the vertical channel structures 562 and 560, e.g., the epitaxial channel layers 512 and 522, are reshaped (step 620). In some embodiments, the vertical channel structures 562 and 560 are reshaped by performing an etch. In some embodiments, the reshaping uses a wet etch. A wet etch may comprise an immersion in a solution comprising an etching species. The etching species can comprise HCl and ammonium hydroxide. The etching species can have a concentration between about 1 percent and about 10 percent in the solution. The wet etch can include immersion in the solution from about 10 seconds to about 500 seconds and can be at a temperature of about 20° C. to about 70° C. In some embodiments, by varying the relative concentration of HCl to ammonium hydroxide and/or by controlling the time of the etch, a desired surface orientation of the vertical channel structures 562 and 560 may be achieved. For example, a ratio of HCl to ammonium hydroxide may be from about 2:1 to about 6:1. In other embodiments, the etching species can comprise an APM, dHF, a combination thereof, or the like. In other embodiments, another appropriate etch may be used, such as a dry etch or a combination of a dry and wet etch. A dry etch may comprise a plasma process, such as ICP, TCP, ECR, RIE, the like, or a combination thereof. The plasma process may use reaction gases including a fluorine-based gas (such as $SF_6$, $CH_2F_2$, $CH_3F$, $CHF_3$, or the like), chloride ($Cl_2$), hydrogen bromide (HBr), oxygen ($O_2$), the like, or a combination thereof. The plasma process may use a pressure between about 3 mTorr and about 100 mTorr, use a power of about 300 W to about 1000 W, and may use a frequency of about 2 kHz to about 13.6 MHz. In even further embodiments, an anneal may be used. An anneal may comprise heating at a temperature greater than or equal to 500° C. for about a few milliseconds, such as for a high temperature anneal at temperatures between about 800° C. and about 1200° C., to about 12 hours, such as for a lower temperature anneal at temperatures between about 500° C. and about 800° C. The exterior surfaces of the vertical channel structures 562 and 560 may have any desired surface orientation, some of which are discussed with regard to FIG. 15 and in further detail below.

Figure 55:
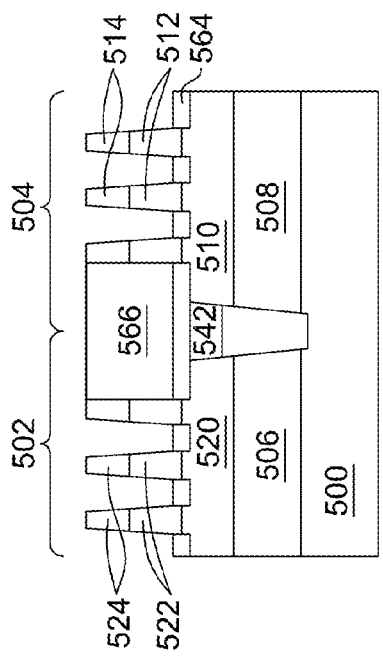

Referring to FIG. 55, gate dielectric layer 570 and gate electrodes 572 are formed. Gate dielectric layer 570 is deposited conformally on the vertical channel structures 560 and 562, such as on the top surfaces and the sidewalls of the vertical channel structures 560 and 562. In accordance with some embodiments, gate dielectric layer 570 comprises silicon oxide, silicon nitride, or multilayers thereof. In other embodiments, gate dielectric layer 570 comprises a high-k dielectric material, and in these embodiments, gate dielectric layer 570 may have a k value greater than about 7.0, and may include a metal oxide or a silicate of Hf, Al, Zr, La, Mg, Ba, Ti, Pb, and combinations thereof. The formation methods of gate dielectric layer 570 may include MBD, ALD, PECVD, and the like. Next, gate electrodes 572 are deposited over gate dielectric layer 570. Gate electrodes 572 may comprise a metal-containing material such as TiN, TaN, TaC, Co, Ru, Al, combinations thereof, or multi-layers thereof. After the filling of gate electrodes 572, a CMP may be performed to remove the excess portions of gate dielectric layer 570 and the material of gate electrodes 572, which excess portions are over the top surfaces of the vertical channel structures 560 and 562.

Figure 56:
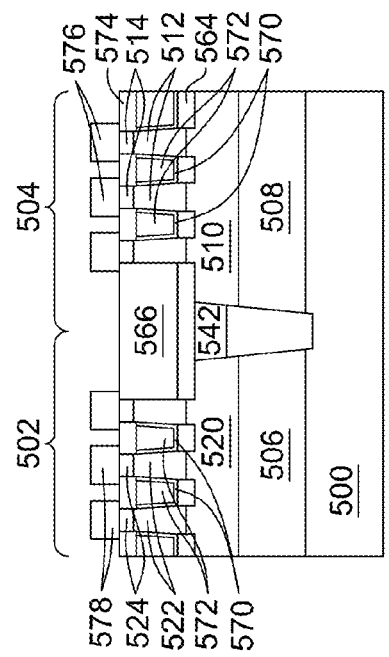

Referring to FIG. 56, the gate dielectric layers 570 and gate electrodes 572 are recessed, for example, such that top surfaces of the gate dielectric layers 570 and gate electrodes 572 are below top surfaces of the epitaxial channel layers 512 and 522. The gate dielectric layers 570 and gate electrodes 572 can be recessed using an appropriate etch process, such as a dry or wet etch. The resulting remaining portions of material of gate electrodes 572 and gate dielectric layer 570 thus form gates of the resulting FETs. Once recessed, a second dielectric layer 574 is formed on the gate dielectric layers 570 and gate electrodes 572 (step 626). The second dielectric layer 574 can comprise silicon nitride, SiCN, or the like deposited by CVD, PECVD, ALD, or the like. In some embodiments, the second dielectric layer 574 is deposited with a thickness greater than a distance from the top surfaces of the gate dielectric layers 570 and gate electrodes 572 to top surfaces of the vertical channel structures 560 and 562. A planarization process, such as a CMP, and/or an etch back is then performed to form top surfaces of the vertical channel structures 560 and 562 to be co-planar with a top surface of the second dielectric layer 574. The second dielectric layer 574 may serve various purposes, such as an etch stop layer for forming contacts to the gate electrodes 572 and/or as a gate spacer. Additional photolithography and etch processes can be performed to remove the second dielectric layer 574, gate electrodes 572, and gate dielectric layers 570 from areas outside of a device area, as will be apparent in the discussion of, e.g., FIGS. 57A and 57B.

Regrowth epitaxial source/drain regions 576 and 578 are formed (step 628) extending above the second dielectric layer 574. In an example, a first photoresist is formed over the substrate 500. The first photoresist is patterned to expose the second region 504 of the substrate 500. The first photoresist can be formed by using a spin-on technique and can be patterned using acceptable photolithography techniques. Once the first photoresist is patterned, the regrowth epitaxial source/drain regions 576 are epitaxially grown, such as by using the top surfaces of the epitaxial source/drain layer 514 as a template. After the epitaxial growth, the first photoresist may be removed, such as by an acceptable ashing process. Then, a second photoresist is formed over the substrate 500. The second photoresist is patterned to expose the first region 502 of the substrate 500. The second photoresist can be formed by using a spin-on technique and can be patterned using acceptable photolithography techniques. Once the second photoresist is patterned, the regrowth epitaxial source/drain regions 578 are epitaxially grown, such as by using the top surfaces of the epitaxial source/drain layer 524 as a template. After the epitaxial growth, the second photoresist may be removed, such as by an acceptable ashing process.

The regrowth epitaxial source/drain regions 576 and 578 may be epitaxially grown using MOCVD, MBE, LPE, VPE, SEG, the like, or a combination thereof. The regrowth epitaxial source/drain regions 576 and 578 may comprise silicon, silicon germanium, silicon carbide, pure germanium, a III-V compound semiconductor, a II-VI compound semiconductor, or the like. In an example, the regrowth epitaxial source/drain regions 576 are silicon or SiP, and the regrowth epitaxial source/drain regions 578 are SiGe. The regrowth epitaxial source/drain regions 576 and 578 may be appropriately doped, such as by in situ doping during epitaxial growth. For example, the regrowth epitaxial source/drain regions 578 may be in situ doped with boron, $BF_2$, or the like to a concentration between about $10^{19}$ $cm^{-3}$ and about $10^{21}$ $cm^3$, and the regrowth epitaxial source/drain regions 576 may be in situ doped with phosphorus, arsenic, or the like to a concentration between about $10^{19}$ $cm^{-3}$ and about $10^{21}$ $cm^3$.

In some embodiments, the regrowth epitaxial source/drain regions 576 are a same material and have a same doping type and concentration as the epitaxial source/drain layer 514, and the regrowth epitaxial source/drain regions 578 are a same material and have a same doping type and concentration as the epitaxial source/drain layer 524. Other embodiments contemplate different materials and/or doping concentrations between the regrowth epitaxial source/drain regions 576 and epitaxial source/drain layer 514, and between the regrowth epitaxial source/drain regions 578 and epitaxial source/drain layer 524. Further, although illustrated as separate regrowth epitaxial source/drain regions 576, the regrowth epitaxial source/drain regions 576 can be epitaxially grown over the second dielectric layer 574 to coalesce to form a continuous layer in the second region 504, and similarly, the regrowth epitaxial source/drain regions 578 can be epitaxially grown over the second dielectric layer 574 to coalesce to form a continuous layer in the first region 502.

Although not explicitly shown, a person having ordinary skill in the art will readily understand that further processing steps may be performed on the structure in FIG. 56. For example, an etch stop layer may be formed over and adjoining the regrowth epitaxial source/drain regions 576 and 578, the second dielectric layer 574, and/or the ILD 566. Additional ILDs and/or IMDs and their corresponding metallizations may be formed over the etch stop layer. Contacts can be formed through one or more of the ILD and/or IMD to electrically couple various components as shown in FIGS. 57A, 57B, 58, and 59.

Figure 57A:
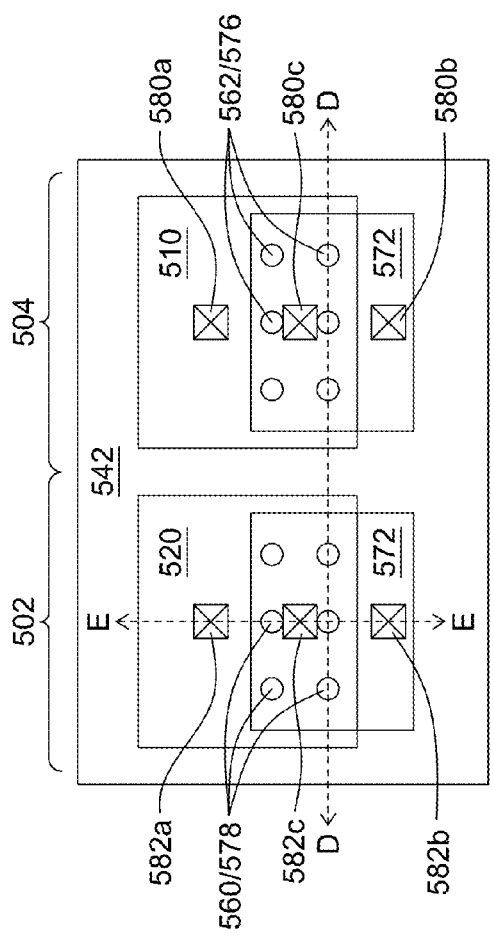

FIGS. 57A, 58, and 59 illustrate example overlays of various components and/or structures formed in the process discussed in FIGS. 38 through 56. Each of FIGS. 57A, 58, and 59 illustrate the layout of epitaxial source/drain layers 510 and 520, vertical channel structures 560 and 562, regrowth epitaxial source/drain regions 576 and 578, and gate electrodes 572. FIGS. 57A, 58, and 59 also illustrate contacts 580a, 580b, 580c, 582a, 582b, and 582c, for example, through an overlying dielectric layer such as an ILD and/or IMD, directly and electrically coupling various components.

Referring to FIG. 57A, the layout illustrates multiple cylindrical vertical channel structures 560 and 562, e.g., having circular cross sections in the layout view, in each device area of the first region 502 and the second region 504. Any number of vertical channel structures 560 and 562 may be present in a given device area. Cross section D-D illustrates an example cross section that is used in FIGS. 38 through 56. Cross section E-E is perpendicular to cross section D-D and is illustrated by FIG. 57B.

Figure 57B:
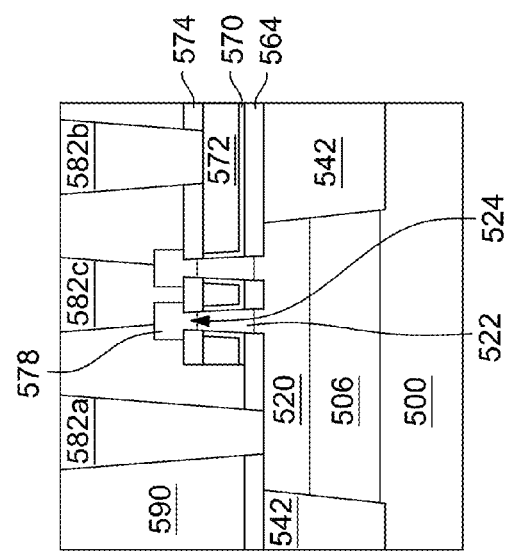

FIG. 57B illustrates an example of how various components may be overlaid to accommodate contacts to those structures. For example, no active component such as another source/drain region, channel region, or gate structure directly overlies a portion of the epitaxial source/drain layer 520, and hence, a contact 582a can be formed through ILD 590 and the first dielectric layer 564 to directly and electrically couple the portion of the epitaxial source/drain layer 520. Similarly, no active component such as another source/drain region or channel region directly overlies a portion of the gate electrode 572, and hence, a contact 582b can be formed through ILD 590 and the second dielectric layer 574 to directly and electrically couple the portion of the gate electrode 572. A contact 582c can be formed through ILD 590 to directly and electrically couple the regrowth epitaxial source/drain regions 578. A similar cross section may be present for the second region 504.

FIGS. 58 and 59 are similar to FIG. 57A. Referring to FIG. 58, the vertical channel structures 560 and 562 are bar structures, e.g., having a substantially rectangular cross section shape in the layout view, in a first direction, such as an X-direction. Referring to FIG. 59, the vertical channel structures 560 and 562 are bar structures in a second direction, such as a Y-direction, perpendicular to the first direction of FIG. 58. Embodiments contemplate any configuration of a vertical channel structure and any combination of configuration of structures. FIGS. 58 and 59 have cross sections similar to FIG. 57B, and one of ordinary skill in the art will readily understand any modification of FIG. 57B for these cross sections.

FIGS. 61A through 61H illustrate additional detail in addition to the discussion of FIG. 15. FIGS. 61A through 61H illustrate a structure of a major surface portion of a sidewall of a fin, epitaxial region, and/or channel structure after re-shaping. The structure shows the crystalline structure (e.g., dots being atoms and dashed lines being the lattice), which may include, for example, silicon, germanium, a group II element, a group III element, a group V element, and/or a group VI element. For ease of reference, FIGS. 61A through 61H include axes X, Y, and Z. The substrate is in the negative Y direction from this structure, and a top surface of the substrate is in an X-Z plane. For examples discussed herein, the top surface of the substrate, e.g., the X-Z plane, is a (100) surface. Other surface orientations may be used, and one of ordinary skill in the art will readily understand how a different surface orientation of the substrate may affect the surfaces discussed herein In FIGS. 61A through 61H, the structures includes shift locations 90 inward toward a center of the structure (e.g., in the positive X direction) along the sidewall. These shift locations 90 are places along the sidewall where the exterior sidewall surface shifts inward one lattice constant. For example, shift location 90 may shift the exterior sidewall surface from a first Y-Z plane 91 to a second Y-Z plane 92, from the second Y-Z plane 92 to a third Y-Z plane 93, from the third Y-Z plane 93 to a fourth Y-Z plane 94, etc. In other embodiments, the shift may be outward from the structure instead of inward. Further, the sidewall may comprise any combination of inward shifts and outward shifts. The amount of the shifts 90 in the +/−X direction may be at least one lattice constant to several lattice constants, for example, the distance between neighboring pairs of the Y-Z planes 91 through 94 may be at least one lattice constant to several lattice constants. The amount of the shifts 90 in the +/−X direction may be constant between the shifts 90 or may vary between shifts 90. The distance between neighboring shifts 90 in the +/−Y direction may be any distance, such as between 2 atoms and 20 atoms in the lattice. The distances between neighboring shifts 90 in the +/−Y direction may be constant throughout the sidewall, e.g., may have a repeating period, or may vary.

In FIG. 61A, an inward lattice shift 90 occurs on a period of five terrace units (which may be detectable by high resolution TEM). This results in a (991) surface orientation with a deviation angle $\theta_1$ of about 4.5°. Deviation angles $\theta_1$ through $\theta_8$ are each the angle formed by the fin surface (e.g., the (991) surface in this example) and a surface perpendicular to the substrate surface (e.g., a (110) surface perpendicular to a (100) substrate surface). An inclination angle is the angle between the fin surface (e.g., the (991) surface) and the substrate surface (e.g., the (100) substrate surface) and can be expressed as a 90° minus a respective deviation angle.

In FIG. 61B, an inward lattice shift 90 occurs on a period of alternating five terrace units and four terrace units. This results in a (881) surface orientation with a deviation angle $\theta_2$ of about 5.1°.

In FIG. 61C, an inward lattice shift 90 occurs on a period of four terrace units. This results in a (771) surface orientation with a deviation angle $\theta_3$ of about 5.8°.

In FIG. 61D, an inward lattice shift 90 occurs on a period of alternating four terrace units and three terrace units. This results in a (661) surface orientation with a deviation angle $\theta_4$ of about 6.7°.

In FIG. 61E, an inward lattice shift 90 occurs on a period of three terrace units. This results in a (551) surface orientation with a deviation angle $\theta_5$ of about 8°.

In FIG. 61F, an inward lattice shift 90 occurs on a period of alternating three terrace units and two terrace units. This results in a (441) surface orientation with a deviation angle $\theta_6$ of about 10°.

In FIG. 61G, an inward lattice shift 90 occurs on a period of two terrace units. This results in a (331) surface orientation with a deviation angle $\theta_7$ of about 13.3°.

In FIG. 61H, an inward lattice shift 90 occurs on a period of alternating two terrace units and one terrace unit. This results in a (221) surface orientation with a deviation angle $\theta_8$ of about 19.5°.

Any of the reshaped structures discussed above can comprise sidewalls having surface orientations as discussed above with respect to FIGS. 15 and 61A through 61H. Any of the reshaped structures can have a sidewall with a deviation angle that exceeds 2°, that is or exceeds about 4.5°, that is or exceeds about 5.1°, that is or exceeds about 5.8°, that is or exceeds about 6.7°, that is or exceeds about 8°, that is or exceeds about 10°, that is or exceeds about 13.3°, or that is or exceeds about 19.5° from normal of a major substrate surface.

Various embodiments that have a re-shaped channel in a FET may have increased electrical characteristics and performance. For example, in some embodiments, it is believed that increased surface roughness can increase mobility. An increased surface roughness may increase phonon scattering, thereby increasing the mobility. In other embodiments, it is believed that decreased surface roughness can improve performance, such as by achieving a desired surface orientation in a channel region. In some embodiments, surface roughness can increase to above 2.63 Angstroms in a channel region, and once re-shaped, the channel region can have a surface roughness of 1.54 Angstroms. Hence, in some embodiments where the channel has been re-shaped as discussed above, the FET can have increased electrical characteristics and performance.

According to an embodiment, a structure comprises a substrate, a fin, a gate dielectric, and a gate electrode. The substrate comprises the fin. The fin has a major surface portion of a sidewall, and the major surface portion comprises at least one lattice shift. The at least one lattice shift comprises an inward or outward shift relative to a center of the fin. The gate dielectric is on the major surface portion of the sidewall. The gate electrode is on the gate dielectric.

According to another embodiment, a structure comprises a fin on a substrate, a gate dielectric on a major surface portion of a sidewall of the fin, and a gate electrode on the gate dielectric. The major surface portion comprises atoms in multiple parallel planes. The multiple parallel planes are perpendicular to a major surface of the substrate, and neighboring pairs of the multiple parallel planes are separated by at least one lattice constant. A first group of the atoms are in a first one of the multiple parallel planes, and a second group of the atoms are in a second one of the multiple parallel planes.

According to a further embodiment, a method comprises forming a fin on a substrate; after forming the fin, re-shaping the fin to have a major surface portion of a sidewall; forming a dielectric on the major surface portion of the sidewall; and forming a gate electrode on the dielectric. The major surface portion of the sidewall has a plurality of lattice shift locations. Each of the plurality of lattice shift locations comprises an inward or outward lattice shift relative to a center of the fin.

According to an embodiment, a structure comprises a substrate, a gate dielectric and a gate electrode. The substrate comprises a fin, and the fin comprises an epitaxial channel region. The epitaxial channel has a major surface portion of an exterior surface. The major surface portion comprising at least one lattice shift, and the at least one lattice shift comprises an inward or outward shift relative to a center of the fin. The gate dielectric is on the major surface portion of the exterior surface. The gate electrode is on the gate dielectric.

According to an embodiment, a structure comprises a substrate, a transistor structure, and a gate structure. The substrate has a major surface. The transistor structure is on the substrate and extends in a direction normal to the major surface. The transistor structure comprises a first source/drain region, a channel region, and a second source/drain region. The channel region is on the first source/drain region in the direction normal to the major surface, and the second source/drain region is on the channel region in the direction normal to the major surface. The channel region has a sidewall surface, and a deviation angle of the sidewall surface from the direction normal to the major surface exceeds 2 degrees. The gate structure surrounds the channel region in a plane perpendicular to the direction normal to the major surface.

According to an embodiment, a method comprises forming a channel region on a substrate; after forming the channel region, re-shaping the channel region to have a major surface portion of a sidewall with a plurality of lattice shift locations, each of the plurality of lattice shift locations comprising an inward or outward lattice shift relative to a center of the channel region; forming a dielectric on the major surface portion of the sidewall; and forming a gate electrode on the dielectric.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a channel region on a substrate, wherein the forming the channel region comprises: forming a fin on the substrate; and epitaxially growing a quantum well structure on the fin, the channel region comprising the quantum well structure;
   after forming the channel region, re-shaping the channel region to have a major surface portion of a sidewall with a plurality of lattice shift locations in stair-step increments, each of the plurality of lattice shift locations comprising an inward or outward lattice shift relative to a center of the channel region;

forming a dielectric on the major surface portion of the sidewall; and forming a gate electrode on the dielectric.

2. The method of claim 1, wherein the re-shaping the channel region comprises a wet etch.

3. The method of claim 1, wherein the forming the channel region comprises:

forming a fin on the substrate;

forming a recess in the fin; and epitaxially growing the channel region in the recess in the fin.

4. The method of claim 3 further comprising after epitaxially growing the channel region, recessing the fin to form a void under the channel region, the forming the dielectric further comprising forming the dielectric in the void.

5. The method of claim 1, wherein the forming the channel region comprises:

epitaxially growing a channel layer on a first source/drain region;

epitaxially growing a second source/drain layer on the channel layer; and patterning the second source/drain layer and the channel layer into a second source/drain region and the channel region, respectively.

6. The method of claim 1, wherein the re-shaping comprises a mixture of ammonium hydroxide and hydrochloric acid.

7. A method comprising:

forming a channel region of a device on a substrate, the channel region comprising a semiconductor material, the channel region having a first exterior surface shape, wherein the channel region comprises a quantum well;

after forming the channel region, etching the channel region to form a second exterior surface shape different from the first exterior surface shape, wherein the second exterior surface shape comprises a plurality of lattice shift locations in stair-step increments;

forming a gate dielectric on the second exterior surface shape of the channel region; and forming a gate electrode on the gate dielectric.

8. The method of claim 7, wherein the second exterior surface shape includes a crystalline surface orientation.

9. The method of claim 7, wherein the forming the channel region comprises:

forming a fin on the substrate;

forming a dummy gate on the fin of the substrate;

forming a dielectric over the dummy gate and the fin;

after forming the dielectric, exposing a portion of the fin by removing the dummy gate;

etching the exposed portion of the fin; and epitaxially growing the semiconductor material of the channel region on a remaining portion of the fin.

10. The method of claim 9 further comprising etching an underlying portion of the fin underlying the channel region, the gate dielectric and the gate electrode being formed fully around the channel region.

11. The method of claim 7, wherein the forming the channel region comprises:

forming a fin on a substrate; and epitaxially growing the semiconductor material of the channel region on the fin.

12. The method of claim 11 further comprising forming a dielectric layer over the semiconductor material of the channel region, the etching the channel region being performed after the forming the dielectric layer.

13. The method of claim 7, wherein the forming the channel region comprises forming a vertical channel structure, the gate dielectric and gate electrode being fully around the vertical channel structure, a first source/drain region being in the vertical channel structure and proximate the substrate, a second source/drain region being in the vertical channel structure and distal from the substrate.

14. A method comprising:

forming a device structure on a substrate, the device structure comprising a first source/drain region, a second source/drain region, and a channel region disposed between the first source/drain region and the second source/drain region;

forming a dielectric layer on the first source/drain region;

after forming the dielectric layer, re-shaping the channel region using an etching process;

forming a gate dielectric on the re-shaped channel region;

forming a gate electrode on the gate dielectric:

forming a fin on the substrate;

forming the first source/drain region and the second source/drain region in the fin, an intermediate fin portion of the fin being disposed between the first source/drain region and the second source/drain region;

after forming the dielectric layer, exposing the intermediate fin portion of the fin;

after exposing the intermediate fin portion, recessing the intermediate fin portion to form a V-shaped recess;

epitaxially growing the channel region in the recess; and etching a portion of the fin under the channel region to form a void, wherein the gate dielectric and the gate electrode are formed in the void.

15. The method of claim 14, wherein the forming the device structure comprises:

forming a fin on the substrate;

epitaxially growing the channel region on the fin; and forming the first source/drain region and the second source/drain region in the fin.

16. The method of claim 15, wherein the channel region comprises a quantum well.

17. The method of claim 14, wherein the forming the device structure comprises forming a vertical channel structure on the substrate, the first source/drain region being in the vertical channel structure proximate the substrate, the second source/drain region being in the vertical channel structure distal from the substrate.

* * * * *